United States Patent
Ishiga

(10) Patent No.: US 9,832,404 B2
(45) Date of Patent: Nov. 28, 2017

(54) IMAGE SENSOR, IMAGING APPARATUS, AND IMAGE PROCESSING DEVICE

(71) Applicant: NIKON CORPORATION, Tokyo (JP)

(72) Inventor: Kenichi Ishiga, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 67 days.

(21) Appl. No.: 14/954,569

(22) Filed: Nov. 30, 2015

(65) Prior Publication Data
US 2016/0198143 A1 Jul. 7, 2016

Related U.S. Application Data

(63) Continuation of application No. PCT/JP2014/002851, filed on May 29, 2014.

(30) Foreign Application Priority Data

May 31, 2013 (JP) .................... 2013-116415

(51) Int. Cl.
*H04N 5/369* (2011.01)
*G03B 35/08* (2006.01)
(Continued)

(52) U.S. Cl.
CPC ........... *H04N 5/3696* (2013.01); *G03B 35/08* (2013.01); *H01L 27/14601* (2013.01);
(Continued)

(58) Field of Classification Search
CPC ........... H04N 13/0007; H04N 13/0207; H04N 13/021; H04N 13/0225; H04N 13/0282;
(Continued)

(56) References Cited

U.S. PATENT DOCUMENTS 7,957,588 B2   6/2011 Ishiga
8,259,213 B2   9/2012 Ishiga
(Continued)

FOREIGN PATENT DOCUMENTS

JP   2003-007994 A   1/2003
JP   2011-199755 A   10/2011
(Continued)

OTHER PUBLICATIONS

Aug. 9, 2016 Office Action issued in Japanese Patent Application No. 2015-519651.
(Continued)

*Primary Examiner* — Lin Ye
*Assistant Examiner* — Chriss Yoder, III
(74) *Attorney, Agent, or Firm* — Oliff PLC

(57) ABSTRACT

An image sensor captures a subject image of a partial luminous flux passed through different regions from among a total luminous flux through one optical system. The image sensor is configured from a pixel arrangement in which a plurality of each of at least three types of pixels are arranged, including non-parallax pixels which comprise an aperture mask that produces a viewpoint in a reference direction, first parallax pixels which comprise an aperture mask that produces a viewpoint in a first direction different from the reference direction and second parallax pixels which comprise an aperture mask that produces a viewpoint in a second direction different from the reference direction, wherein each of the aperture mask of the first parallax pixels and the aperture mask of the second parallax pixels has a width of a greater-than-half-aperture aperture area in the direction of change of the viewpoint.

13 Claims, 34 Drawing Sheets

=  +  −

NON-PARALLAX PIXEL ($C_{1/3}$)  PARALLAX Lt PIXEL ($Lt_{2/3}$)  PARALLAX Rt PIXEL ($Rt_{2/3}$)  NON-PARALLAX PIXEL (N)

(51) Int. Cl.
*H04N 13/02* (2006.01)
*H01L 27/146* (2006.01)
*H04N 13/00* (2006.01)

(52) U.S. Cl.
CPC .. *H01L 27/14623* (2013.01); *H01L 27/14627* (2013.01); *H04N 13/0007* (2013.01); *H04N 13/021* (2013.01); *H04N 13/0207* (2013.01); *H04N 13/0225* (2013.01); *H04N 13/0257* (2013.01); *H04N 13/0282* (2013.01)

(58) Field of Classification Search
CPC .. H04N 2209/046; H04N 9/045; H04N 9/046; H04N 9/07; H04N 5/3696; H01L 27/14601; H01L 27/14623; H01L 27/14627
See application file for complete search history.

(56) References Cited

U.S. PATENT DOCUMENTS

| | | | | |
|---|---|---|---|---|
| 8,350,953 | B2* | 1/2013 | Goto | G02B 27/64 348/348 |
| 2011/0317042 | A1* | 12/2011 | Goto | G02B 7/346 348/241 |
| 2012/0140100 | A1* | 6/2012 | Shibazaki | H01L 27/14621 348/281 |
| 2012/0193515 | A1* | 8/2012 | Agranov | G01S 3/782 250/208.1 |
| 2013/0278730 | A1 | 10/2013 | Hasegawa et al. | |
| 2014/0375673 | A1 | 12/2014 | Ishiga et al. | |
| 2015/0002634 | A1 | 1/2015 | Ishiga et al. | |
| 2015/0103144 | A1 | 4/2015 | Shibazaki et al. | |
| 2015/0156430 | A1 | 6/2015 | Ishiga et al. | |

FOREIGN PATENT DOCUMENTS

| | | |
|---|---|---|
| JP | 2011-223562 A | 11/2011 |
| JP | 2012-100476 A | 5/2012 |
| JP | 2013-229764 A | 11/2013 |
| JP | 2014-107593 A | 6/2014 |
| WO | 2012/036019 A1 | 3/2012 |
| WO | 2012/073491 A1 | 6/2012 |
| WO | 2014/156202 A1 | 10/2014 |

OTHER PUBLICATIONS

Aug. 19, 2014 International Search Report issued in International Patent Application No. PCT/JP2014/002851.
Mar. 7, 2017 Decision of Rejection issued in Japanese Patent Application No. 2015-519651.

* cited by examiner

PARALLAX Lt　　　NON-PARALLAX　　　PARALLAX Rt
PIXEL ($Lt_{1/3}$)　　　PIXEL (N)　　　PIXEL ($Rt_{2/3}$)

Lt BLUR OF HALF-APERTURE
PARALLAX PIXEL

Rt BLUR OF HALF-APERTURE
PARALLAX PIXEL

Lt BLUR OF GREATER-THAN-
HALF-APERTURE PARALLAX
PIXEL

Rt BLUR OF GREATER-THAN-
HALF-APERTURE PARALLAX
PIXEL

IMAGE SENSOR, IMAGING APPARATUS, AND IMAGE PROCESSING DEVICE

The contents of the following Japanese and PCT patent applications are incorporated herein by reference:
NO. 2013-116415 filed on May 31, 2013, and
NO. PCT/JP2014/002851 filed on May 29, 2014.

BACKGROUND

1. Technical Field

The present invention relates to an image sensor, an imaging apparatus and an image processing device.

2. Related Art

An imaging apparatus is known in which a single imaging optical system is used to generate left and right parallax images having a parallax therebetween, as the result of a single instance of imaging. Patent Document 1: Japanese Patent Application Publication No. 2003-7994

In the left parallax image and the right parallax image created by this type of imaging apparatus, a shape of a blur is asymmetrical. A double-line blur is generated due to the asymmetry of the shape of the blur, and as a result, an unnatural blur occurs.

SUMMARY

According to a first aspect of the present invention, provided is an image sensor capturing a subject image of a partial luminous flux passed through different regions from among a total luminous flux through one optical system. The image sensor is configured from a pixel arrangement in which a plurality of each of at least three types of pixels are arranged, including non-parallax pixels which comprise an aperture mask that produces a viewpoint in a reference direction, first parallax pixels which comprise an aperture mask that produces a viewpoint in a first direction different from the reference direction and second parallax pixels which comprise an aperture mask that produces a viewpoint in a second direction different from the reference direction, wherein each of the aperture mask of the first parallax pixels and the aperture mask of the second parallax pixels has a width of a greater-than-half-aperture aperture area in the direction of change of the viewpoint.

According to a second aspect of the present invention, provided is an image processing device further generating a reference viewpoint image in each pixel based on pixel information of the non-parallax pixels, respectively to an output of the image sensor described above, generating a tentative first viewpoint image in each pixel based on pixel information of the first parallax pixels, generating a tentative second viewpoint image in each pixel based on pixel information of the second parallax pixels, changing a viewpoint position with respect to the reference viewpoint image by using the tentative first viewpoint image and the tentative second viewpoint image and generating a new first viewpoint image and a new second viewpoint image.

According to a third aspect of the present invention, provided is an image sensor comprising a shift pixel in which a first light receiving region receiving a subject luminous flux includes a center of a pixel region and is set at a position shifted relative to the center of the pixel region.

According to a forth aspect of the present invention, provided is an image processing device comprising an obtaining section, which obtains an output of the image sensor described above, and an image generating section, which generates a first parallax image data and a second parallax image data by using an output of the first shift pixel and an output of the second shift pixel. The first parallax image data gives a parallax from the output of the non-shift pixel to the first direction and the second parallax image data gives a parallax to the second direction.

According to a fifth aspect of the present invention, provided is an imaging apparatus comprising the image sensor described above and the image processing device described above.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
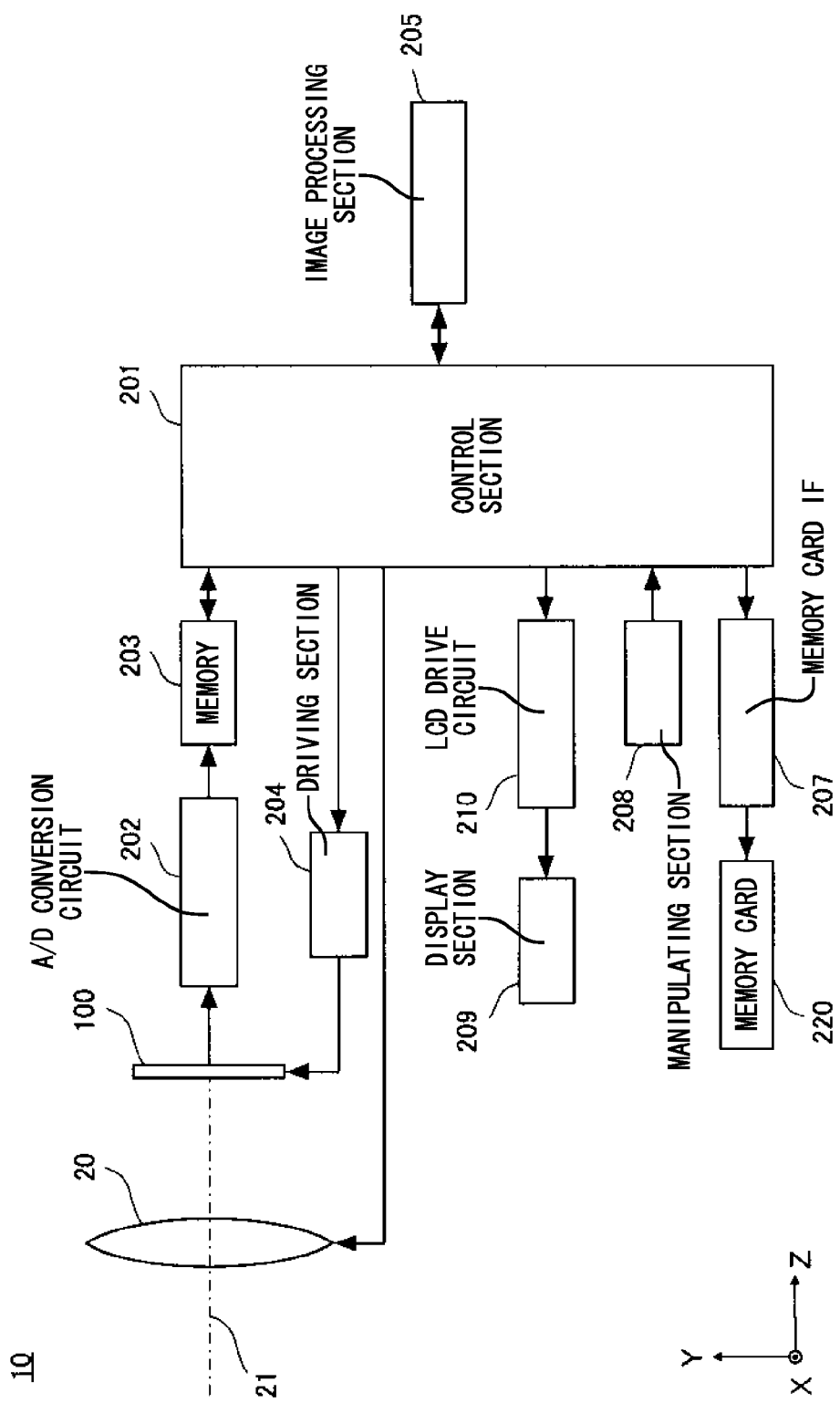
FIG. 1 shows a structure of the digital camera according to the present embodiment.

A digital camera according to an embodiment of the present invention, which is an embodiment of an imaging apparatus, is configured in a manner to be able to generate an image of a single scene having a plurality of viewpoints, through a single occurrence of imaging. Each image having a different viewpoint from another image is referred to as a parallax image. The present embodiment describes a particular example of generating a right parallax image and a left parallax image according to two viewpoints that correspond to a right eye and a left eye. Although explained in greater detail further below, the digital camera of the present invention can generate both a parallax image and a non-parallax image that has no parallax from a central viewpoint, which is a viewpoint in a reference direction, FIG. 1 shows a structure of the digital camera 10 according to the present embodiment. The digital camera 10 includes an imaging lens 20 serving as an imaging optical system, and guides subject light that is incident thereto along an optical axis 21 to the image sensor 100. The imaging lens 20 may be an exchangeable lens that can be attached to and detached from the digital camera 10. The digital camera 10 includes, in addition to the imaging lens 20 and the image sensor 100, a control section 201, an A/D conversion circuit 202, a memory 203, a driving section 204, an image processing section 205, a memory card IF 207, a manipulating section 208, a display section 209, and an LCD drive circuit 210.

As shown in the drawing, a direction parallel to the optical axis 21 and pointing toward the image sensor 100 is defined as the +Z axis direction, a direction pointing into the plane of the drawing in a plane orthogonal to the Z axis is defined as the +X axis direction, and a direction pointing toward the top of the drawing is defined as the +Y axis direction. The orientation of this structural drawing during imaging is such that the X axis is the horizontal direction and the Y axis is the vertical direction. In several of the following drawings, the coordinate axes of FIG. 1 are used as the reference to display the orientation of each drawing.

The imaging lens 20 is formed from a plurality of optical lenses, and focuses subject light from a scene at a position near a focal plane. For ease of description, FIG. 1 shows a single virtual lens arranged near the pupil to represent the imaging lens 20.

The image sensor 100 is arranged near the focal plane of the imaging lens 20. The image sensor 100 is an image sensor such as a CCD or CMOS sensor, in which a plurality of pixels are arranged two-dimensionally. The image sensor 100 experiences timing control from the driving section 204, to convert a subject image formed on a light receiving surface into an image signal and to output this image signal to the A/D conversion circuit 202. The image signal to be output to the A/D conversion circuit 202 includes image signals of a left viewpoint and a right viewpoint.

The A/D conversion circuit 202 converts the image signal output by the image sensor 100 into a digital image signal, and outputs this digital image signal to the memory 203. The image processing section 205 performs various types of image processing, using the memory 203 as a work space, to generate image data. The image processing section 205 also performs other general functions for image processing, such as adjusting the image data according to the selected image format. The created image data is converted into a display signal by the LCD drive circuit 210, and is displayed in the display section 209. Furthermore, the created image data is recorded in the memory card 220 loaded in the memory card IF 207.

One series of the image capturing sequence begins when the manipulating section 208 is manipulated by the user and outputs a manipulation signal to the control section 201. The various operations such as AF, AE, and the like that accompany the imaging sequence are performed under the control of the control section 201.

Figure 2:
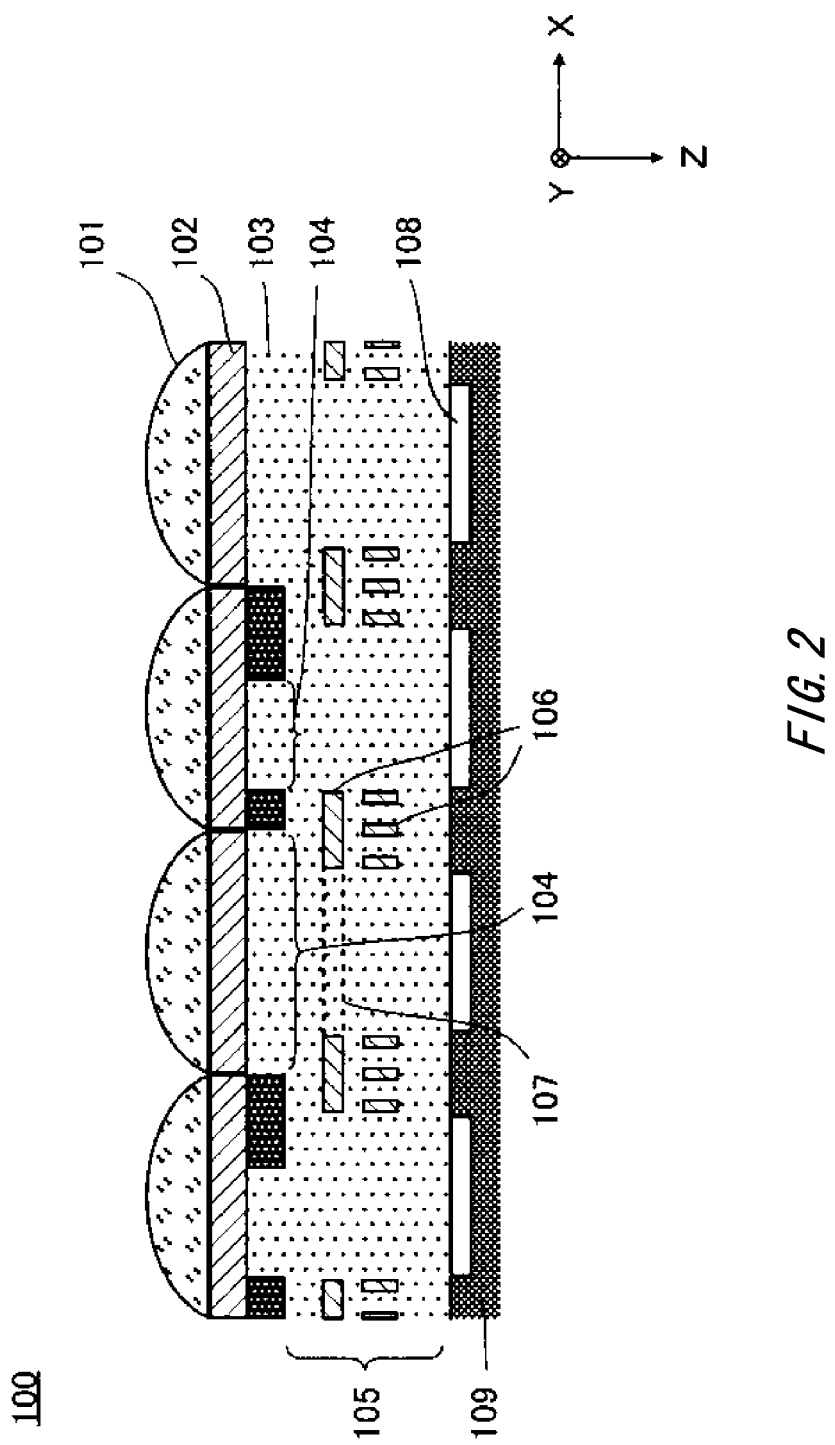
FIG. 2 is a schematic view of a cross section of the image sensor.

The following describes an exemplary configuration of the image sensor 100. FIG. 2 is a schematic view of a cross section of the image sensor 100.

The image sensor 100 includes microlenses 101, color filters 102, an aperture mask 103, a wiring layer 105, and photoelectric converting elements 108, arranged in the stated order from the subject side. Each photoelectric converting element 108 is formed by a photodiode that converts incident light into an electrical signal. A plurality of the photoelectric converting elements 108 are arranged two-dimensionally on the surface of the substrate 109.

The image signals converted by the photoelectric converting elements 108, the control signals for controlling the photoelectric converting elements 108, and the like are transmitted and received through wiring 106 provided in the wiring layer 105. Furthermore, the aperture mask 103 includes aperture sections 104 arranged two-dimensionally in a repeating manner to correspond one-to-one with the photoelectric converting elements 108, and is provided in contact with the wiring layer 105. As described further below, the aperture sections 104 are shifted for each photoelectric converting element 108, such that each aperture section 104 has a specifically determined position relative to the corresponding photoelectric converting element 108. Although described in detail further below, due to the aperture mask 103 including these aperture sections 104, a parallax occurs in the subject light received by the photoelectric converting elements 108.

On the other hand, the aperture mask 103 is not present on photoelectric converting elements 108 that are not to cause a parallax. In other words, the aperture mask 103 is provided to include aperture sections 104 that pass all incident light, i.e. aperture sections 104 that do not limit the subject light incident to the corresponding photoelectric converting elements 108. Although no parallax is caused in this case, the apertures 107 formed by the wiring 106 substantially regulate the incident subject light, and therefore the wiring 106 can serve as an aperture mask that passes the whole incident light and does not cause a parallax. The aperture mask 103 may be arranged independently in correspondence to each photoelectric converting element 108, or may be formed all at once for a plurality of the photoelectric converting elements 108 in the same manner as the manufacturing process of the color filters 102.

The color filters 102 are provided on the aperture mask 103. The color filters 102 are filters that are provided to correspond one-to-one with the photoelectric converting elements 108, and each color filter 102 is colored in a manner to pass a prescribed wavelength band to the corresponding photoelectric converting element 108. In order to output a color image, only at least two different types of color filters must be arranged, but three or more types of color filters may be arranged to acquire a higher quality color image. For example, red filters (R filters) that pass the red wavelength band, green filters (G filters) that pass the green wavelength band, and blue filters (B filters) that pass the blue wavelength band may be arranged in a grid formation. The color filters are not limited to a combination of the primary colors R, G, and B, and may instead be a combination of the complementary colors Y, C, and M.

The microlenses 101 are provided on the color filters 102. The microlenses 101 are converging lenses for guiding a greater amount of the incident subject light to the photoelectric converting elements 108. The microlenses 101 are provided to correspond one-to-one with the photoelectric converting elements 108. The microlenses 101 preferably have optical axes that are shifted in a manner to guide a greater amount of subject light to the photoelectric converting elements 108, according to the relative positional relationship between the photoelectric converting elements 108 and the pupil center of the imaging lens 20. Furthermore, the arrangement position may be adjusted along with the positions of the aperture portions 104 of the aperture mask 103 such that a greater amount of certain subject light is incident thereto, as described further below.

In this way, one unit including a microlens 101, a color filter 102, and an aperture mask 103 provided to correspond one-to-one to each photoelectric converting element 108 is referred to as a pixel. In particular, the pixels provided with an aperture mask 103 that causes a parallax are referred to as parallax pixels, and pixels that are not provided with an aperture mask 103 causing a parallax are referred to as non-parallax pixels. There are also cases where parallax pixels of the left viewpoint are referred to as parallax Lt pixels, parallax pixels of the right viewpoint are referred to as parallax Rt pixels, and non-parallax pixels are referred to as N pixels. Furthermore, there are cases where the parallax image of the left viewpoint is referred to as the parallax Lt image, the parallax image of the right viewpoint is referred to as the parallax Rt image, and the non-parallax image is referred to as the N image. As an example, in a case where the effective pixel region of the image sensor 100 is approximately 24 mm×16 mm, the number of pixels is approximately 12 million.

If the image sensor has good light focusing efficiency and photoelectric conversion efficiency, the microlenses 101 need not be provided. Furthermore, in the case of a back surface emission image sensor, the wiring layer 105 is provided on the opposite side from the photoelectric converting elements 108. If there are color components in the aperture sections 104 of the aperture mask 103, the color filters 102 and the aperture mask 103 can be formed integrally. The color filters 102 are not provided if it is acceptable for black and white image signals to be output.

In the present embodiment, the aperture mask 103 and the wiring 106 are formed independently, but the function of the aperture mask 103 in the parallax pixels may be fulfilled by the wiring 106. In other words, a prescribed aperture pattern is formed by the wiring 106, and the incident light is limited by this aperture pattern such that only a prescribed portion of the light is guided to the photoelectric converting element 108. In this case, the wiring 106 forming the aperture pattern is preferably farthest on the photoelectric converting element 108 side within the wiring layer 105.

The aperture mask 103 may be funned by a transmission stopping film provided overlapping the photoelectric converting elements 108. In this case, the aperture mask 103 is formed by sequentially layering SiN film and SiO$_2$ film to form the transmission stopping film and then performing etching to remove the regions corresponding to the aperture sections 104. Further, a region of the photoelectric converting element 108 itself may be formed to correspond to the aperture section 104 of the aperture mask 103.

The following describes a relationship between a blur and a parallax in a single-lens stereoscopic imaging. For describing simply, the following describes a configuration where a half-aperture mask described below is arranged in the parallax pixel.

(Parallax Pixels and Blur Characteristic)

The following is a basic description of defocus occurring when the parallax Lt pixels and parallax Rt pixels receive light. First, the following describes simply the basics of defocus in non-parallax pixels. FIGS. 3A to 3D are drawings for describing the basics of defocus in non-parallax pixels.

Figure 3A:
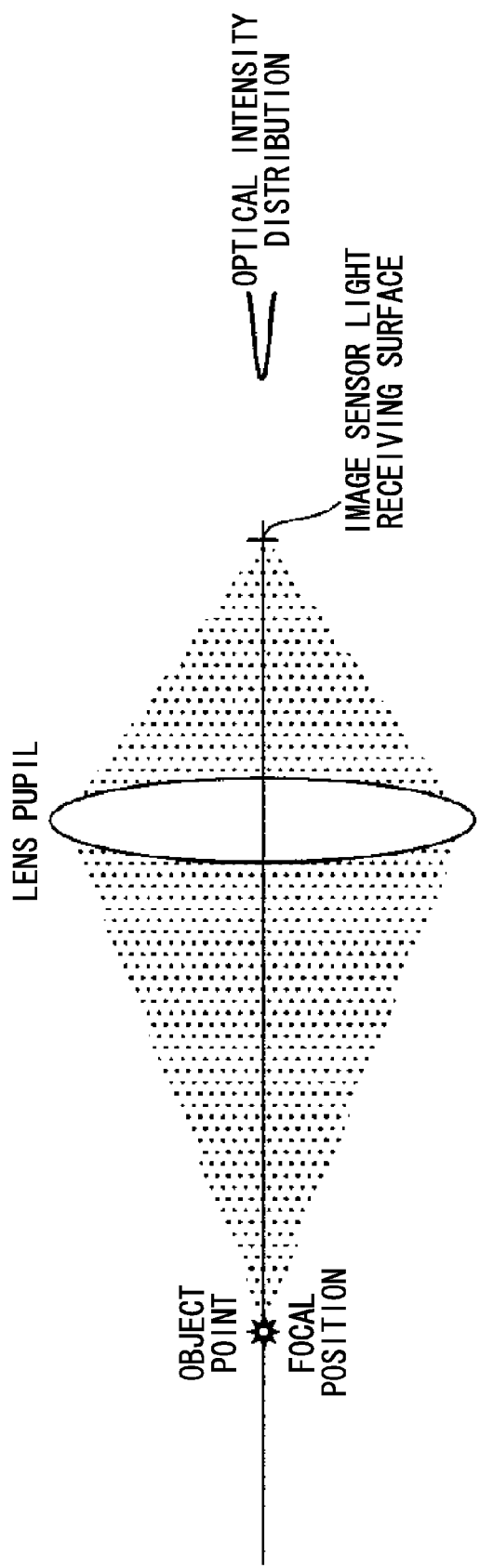
FIG. 3A is a drawing for describing the basics of defocus in non-parallax pixels.

As shown in FIG. 3A, when the object point, which is the subject, is at a focal position, the subject light that passes through the lens pupil to reach the light receiving surface of the image sensor exhibits a steep optical intensity distribution centered on the pixels of the corresponding image point. In other words, if non-parallax pixels that receive all of the effective light passed through the lens pupil are arranged near the image point, the output value of the pixel corresponding to the image point is large and the output values of the pixels arranged in the periphery decrease sharply.

Figure 3B:
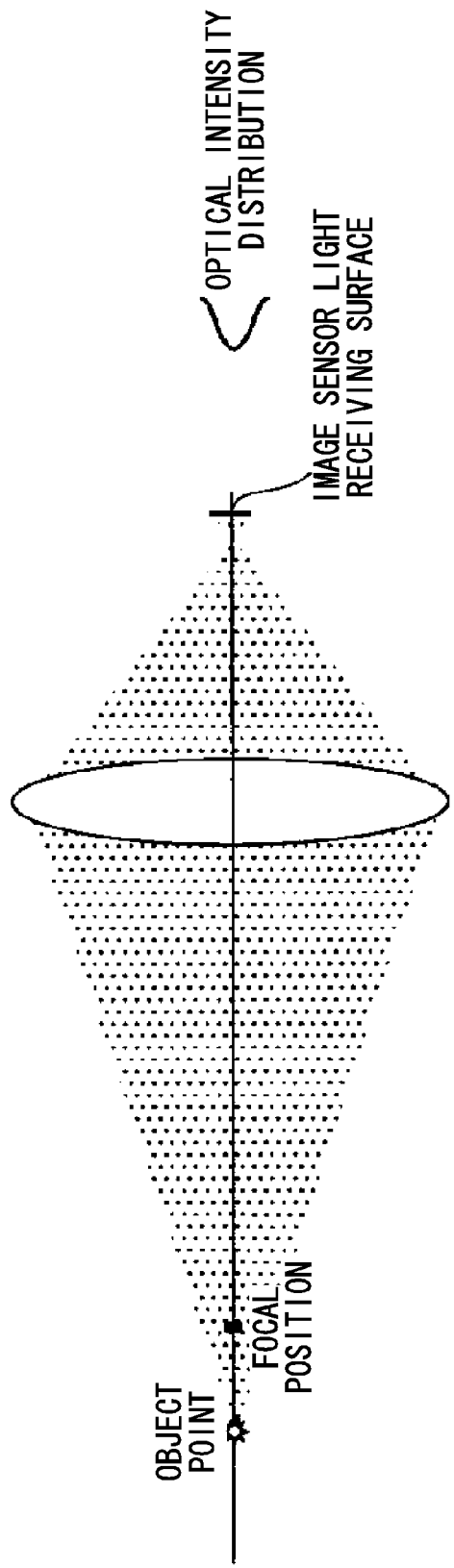
FIG. 3B is a drawing for describing the basics of defocus in non-parallax pixels.

On the other hand, as shown in FIG. 3B, when the object point is shifted from the focal position in a direction away from the light receiving surface of the image sensor, the subject light exhibits an optical intensity distribution at the light receiving surface of the image sensor that is less steep than in the case where the object point is at the focal position. In other words, the distribution has a decreased output value for the pixel corresponding to the image point and has output values that reach to pixels further in the periphery.

Figure 3C:
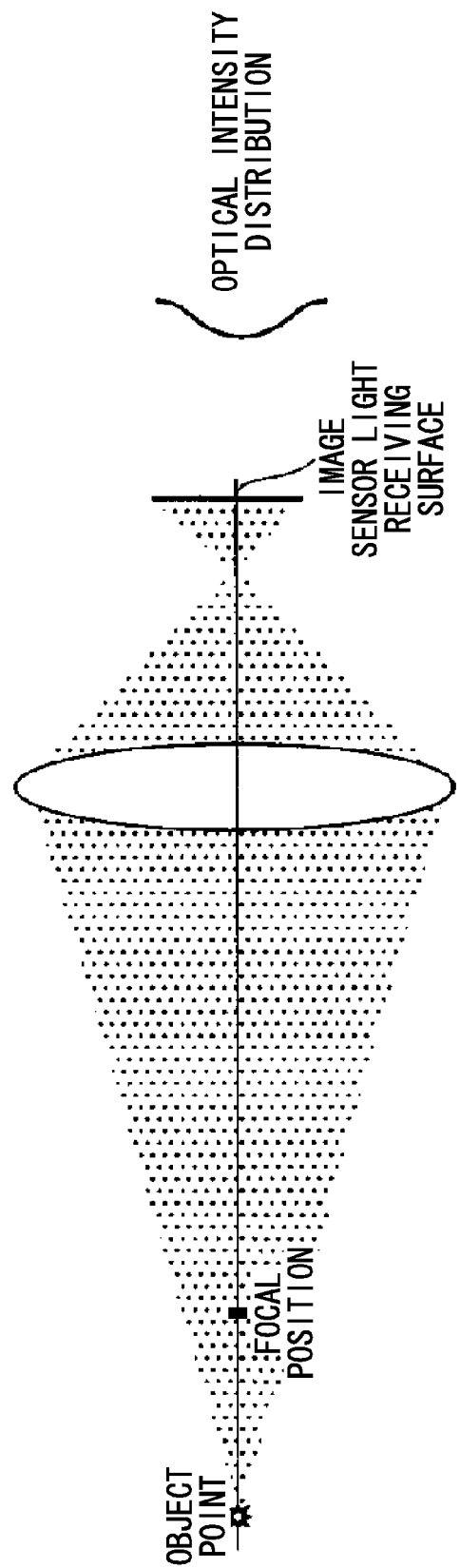
FIG. 3C is a drawing for describing the basics of defocus in non-parallax pixels.

As shown in FIG. 3C, when the object point is shifted farther from the focal position, the subject light exhibits an optical intensity distribution at the light receiving surface of the image sensor that is even less steep. In other words, the distribution has a further decreased output value for the pixel corresponding to the image point and has output values that reach to pixels even further in the periphery.

Figure 3D:
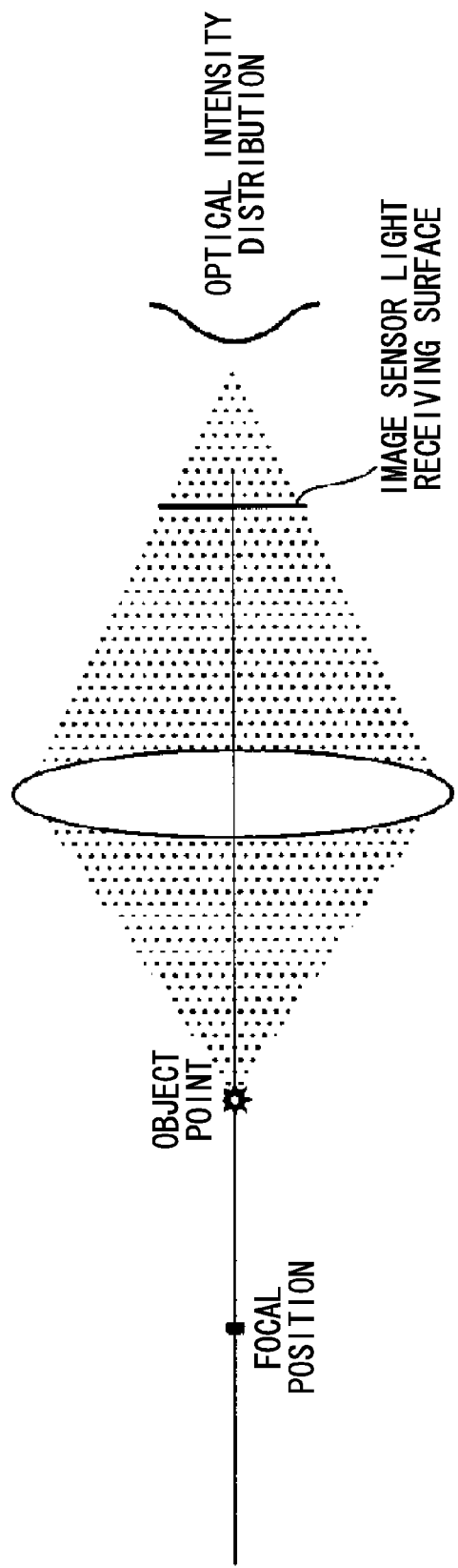
FIG. 3D is a drawing for describing the basics of defocus in non-parallax pixels.

As shown in FIG. 3D, when the object point is shifted from the focal position in a direction toward the light receiving surface of the image sensor, the subject light exhibits an optical intensity distribution that is similar to the case in which the object point is shifted in a direction away from the light receiving surface of the image sensor.

FIGS. 4A to 4D are drawings for describing the basics of defocus for the parallax pixels. The parallax Lt pixels and parallax Rt pixels each receive subject light that reaches the pixels from one of the two parallax virtual pupils whose optical axes targets are set as partial regions of the lens pupil. In the present specification, a method capturing a parallax image by receiving the subject light from different virtual pupils in a single lens pupil is referred to as a single-lens pupil-divided imaging method.

Figure 4A:
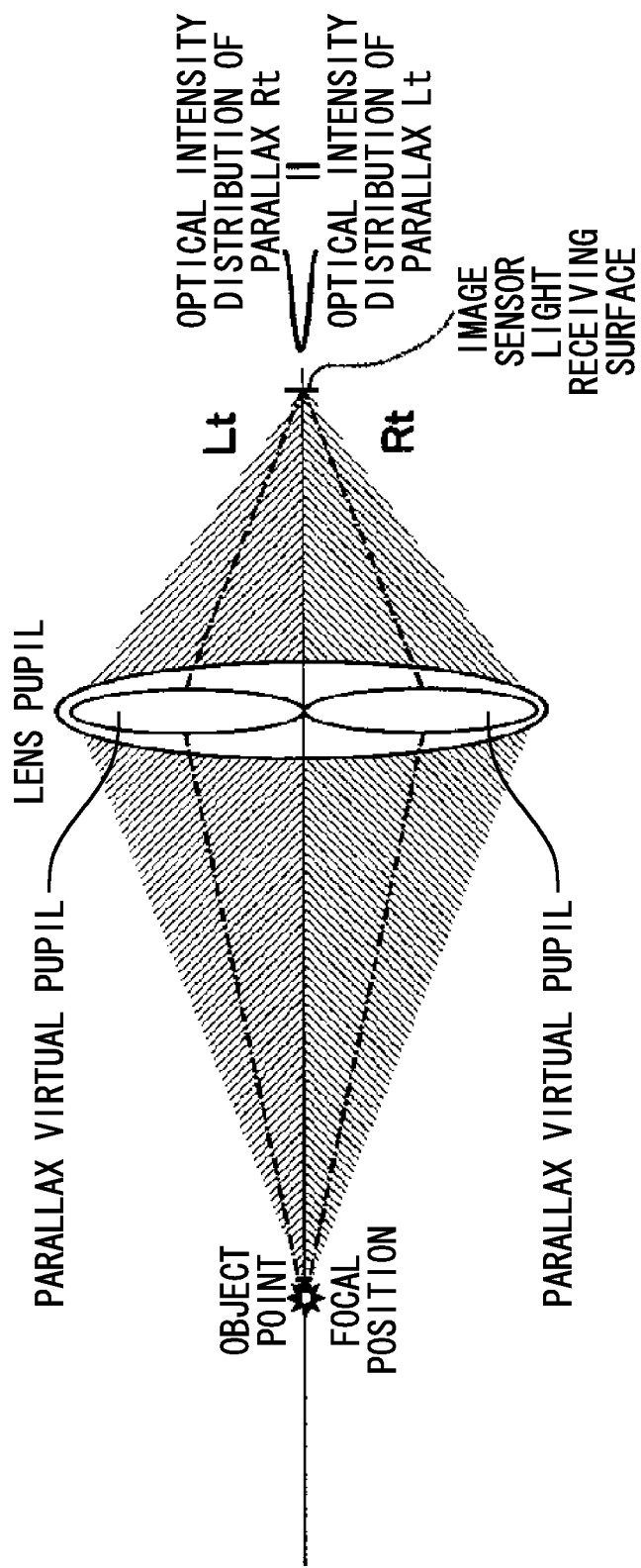
FIG. 4A is a drawing for describing the basics of defocus in parallax pixels.

As shown in FIG. 4A, when the object point that is the subject is at the focal position, whichever of the parallax virtual pupils the subject light passes through, the subject light exhibits a steep optical intensity distribution centered on the pixel of the corresponding image point. If the parallax Lt pixels are arranged near the image point, the output value of the pixel corresponding to the image point is the largest and the output values of the pixels arranged in the periphery decrease sharply. In the same manner, if the parallax Rt pixels are arranged near the image point, the output value of the pixel corresponding to the image point is the largest and the output values of the pixels arranged in the periphery decrease sharply. In other words, regardless of which of the parallax virtual pupils the subject light passes through, in the resulting distributions the output value of the pixel corresponding to the image point is the largest and the output values of the pixels arranged in the periphery decrease sharply, and these distributions match each other.

Figure 4B:
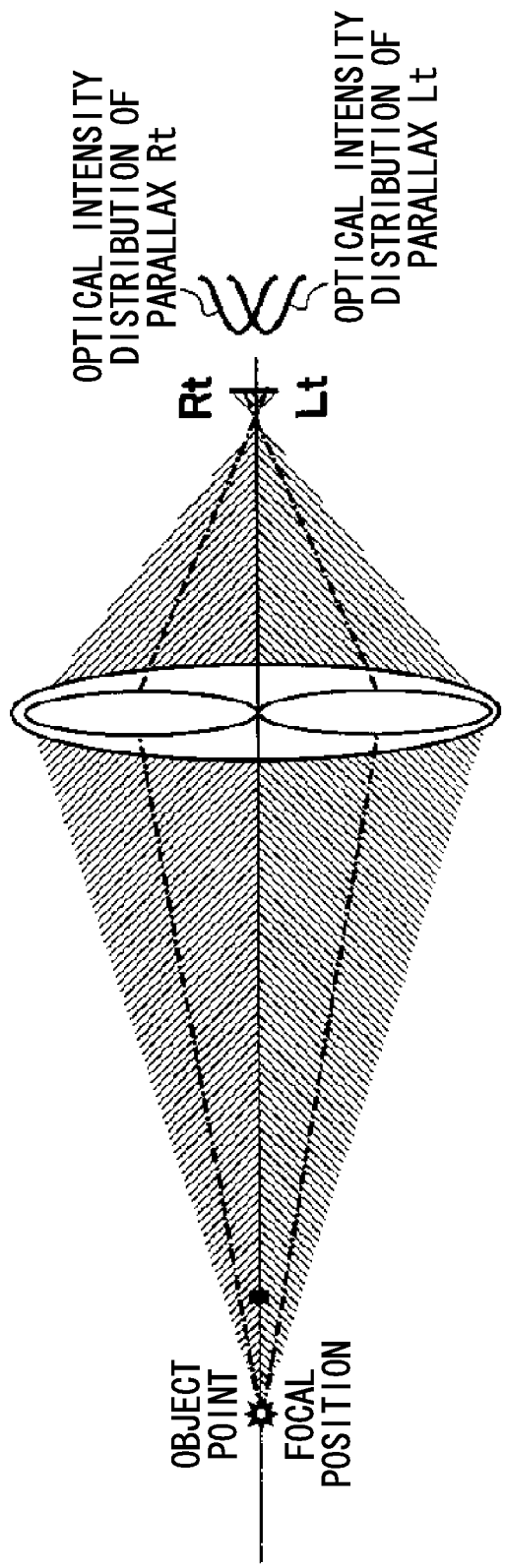
FIG. 4B is a drawing for describing the basics of defocus in parallax pixels.

On the other hand, as shown in FIG. 4B, when the object point is shifted from the focal position in a direction away from the light receiving surface of the image sensor, in contrast to the case in which the object point is at the focal position, the peak of the optical intensity distribution exhibited by the parallax Lt pixels occurs at a position at a distance in a certain direction from the pixel corresponding to the image point, and the output value of this peak is lower. Furthermore, the width of pixels having output values is larger. In other words, the point image widens in the horizontal direction of the light receiving surface of the image sensor, and therefore the blur amount increases. The peak of the optical intensity distribution exhibited by the parallax Rt pixels occurs at a position at a distance from the pixel corresponding to the image point equal to the distance of the peak of the distribution exhibited by the parallax Lt pixels, but in a direction opposite the certain direction of the shift of the peak exhibited by the parallax Lt pixels, and the output value decreases in the same manner. Furthermore, the width of pixels having output values is larger, in the same manner. In other words, compared to the case where the object point is at the focal position, identical optical intensity distributions that are less steep occur at a certain distance from each other. The amount of shift between the peaks of the optical intensity distributions exhibited by the parallax Lt pixels and the parallax Rt pixels corresponds to the parallax amount.

Figure 4C:
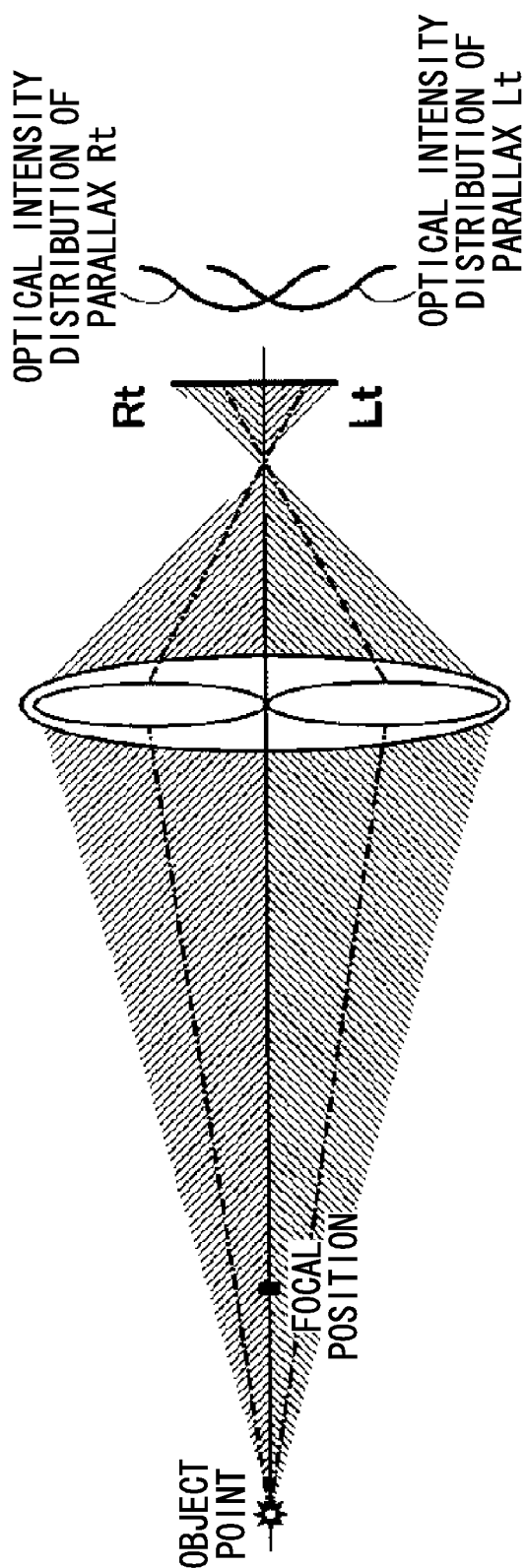
FIG. 4C is a drawing for describing the basics of defocus in parallax pixels.

As shown in FIG. 4C, when the object point is shifted farther form the focal position, compared to the state shown in FIG. 4B, identical optical intensity distributions that are even less steep occur at a greater distance from each other. Since the widening of the point image becomes larger, the blur amount increases. Furthermore, the distance between the peaks of the optical intensity distributions exhibited by the parallax Lt pixels and the parallax Rt pixels becomes greater, and therefore the parallax amount increases. In other words, when the object point is farther from the focal position, the blur amount and the parallax amount increase.

Figure 4D:
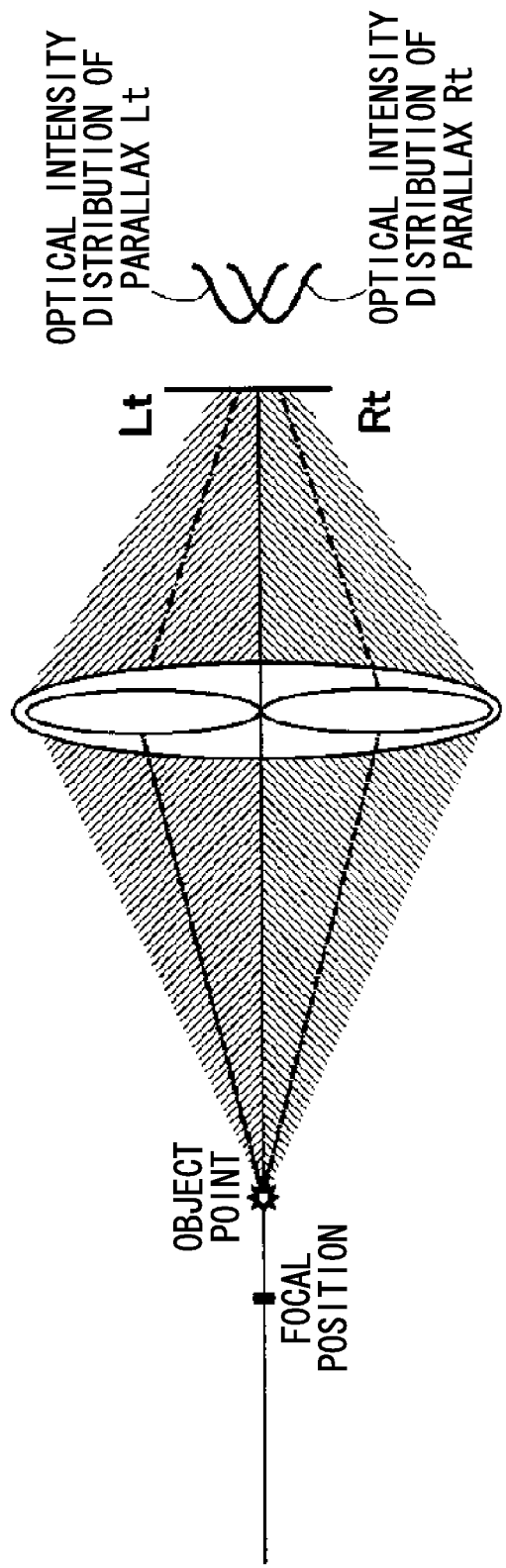
FIG. 4D is a drawing for describing the basics of defocus in parallax pixels.

As shown in FIG. 4D, when the object point is shifted form the focal position in a direction toward the light receiving surface of the image sensor, the peak of the optical intensity distribution exhibited by the parallax Rt pixels occurs at a position at a distance in the certain direction described above from the pixel corresponding to the image point, in a manner opposite that of the state shown in FIG. 4C. Furthermore, the peak of the optical intensity distribution exhibited by the parallax Lt pixels occurs at a position at a distance in a direction opposite the certain direction in which the peak of the parallax Rt pixels is distanced. In other words, the direction in which the peaks of the optical intensity distributions of the parallax Lt pixels and the parallax Rt pixels are distanced from the pixel corresponding to the image point is determined according to the direction in which the object point is shifted.

Figure 5A:
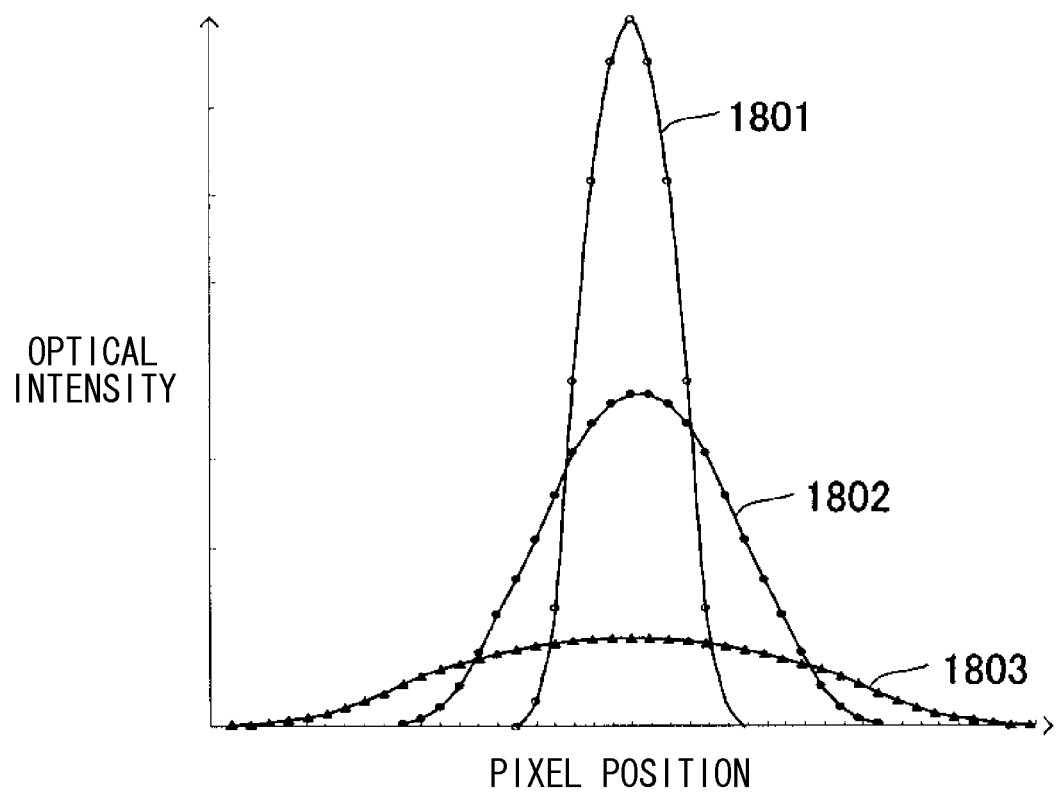
FIG. 5A is a graph showing the changes in the optical intensity distributions described in FIGS. 3A to 3C.
Figure 5B:
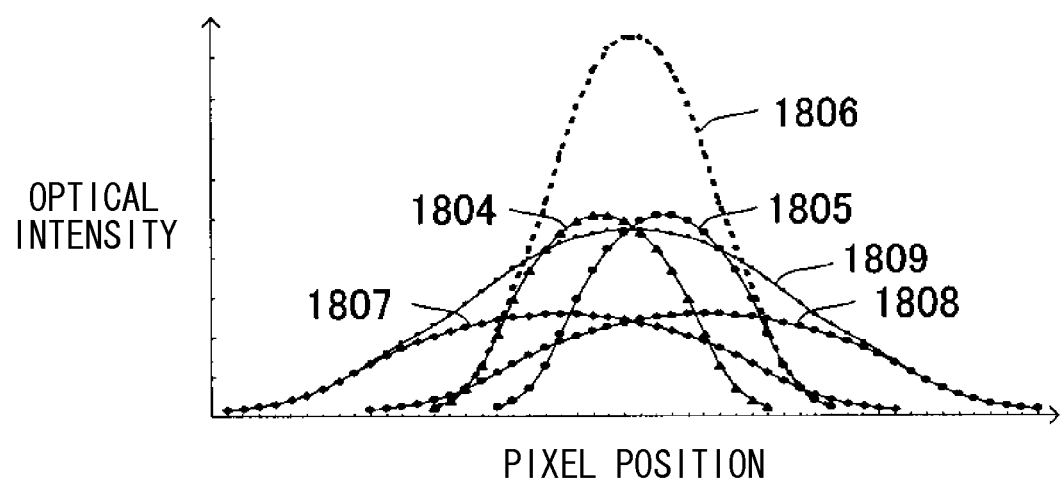
FIG. 5B is a graph showing the changes in the optical intensity distributions described in FIGS. 4A to 4C.

The results obtained by graphing the changes of the optical intensity distributions described in FIGS. 3A to 3C and the changes in the optical intensity distributions described in FIGS. 4A to 4C are shown in FIGS. 5A and 5B. FIGS. 5A and 5B show the optical intensity distributions of the non-parallax pixels and the parallax pixels. In the drawings, the horizontal axis indicates the pixel position, and the center position is the position of the pixel corresponding to the image point. The vertical axis indicates the output values of the pixels and, since these output values are substantially proportional to the optical intensity, also indicates the optical intensity.

As described above, when the object point is shifted from the focal position in a direction toward the light receiving surface of the image sensor, the optical intensity distribution is the same as the optical intensity distribution in the case where the object point is shifted in a direction away from the light receiving surface of the image sensor, and therefore the change of the optical intensity distribution in a case where the object point is shifted in a direction toward the light receiving surface of the image sensor is omitted from the drawings. The peaks of the optical intensity distributions exhibited by the parallax Lt pixels and the parallax Rt pixels when the object point is shifted from the focal position in a direction toward the light receiving surface of the image sensor are the same as the peaks of the optical intensity distributions exhibited by the parallax Lt pixels and the parallax Rt pixels when the object point is shifted from the focal position in a direction away from the light receiving surface of the image sensor, and therefore description of these peaks is omitted.

FIG. 5A is a graph showing the changes in the optical intensity distributions described in FIGS. 3A to 3C. The distribution curve 1801 represents the optical intensity distribution corresponding to FIG. 3A, which is the steepest distribution. The distribution curve 1802 represents the optical intensity distribution corresponding to FIG. 3B, and the distribution curve 1803 represents the optical intensity distribution corresponding to FIG. 3C. Compared to the distribution curve 1801, these distributions become gradually wider and have peak values that gradually decrease.

FIG. 5B is a graph showing the change of the optical intensity distributions described in FIGS. 4A to 4C. The distribution curve 1804 and the distribution curve 1805 respectively represent the optical intensity distribution of the parallax Lt pixels and the optical intensity distribution of the parallax Rt pixels in FIG. 4B. As understood from the drawings, these distributions are symmetrical over the center position. The combined distribution curve 1806, which is a combination of these distribution curves, exhibits approximately the same shape as the distribution curve 1802 of FIG. 3B, which is a defocus state equivalent to that of FIG. 4B.

The distribution curve 1807 and the distribution curve 1808 respectively represent the optical intensity distribution of the parallax Lt pixels and the optical intensity distribution of the parallax Rt pixels in FIG. 4C. As understood from the drawings, these distributions are symmetrical over the center position. The combined distribution curve 1809, which is a combination of these distribution curves, exhibits approximately the same shape as the distribution curve 1803 of FIG. 3C, which is a defocus state equivalent to that of FIG. 4C. The optical intensity distribution of the parallax Lt pixels and the optical intensity distribution of the parallax Rt pixels in FIG. 4D are the same as the optical intensity distribution of the parallax Lt pixels and the optical intensity distribution of the parallax Rt pixels in FIG. 4D, except that the positions of these distributions are switched, and therefore these optical intensity distributions in FIG. 4D correspond respectively to the distribution curve 1808 and the distribution curve 1807.

Figure 6A:
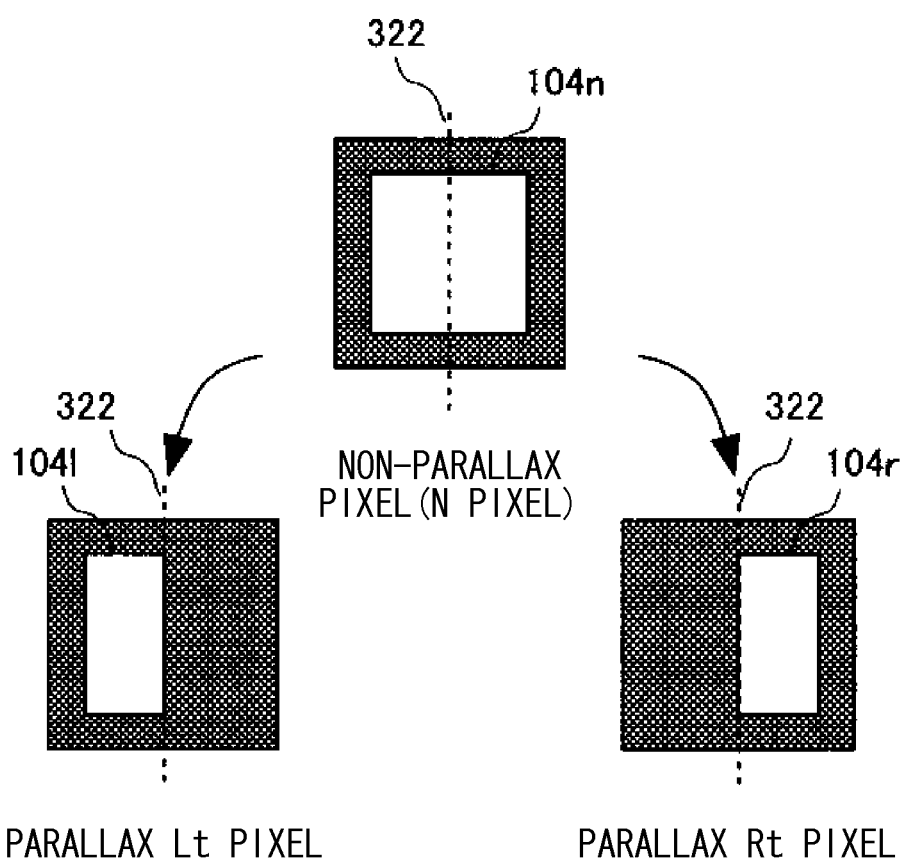
FIG. 6A is a drawing for describing the aperture shape of the aperture sections 104 in a case where there are two types of parallax pixels.

FIGS. 6A to 6F are drawings for describing the aperture shapes of the aperture sections 104 in a case where there are two types of parallax pixels. FIG. 6A shows an example in which the shapes of the aperture sections 104*l* of the parallax Lt pixels and the shapes of the aperture sections 104*r* of the parallax Rt pixels are identical shapes obtained by dividing the shapes of the aperture sections 104*n* of the non-parallax pixels at the center line 322. In other words, in FIG. 6A, the area of the aperture sections 104*n* of the non-parallax pixels is equal to the sum of the area of the aperture sections 104*l* of the parallax Lt pixels and the area of the aperture sections 104*r* of the parallax Rt pixels. In this case, an aperture section 104*n* of a non-parallax pixel refers to the entire aperture of an aperture section, and an aperture section 104*l* and an aperture section 104*r* each refer to half of the aperture of an aperture section. When an aperture section is positioned at the center of a photoelectric converting element, this aperture section is referred to as being oriented in the reference direction. The aperture section 104*l* of a parallax Lt pixel and the aperture section 104*r* of a parallax Rt pixel are respectively shifted in opposite directions from the virtual center line 322 passing through the center of the corresponding photoelectric converting element 108, i.e. the center of the pixel. Accordingly, the aperture section 104*l* of the parallax Lt pixel and the aperture section 104*r* of the parallax Rt pixel create a parallax in one direction relative to the center line 322 and another direction that is opposite the one direction.

Figure 6B:
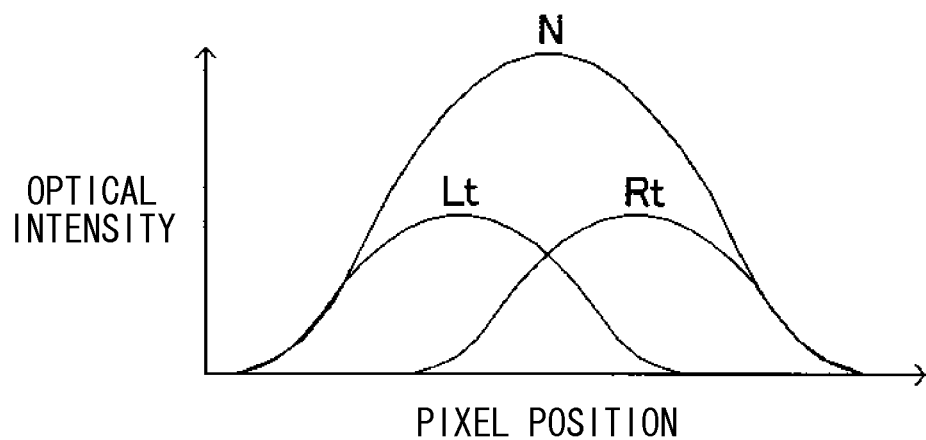
FIG. 6B shows an optical intensity distribution in a case where the object point is shifted from the focal position in a direction away from the light receiving surface of the image sensor.

FIG. 6B shows an optical intensity distribution in a case where the object point is shifted from the focal position in a direction away from the light receiving surface of the image sensor having pixels with the aperture sections shown in FIG. 6A. In the drawing, the horizontal axis indicates the pixel position, and the center position is the position of the pixel corresponding to the image point. The vertical axis indicates the optical intensity. Furthermore, the curve Lt corresponds to the distribution curve 1804 of FIG. 5B and the curve Rt corresponds to the distribution curve 1805 of FIG. 5B. The curve N corresponds to non-parallax pixels, and exhibits a shape that approximates the combined distribution curve 1806 of FIG. 5B. The aperture sections 104*n*, the aperture sections 104*l*, and the aperture sections 104*r* each realize functioning as aperture diaphragms. Accordingly, the blur width of the non-parallax pixels including the aperture sections 104*n* that have multiple times the area of the aperture sections 104*l* (or aperture sections 104*r*) is approximately equal to the blur width of the curve obtained by combining the parallax Lt pixels and the parallax Rt pixels, which is represented by the combined distribution curve 1806 of FIG. 5B.

Figure 6C:
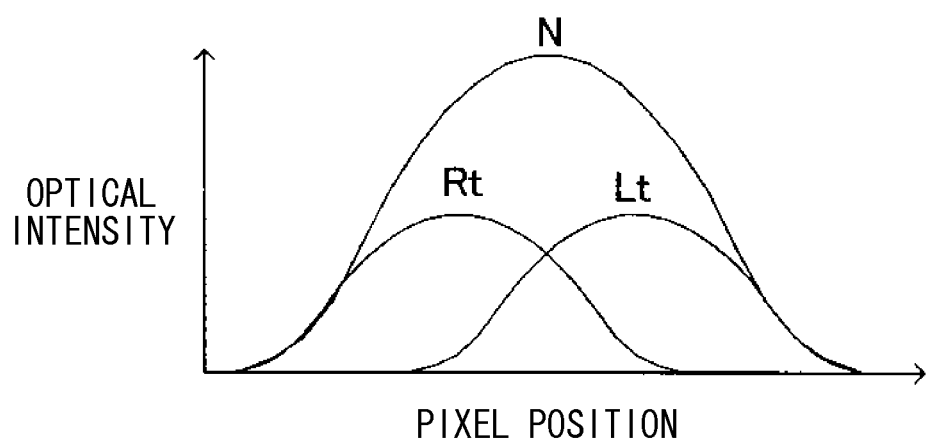
FIG. 6C shows an optical intensity distribution in a case where the object point is shifted from the focal position in a direction toward the light receiving surface of the image sensor.

FIG. 6C shows an optical intensity distribution in a case where the object point is shifted from the focal position in a direction toward the light receiving surface of the image sensor having pixels with the aperture sections shown in FIG. 6A. In the drawing, the horizontal axis indicates the pixel position, and the center position is the position of the pixel corresponding to the image point. The vertical axis indicates the optical intensity. The curve Lt and the curve Rt of FIG. 6C maintain the relationship that the blur width of the non-parallax pixels including the aperture sections 104*n* is approximately the same as the blur width of the curve resulting from the combination of the parallax Lt pixels and the parallax Rt pixels, and have a positional relationship that is the inverse of that of the curve Lt and the curve Rt of FIG. 6B.

Figure 6D:
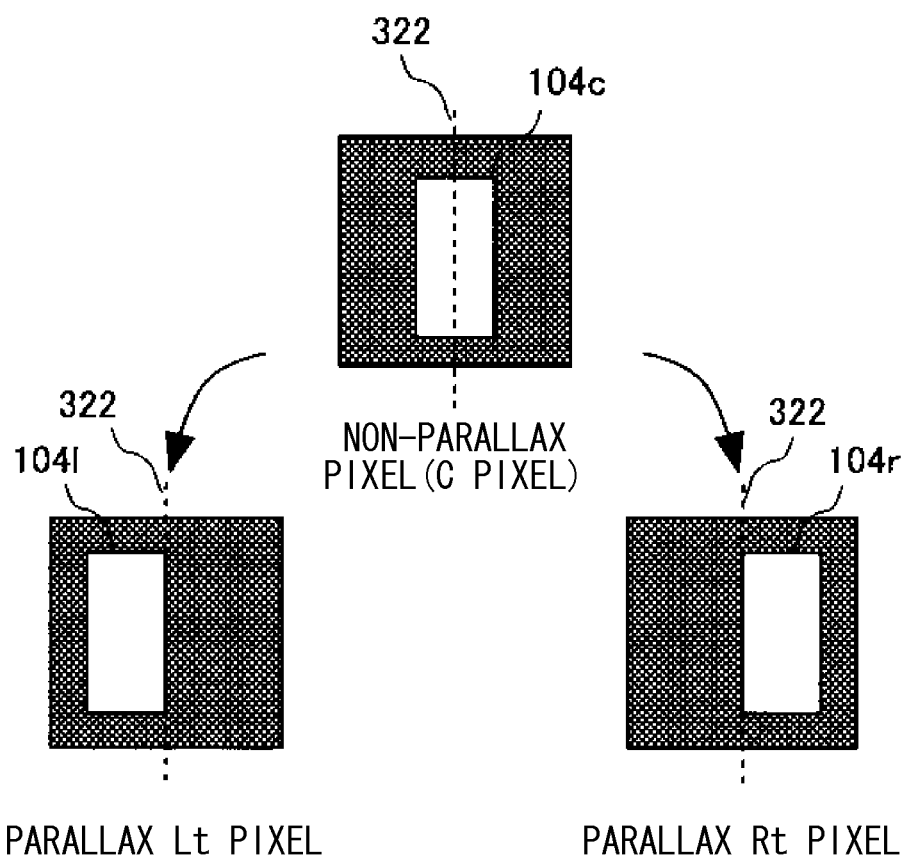
FIG. 6D is a drawing for describing the aperture shape of the aperture section 104 in a case where there are two types of parallax pixels.

FIG. 6D shows an example where the shape of the aperture section 104*l* of the parallax Lt pixel, the shape of the aperture section 104*r* of the parallax Rt pixel and the shape of the aperture section 104*c* are all the same shape. In this case, the pixel comprising the aperture section 104*c* only leads the subject luminous flux with the center part of the pupil as partial regions to the photoelectric converting element 108, but is a pixel free from eccentricity and comprising an aperture section corresponding to the reference direction. Therefore, it can be considered as the non-parallax pixel (C pixel). Also, each area of the aperture section 104*l*, the aperture section 104*r* and the aperture section 104*c* is half of the area of the aperture section 104*n* shown in FIG. 6A. In the same manner as FIG. 6A, the aperture sections 104*l* and 104*r* is respectively in contact with the virtual center line 322 passing through the center (the pixel center) of the photoelectric converting element 108.

Figure 6E:
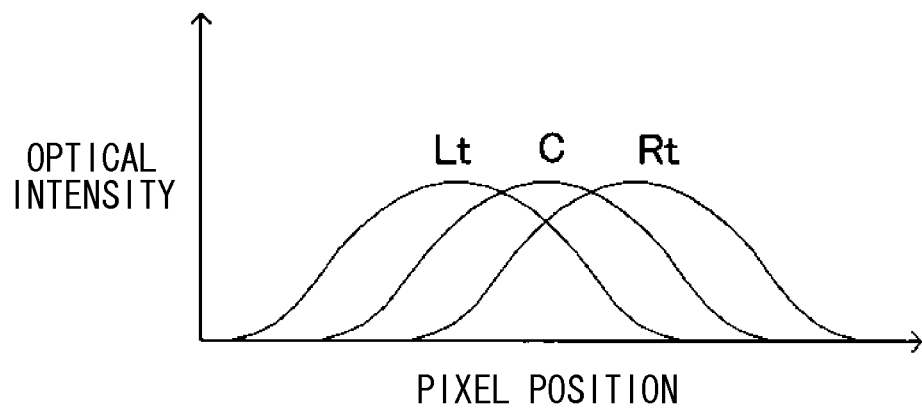
FIG. 6E shows an optical intensity distribution in a case where the object point is shifted from the focal position in the direction away from the light receiving surface of the image sensor.

FIG. 6E shows the optical intensity distribution in a case where the object point is shifted from the focal position in the direction away from the light receiving surface of the image sensor in the pixels comprising each aperture section shown in FIG. 6D. In the drawing, the horizontal axis indicates a pixel position and a center position is a pixel position corresponding to the image point. The vertical axis indicates the optical intensity. The curve Lt corresponds to the distribution curve 1804 of FIG. 5B and the curve Rt corresponds to the distribution curve 1805 of FIG. 5B. Also, each of the aperture section 104c, the aperture section 104l and the aperture section 104r has an aperture diaphragm function. Therefore, the blur width of the non-parallax pixel comprising the aperture section 104c, which is with the same shape and the same area as the aperture section 104l and the aperture section 104r, is nearly equal to the blur width of the parallax Lt pixel and the blur width of the parallax Rt pixel.

Figure 6F:
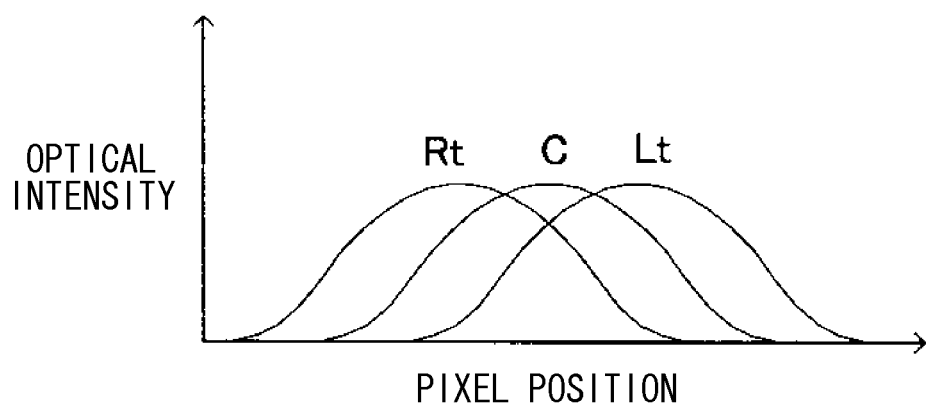
FIG. 6F shows an optical intensity distribution in a case where the object point is shifted from the focal position in the direction toward the light receiving surface of the image sensor.

FIG. 6F shows the optical intensity distribution in a case where the object point is shifted in the focal position toward the light receiving surface of the image sensor in the pixels comprising each aperture section shown in FIG. 6D. In the drawing, the horizontal axis indicates the pixel position and the center position is the pixel position corresponding to the image point. The vertical axis indicates the optical intensity. The curve Lt and the curve Rt of FIG. 6F have a positional relationship that is the inverse of that of the curve Lt and the curve Rt of FIG. 6E.

(Depth of Field and Vertical-Horizontal Asymmetrical Blur)

The following describes the relationship between the depth of field and the asymmetry of the blur. In a case where the non-parallax pixel includes a full-aperture aperture mask, as made clear from FIG. 6B or FIG. 6C, in an unfocused region, the blur width of the parallax pixels is less than the blur width of the non-parallax pixels. This means that the incident light of the lens is substantially constricted on the right half and the left half by the aperture mask of the parallax pixels shown in FIG. 6A. In other words, there are two virtual pupils respectively on the left and right in the single lens pupil. Specifically, the aperture area in the aperture mask of the parallax pixels fulfills a role equivalent to the effect of a lens diaphragm.

Generally, an image with deeper depth of field is captured when the lens is constricted. The apertures of the aperture mask for the parallax pixels are shorter in the horizontal direction and longer in the vertical direction. Accordingly, for a subject having a frequency component in the horizontal direction, such as vertical lines, an image with a deep depth of field is captured, while for a subject having a frequency component in the vertical direction, such as horizontal lines, an image with a shallow depth of field is captured.

Figure 7A:
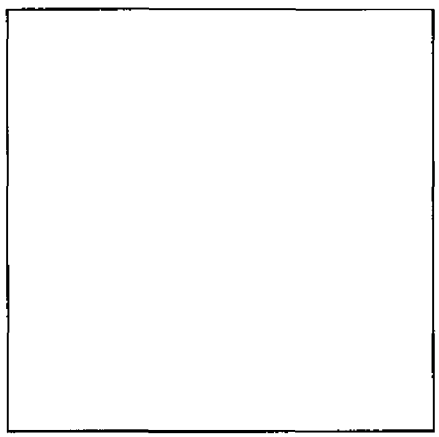
FIG. 7A is a drawing for describing the asymmetry of the blur.
Figure 7B:
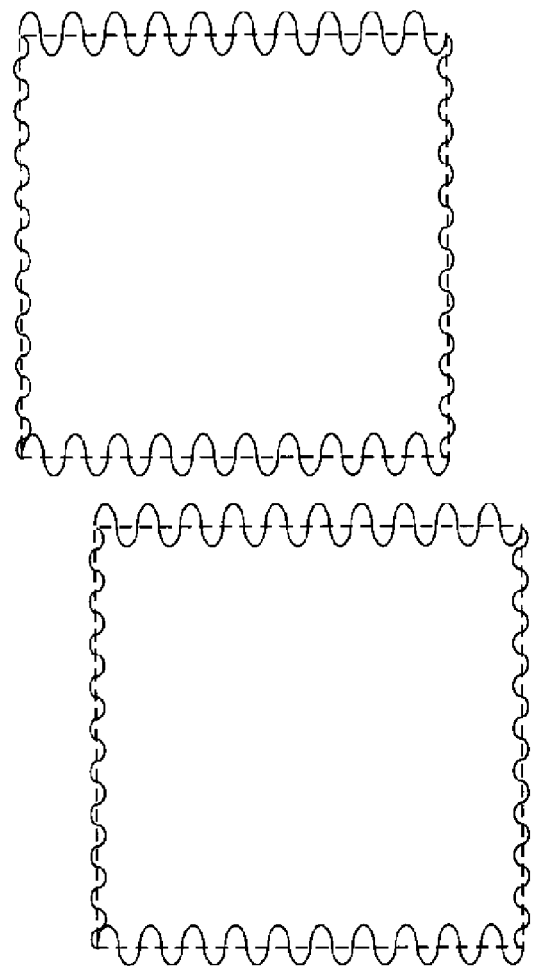
FIG. 7B is a drawing for describing the asymmetry of the blur.
Figure 7C:
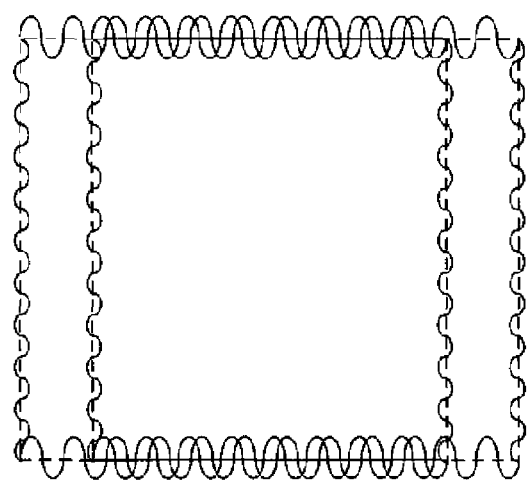
FIG. 7C is a drawing for describing the asymmetry of the blur.

FIGS. 7A to 7C are drawings for describing asymmetry of the blur. For example, when capturing an image of a subject that is a square patch such as shown in FIG. 7A, a subject image such as shown in FIG. 7A is obtained in a focused region. FIG. 7B shows the subject images taken by the left parallax pixels and the right parallax pixels together. In an unfocused region, a subject image is captured in which there is little blur in the horizontal direction and the vertical lines appear sharper than the horizontal lines, as shown in FIG. 7B. In other words, the aperture sections of the aperture mask for the parallax pixels are asymmetrical with respect to the horizontal direction and the vertical direction, and therefore the blur is asymmetrical with respect to the horizontal direction and the vertical direction of the subject image. This can be referred to as the anisotropic nature of the blur.

When the left eye subject image and right eye subject image of FIG. 7B are shown in an overlapping manner to obtain a 2D image from a 3D image, undesirable blur occurs, such as shown by the double-line blur caused by the sharp blur in the horizontal direction in the 2D image (FIG. 7C).

Figure 8A:
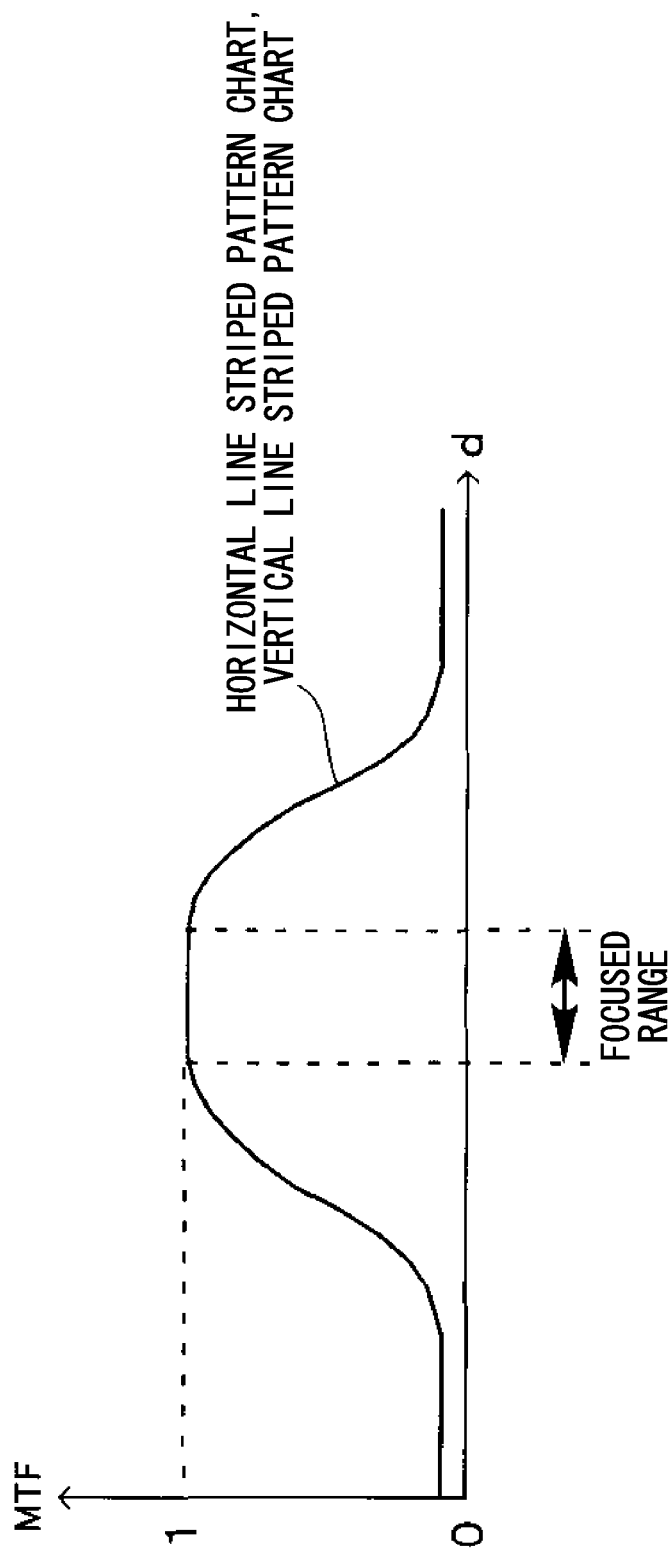
FIG. 8A shows the MTF distributions of the vertical line striped pattern chart and the horizontal line striped pattern chart relating to the subject distance of the subject having a prescribed frequency for the non-parallax image.
Figure 8B:
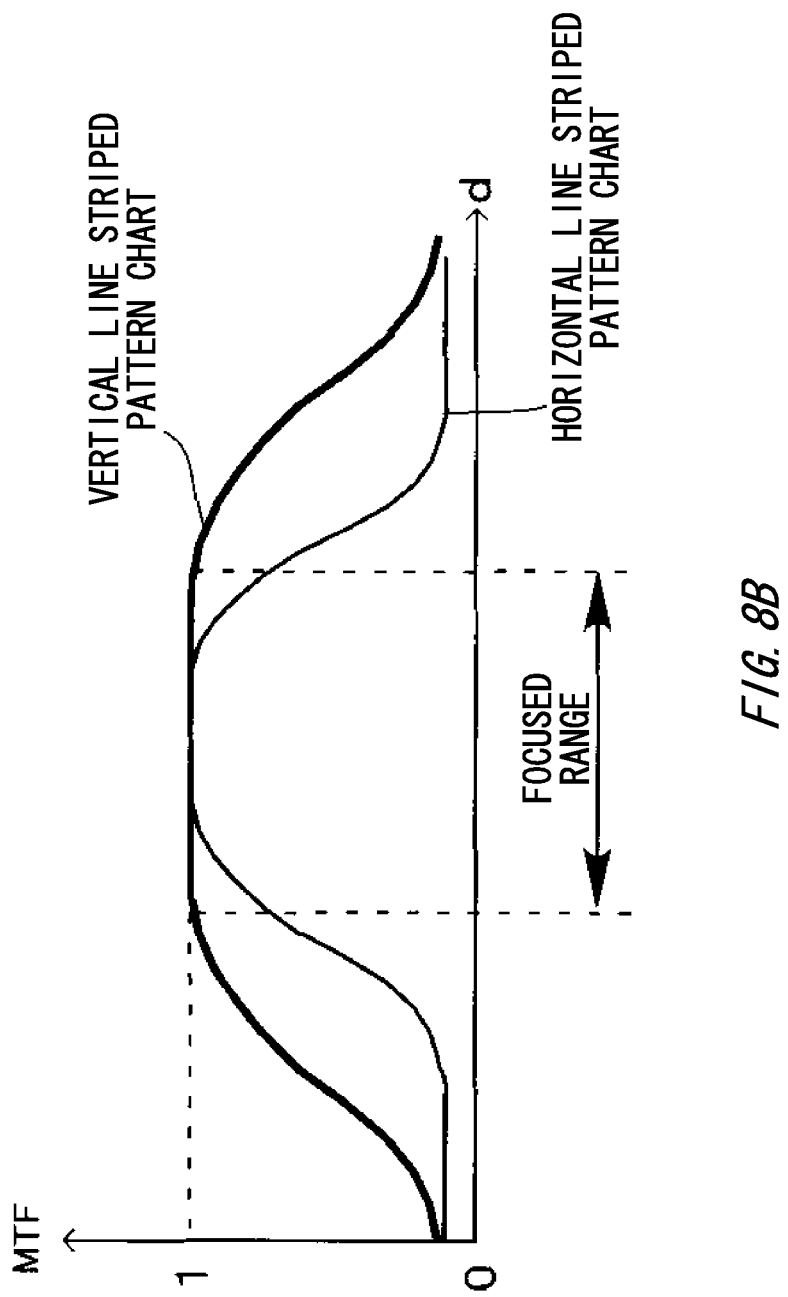
FIG. 8B shows the MTF distributions of the vertical line striped pattern chart and the horizontal line striped pattern chart relating to the subject distance of the subject having a prescribed frequency for the parallax images.

FIGS. 8A and 8B show the relationship between the parallax image and non-parallax image and the depth of field. Specifically, FIGS. 8A and 8B show the subject distance dependency of the MTF (Modulation Transfer Function) characteristic of a vertical line striped pattern chart occurring when capturing a striped pattern chart of a subject in a case where the pixel pitch of the image sensor 100 is a (mm) and the frequency is f (lines/mm) and of a horizontal line striped pattern chart obtained by rotating the vertical line striped pattern chart by 90. The vertical axis indicates the MTF and the horizontal axis indicates the distance d from the digital camera 10. The MTF distribution indicates how attenuation occurs when the striped pattern chart is moved forward and backward from the focal position, in a case where the MTF is 1 near the optical axis at the focal position.

FIG. 8A shows the MTF distributions of the vertical line striped pattern chart and the horizontal line striped pattern chart relating to the subject distance of the subject image having a prescribed frequency for the non-parallax image (N image). As shown in FIG. 8A, in the non-parallax image, the MTF distribution of the vertical line striped pattern chart matches the MTF distribution of the horizontal line striped pattern chart. FIG. 8B shows the MTF distributions of the vertical line striped pattern chart and the horizontal line striped pattern chart relating to the subject distance of the subject image having a prescribed frequency for the parallax images (the parallax Lt image and the parallax Rt image). The MTF distribution of the horizontal line striped pattern chart shown in FIG. 8B matches the MTF distribution of the horizontal line striped pattern chart shown in FIG. 8A. On the other hand, the MTF distribution of the vertical line striped pattern chart shown in FIG. 8B can be seen to have a deeper depth of field and a wider distribution for the region with high contrast, compared to the MTF distribution of the vertical line striped pattern chart shown in FIG. 8A. In other words, when the striped pattern chart is moved backward or forward from the focal position, the contrast differs between the horizontal line striped pattern chart and the vertical line striped pattern chart in the parallax images. This is an expression of the asymmetry of the blur shown in FIGS. 7A to 7C above.

(Left-Right Blur Asymmetry)

The parallax pixels receive incident light projecting to the virtual pupils, and therefore the shape of the virtual pupils appears as a blur characteristic. The parallax pixels basically fulfill the role of passing light that is one half of the light passed by the lens. At that time, since the shape of the pupil of the lens is round, the virtual pupils are semicircles.

Figure 9:
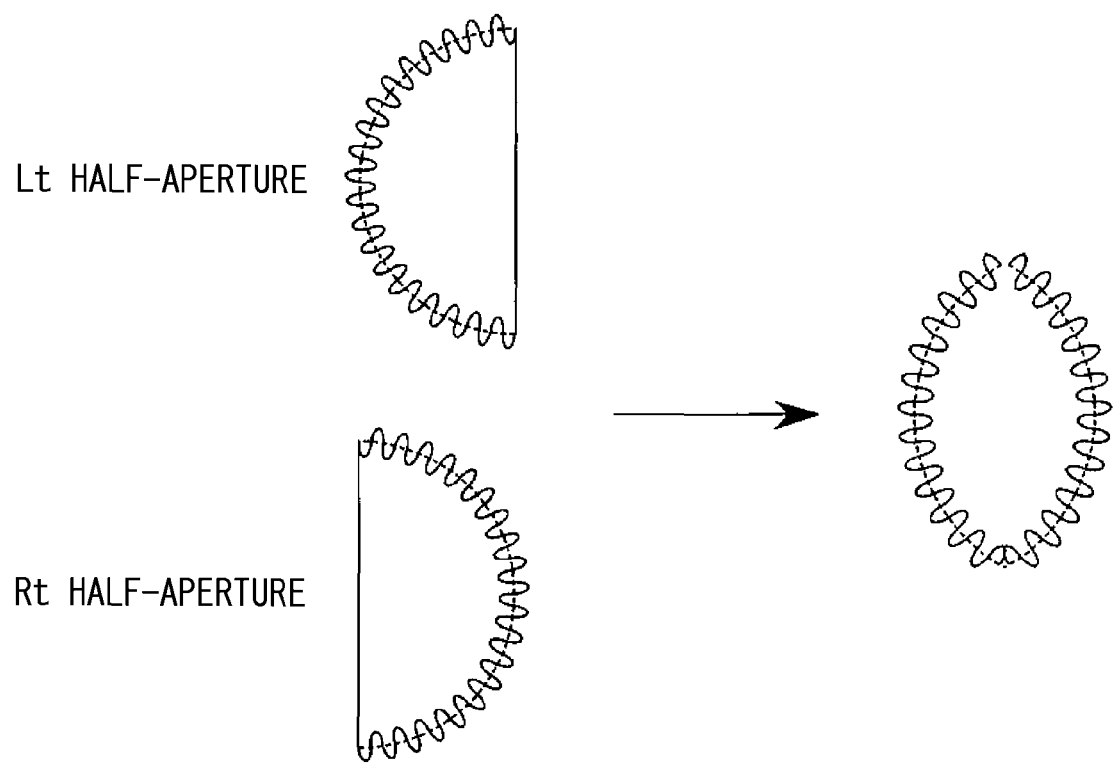
FIG. 9 is a drawing for describing the asymmetry of the blur of the half-aperture parallax pixels.

FIG. 9 is a drawing for describing the asymmetry of the blur of the half-aperture parallax pixel. It is a drawing for describing the asymmetry of the blur. As shown in FIG. 9, for the left parallax pixels, the blur on the arc side of the semicircle is suitably expressed, but the blur on the cut side of the semicircle is not suitably expressed. In other words, the edge is prone to being sharp, and there is little blur. In a similar manner, for the right parallax pixels, the blur on the arc side of the semicircle is suitable expressed, but the blur on the cut side of the semicircle is prone to having a sharp edge and there is little blur. It should be noted that the arcs are at opposite positions for the left parallax pixels and the right parallax pixels. As a result of the above, the double-line blur described above becomes more pronounced. It is preferable to restrict this left-right asymmetry of the blur as possible.

With a digital camera using the single-lens pupil-divided imaging method, in addition to the problem of the asymmetrical blur, there is a problem that the different amounts of shading occur between the left and right parallax images. As described in WO 2012/036019 and Japanese Patent Application Publication No. 2011-223562, a shading in left and right parallax images unique to a single-lens pupil-divided optical system changes extremely depending on a focal distance, a diaphragm value and the like of the optical system. Comparing to a conventional 2D image capturing system, it is preferable to construct a 3D image capturing system so as to make a factor which changes depending on this optical system becomes small as possible. Also, a configuration where the shading itself is difficult to occur is preferable. In the present embodiment, in light of the condition described above, a technique relating a stereoscopic image capturing system is described for decreasing the shading, restricting the changes resulted from optical conditions, suppressing the asymmetry of the blur and capturing a stereoscopic image that appears natural.

The following describes a case where the aperture section of the aperture mask provided in the parallax pixel is greater than half-aperture described above.

(Combined Arrangement of Greater-Than-Half-Aperture Parallax Pixel and Full-Aperture Non-Parallax Pixel)

Here, for describing simply, a parallax pixel having a ⅔ aperture with a width of ⅔ times of a full aperture in the horizontal direction is described as an example. In the parallax pixel having this aperture, the light receiving region receiving the subject luminous flux includes the center of the pixel region and is set at the position shifted relative to the center of the pixel region. Also, supposed is a case where images are captured by a monochromatic imaging sensor with an arrangement configuration in which three types of N pixels, Lt pixels and Rt pixels are mixed, as shown in the embodiment 1 described below. Also, N images, Lt images and Rt images are generated by interpolating the N pixels, the Lt pixels and the Rt pixels respectively to each pixel. Characteristics they have are described sequentially.

(1) Parallax Amount

Figure 10A:
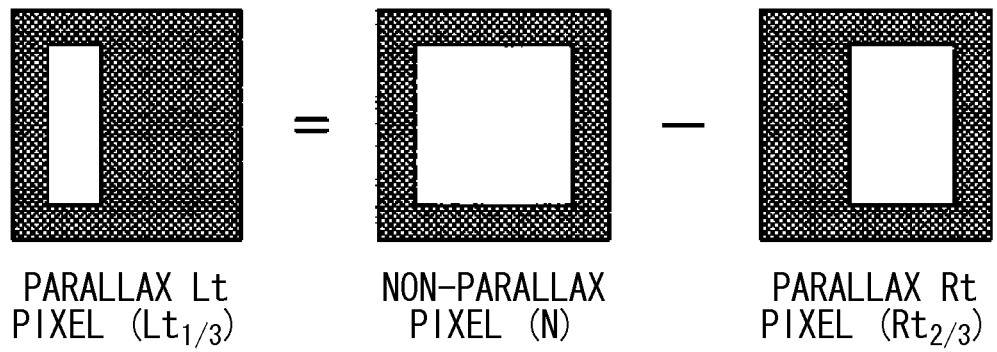
FIG. 10A is a drawing for showing a relationship among the aperture sections of the aperture masks.
Figure 10B:
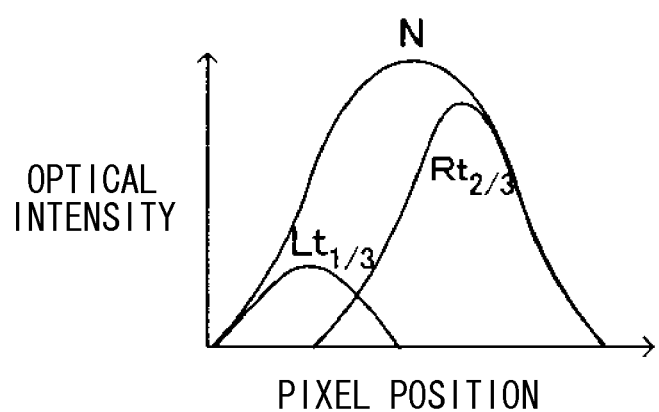
FIG. 10B is a drawing for describing the point spread of FIG. 10A.
Figure 10C:
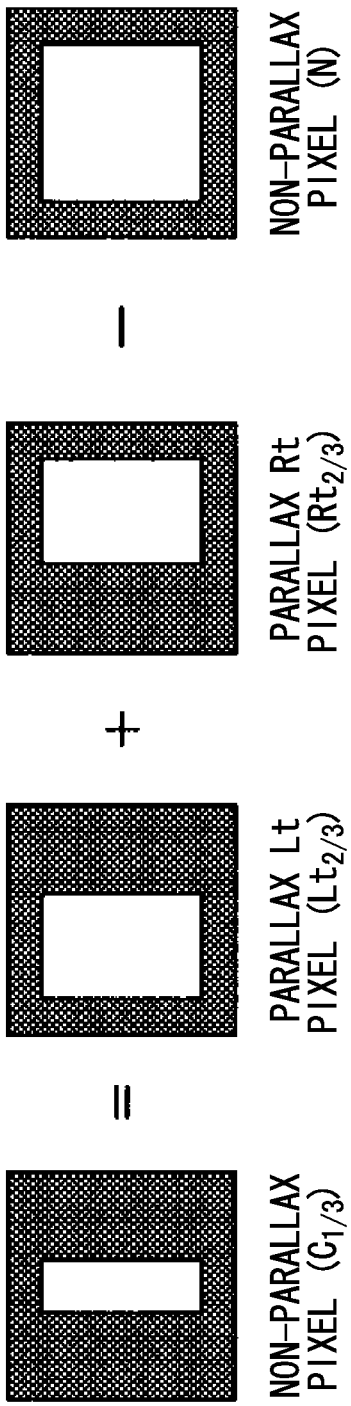
FIG. 10C is a drawing for describing a relationship among the aperture sections of the aperture masks.
Figure 10D:
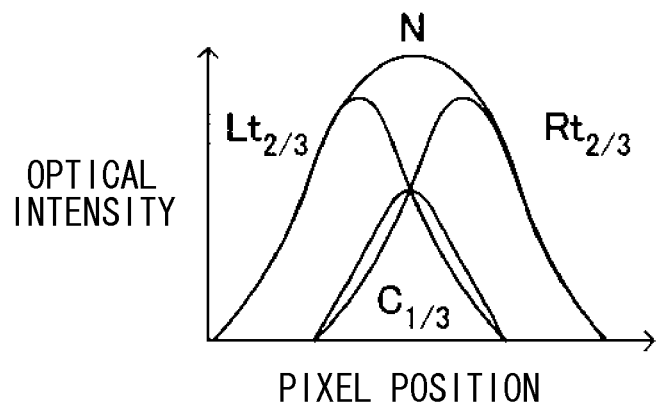
FIG. 10D is a drawing for describing the point spread of FIG. 10B.
Figure 10E:
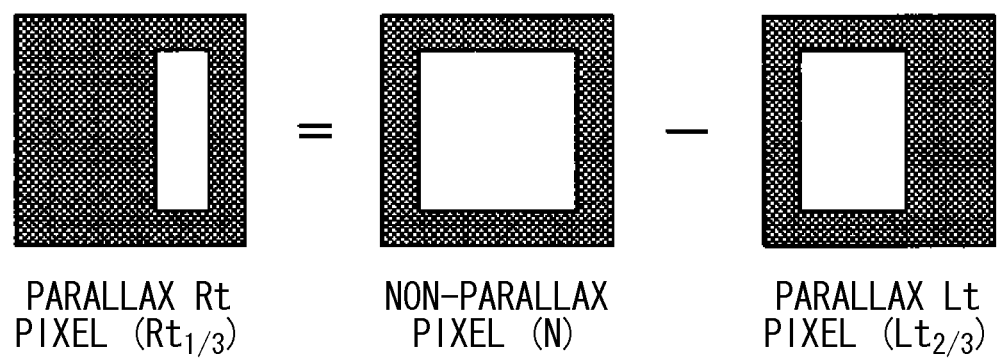
FIG. 10E is a drawing for showing a relationship among the aperture sections of the aperture masks.
Figure 10F:
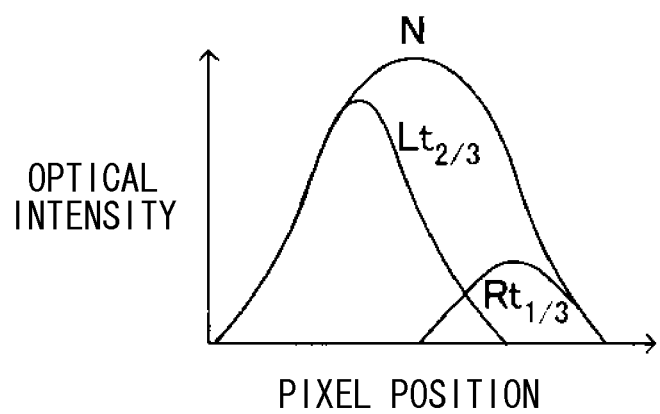
FIG. 10F is a drawing for describing the point spread of FIG. 10C.

FIGS. 10A to 10F are drawings for describing the aperture sections of the aperture masks and the point spreads. By calculation, each of a ⅓-aperture left parallax pixel $Lt_{1/3}$, a ⅓-aperture right parallax pixel $Rt_{1/3}$ and a ⅓-aperture non-parallax pixel $C_{1/3}$ can be produced equivalently from a ⅔-aperture left parallax pixel $Lt_{2/3}$, a ⅔-aperture right parallax pixel $Rt_{2/3}$ and a full-aperture non-parallax pixel N. Specifically, as shown in FIGS. 10A and 10B, the left parallax pixel $Lt_{1/3}$ comprising an aperture in a light shading part of the right parallax pixel $Rt_{2/3}$ can be produced equivalently by subtracting the right parallax pixel $Rt_{2/3}$ from the non-parallax pixel N. As shown in FIGS. 10C and 10D, the non-parallax pixel $C_{1/3}$ can be produced equivalently by adding the left parallax pixel $Lt_{2/3}$ to the right parallax pixel $Rt_{2/3}$ and subtracting the non-parallax pixel N from a result of the addition. As shown in FIGS. 10E and 10F, the ⅓-aperture right parallax pixel Rio comprising an aperture in a light shading part of the ⅔-aperture left parallax pixel $Lt_{2/3}$ can be produced equivalently by subtracting the ⅔-aperture left parallax pixel $Lt_{2/3}$ from the full-aperture non-parallax pixel N. The calculations described above are shown in the expressions as below. Further, the subscripts show information about an aperture width or a blur width.

$$Lt_{1/3}=N-Rt_{2/3} \quad \text{(expression 1)}$$

$$C_{1/3}=Lt_{2/3}+Rt_{2/3}-N \quad \text{(expression 2)}$$

$$Rt_{1/3}=N-Lt_{2/3} \quad \text{(expression 3)}$$

Generally, since the ⅓-aperture left parallax pixel $Lt_{1/3}$ and the ⅓-aperture right parallax pixel $Rt_{1/3}$, which do not capture images of a center part, capture a partial luminous flux of a viewpoint of an edge, parallax information with a great separation degree of parallax can be obtained rather than the ⅔-aperture left parallax pixel $Lt_{2/3}$ and the ⅔-aperture right parallax pixel $Rt_{2/3}$. In other words, parallax information on an outer side can be obtained. A signal component, such as a difference between the left parallax pixel $Lt_{2/3}$ and the right parallax pixel $Rt_{2/3}$, a ratio thereof and the like, generated by calculation, can have actions of leading a ⅓-aperture parallax separation. The difference and the ratio described above are shown in expressions 4 and 5.

$$Lt_{2/3}-Rt_{2/3} \quad \text{(expression 4)}$$

$$Lt_{2/3}/Rt_{2/3} \quad \text{(expression 5)}$$

Figure 11A:
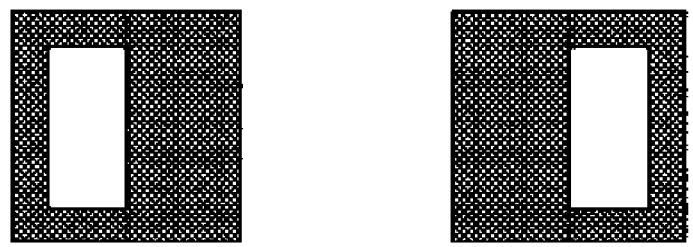
FIG. 11A shows half-aperture parallax pixels.
Figure 11B:
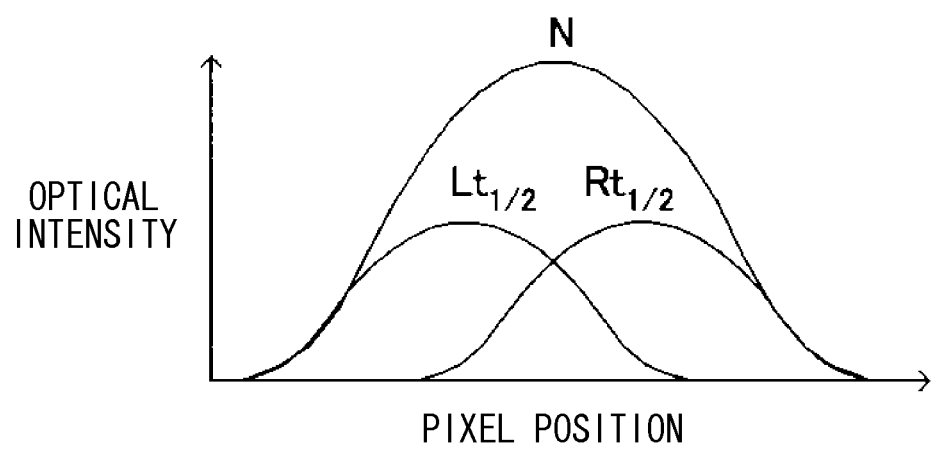
FIG. 11B shows a relationship between the pixel position and the optical intensity of FIG. 11A.
Figure 11C:
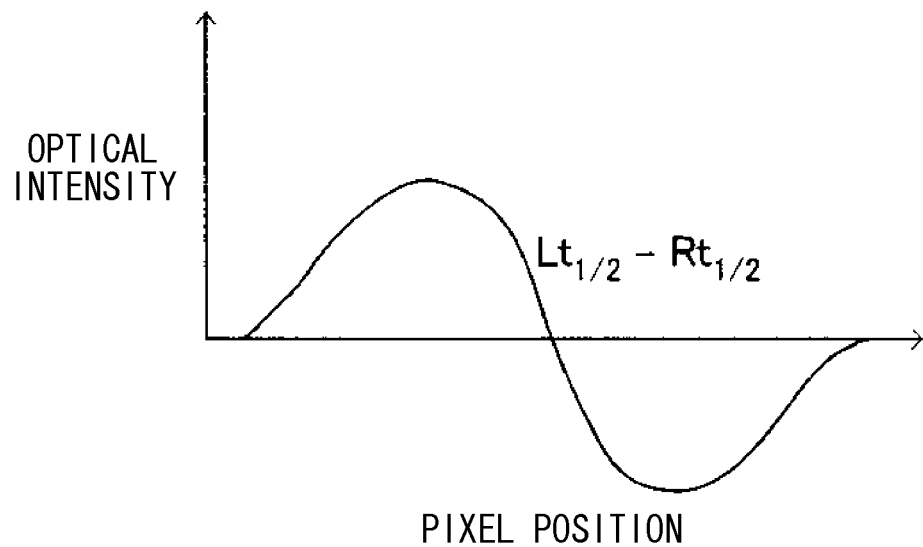
FIG. 11C shows conceptually a difference between the left parallax image and the right parallax image of FIG. 11A.
Figure 11D:
FIG. 11D shows ⅔-aperture parallax pixels.
Figure 11E:
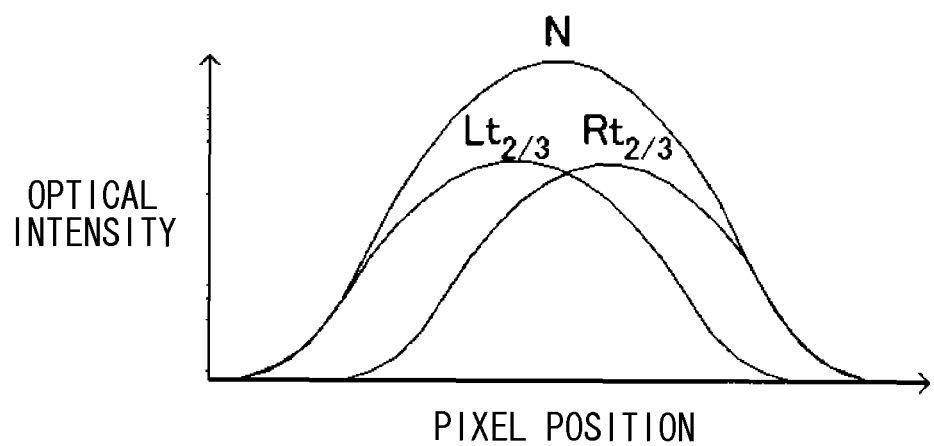
FIG. 11E shows a relationship between the pixel position and the optical intensity of FIG. 11D.
Figure 11F:
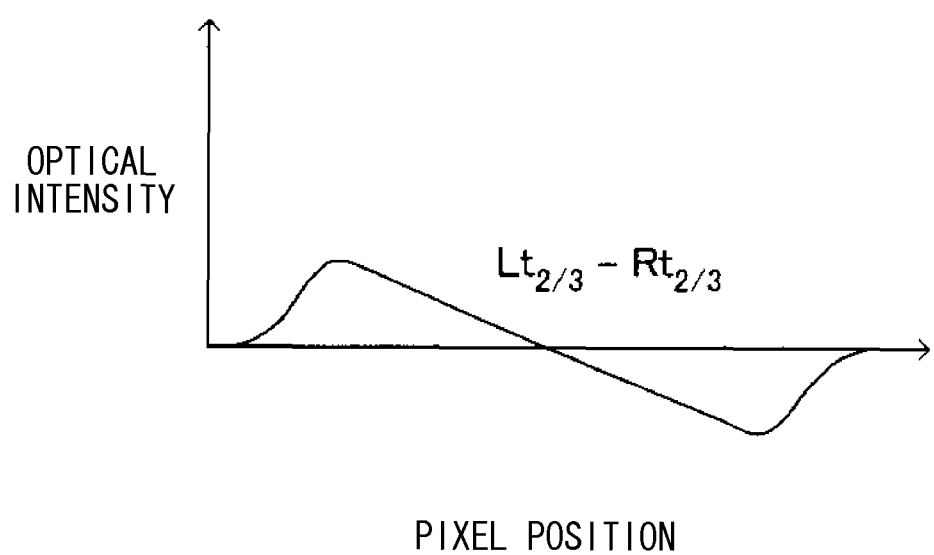
FIG. 11F shows conceptually a difference between the left parallax image and the right parallax image of FIG. 11D.

FIGS. 11A to 11F are drawings for describing the basics of the difference between the left parallax image $Lt_{2/3}$ and the right parallax image $Rt_{2/3}$. It is described comparing to the half-aperture parallax pixel in FIGS. 11A to 11F. FIG. 11A shows the half-aperture parallax pixel. FIG. 11B shows a relationship between the pixel position and the optical intensity, and it is the same as FIG. 6B. FIG. 11C shows a difference between a left parallax image $Lt_{1/2}$ and a right parallax image $Rt_{1/2}$ conceptually. FIG. 11D shows the ⅔-aperture parallax pixel. FIG. 11E shows a relationship between the pixel position and the optical intensity. FIG. 11F shows a difference between the left parallax image $Lt_{2/3}$ and the right parallax image $Rt_{2/3}$ conceptually.

As shown in FIGS. 11C and 11F, the signal difference between the left and right ⅔-aperture parallax pixels is less than the signal difference between the left and right half-aperture parallax pixels. As shown in FIGS. 11B and 11E, this is because that the overlapped part of the imaging signals in the left and right ⅔-aperture parallax pixels are larger than the overlapped part of the imaging signals in the left and right half-aperture parallax pixels, and therefore a signal to be output as a difference signal becomes smaller. A basic thinking of the greater-than-half-aperture parallax pixel, such as the ⅔ aperture, is that an optical characteristic of the imaging signal itself is kept in a state close to a 2D image sensor while following the full-aperture pixel configuration of a 2D image sensor as possible, obtaining the parallax information by shading extremely partial lights only and making the parallax information of the aperture of the shading part equivalently be able to be extracted by calculation.

Figure 12A:
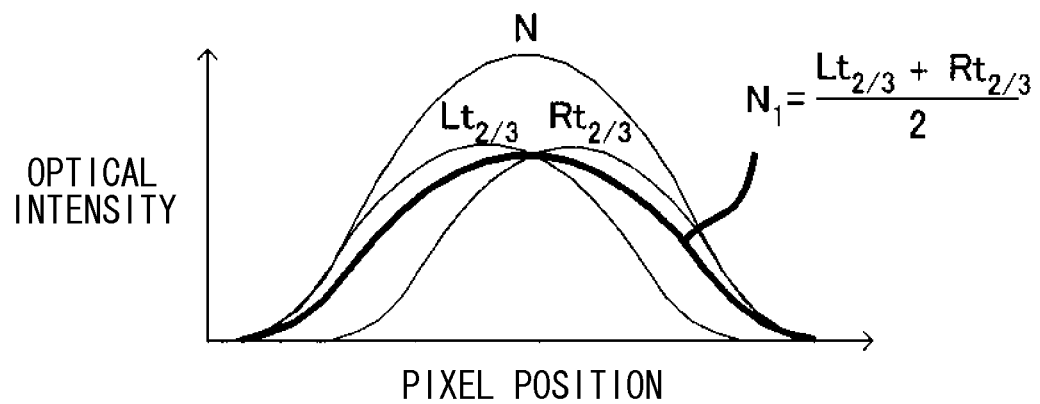
FIG. 12A is a drawing for describing the point spread of a non-parallax image $N_1$ as another derivation example.
Figure 12B:
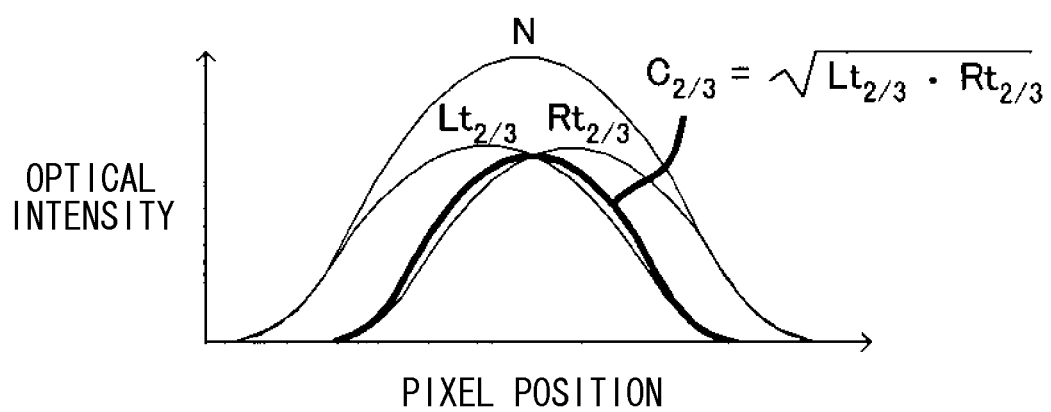
FIG. 12B is a drawing for describing the point spread of a non-parallax image $C_{2/3}$ as another derivation example.

Different parallax information about viewpoint positions and blur widths created by calculation can also be derived by other expressions besides the expressions 1 to 3. FIGS. 12A and 12B are drawings for describing the point spreads of the non-parallax image $N_1$ and the non-parallax image $C_{2/3}$ as another derivation example. As shown in FIG. 12A, the non-parallax image $N_1$ can be obtained by the arithmetic mean of the left parallax image $Lt_{2/3}$ and the right parallax image $Rt_{2/3}$. The arithmetic mean produces a region in which one of two imaging signals has a limited value, that is, a blur width of a region width where OR is applied. Therefore, the non-parallax image $N_1$ can be considered to be approximately similar to the non-parallax image having the full-aperture blur width in the reference viewpoint direction. On the other hand, the non-parallax image $C_{2/3}$ can be obtained by the geometric mean of the left parallax image $Lt_{2/3}$ and the right parallax image $Rt_{2/3}$. The geometric mean produces a region in which both of two imaging signals have limited values, that is, a blur width of a region width where AND is applied. Therefore, the non-parallax image $C_{2/3}$ can be considered to be the non-parallax image having the ⅔-aperture blur width in the reference viewpoint direction. Further, N represents the full-aperture blur width of the non-parallax image and C represents the blur width where the aperture is less than the full aperture. It is shown in expressions 6 and 7 as below.

$$N_1 \approx \frac{Lt_{2/3} + Rt_{2/3}}{2} \quad \text{(expression 6)}$$

$$C_{2/3} = \sqrt{Lt_{2/3} \cdot Rt_{2/3}} \quad \text{(expression 7)}$$

(2) Shading Characteristics

Figure 13A:
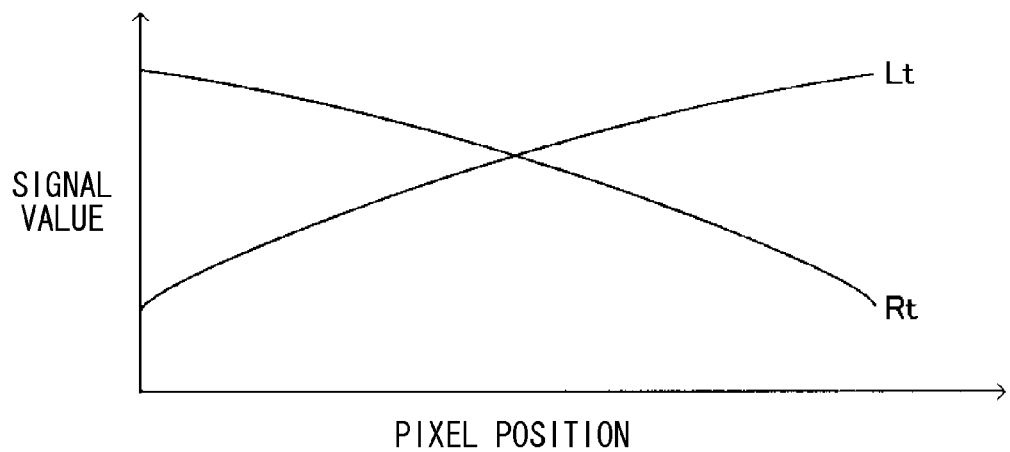
FIG. 13A shows a relationship between a signal value and a pixel position for the half-aperture parallax pixels when causing a shading phenomenon.
Figure 13B:
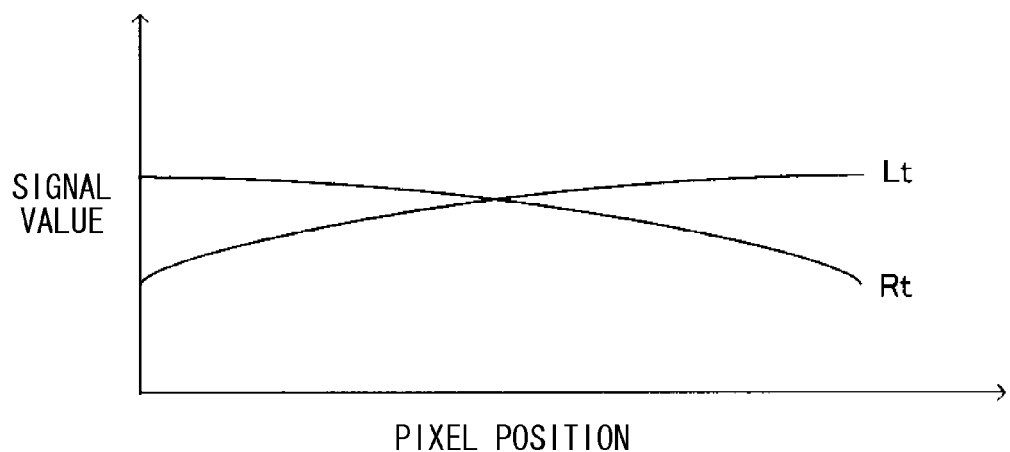
FIG. 13B shows a relationship between a signal value and a pixel position for the ⅔-aperture parallax pixels when causing a shading phenomenon.

FIGS. 13A and 13B are drawings for describing the shading of the parallax pixel. In FIGS. 13A and 13B, the vertical axis indicates the signal value and the horizontal axis indicates the pixel position. FIG. 13A shows a relationship between the signal value and the pixel position for the half-aperture parallax pixel, and FIG. 13B shows a relationship between the signal value and the pixel position for the ⅔-aperture parallax pixel. Generally, in a single-lens pupil-divided imaging method, the shading occurs due to a combination of an optical-system pupil and a micro-lens of an image sensor. Then, the larger the diaphragm value is, the larger an imbalance between the right parallax image and the left parallax image becomes. However, this phenomenon does not occur in a 2D image sensor. Therefore, in the same optical condition, as shown in FIGS. 13A and 13B, the shading in the ⅔-aperture parallax pixel, that is, the shading in the greater-than-half-aperture parallax pixel is smaller than that in the half-aperture parallax pixel, and the changes resulted from optical conditions also become smaller.

(3) Asymmetry of Blur

Figure 14A:
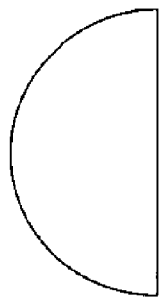
FIG. 14A shows the blur of the half-aperture parallax pixels.
Figure 14A:
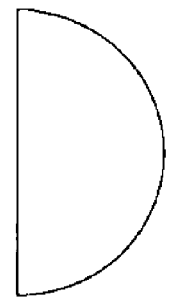
Figure 14B:
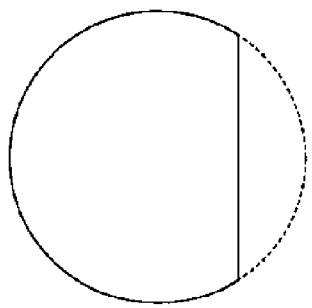
FIG. 14B shows the blur of the greater-than-half-aperture parallax pixels.
Figure 14B:
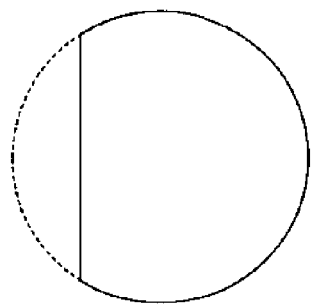

FIGS. 14A and 14B are drawings for describing the shape of the blur of the greater-than-half-aperture parallax pixel. FIG. 14A shows the blur of the half-aperture parallax pixel, and FIG. 14B shows the blur of the greater-than-half-aperture parallax pixel. Since the difference in depth of field from the non-parallax pixel (N pixel) becomes less when the aperture width of the parallax pixel becomes greater, the vertical-horizontal asymmetry of the blur is reduced. Further, as shown in FIGS. 14A and 14B, since only extremely a partial luminous flux of a round shape of the pupil is cut when the aperture width of the parallax pixel becomes greater, the left and right asymmetry of the blur is reduced rather than a case where the parallax pixel is half-aperture. Therefore, a sharpness of one edge can be decreased and a tendency where the double-line blur decreases is shown. As described above, the greater-than-half-aperture parallax pixel has a tendency where the shape of the blur becomes good and is symmetrical in the vertical and horizontal direction and in the left and right as well.

(4) Parallax Modulation and S/N Ratio

In an image sensor shown in the embodiment 1 and the embodiment 2 described below, an arrangement configuration where the parallax pixels are arranged in a lower density than the non-parallax pixels is adopted. This arrangement configuration is a result of optimally distributing the most information to necessary places by using the characteristic unique to the single-lens stereoscopic imaging where the parallax only occurs in a blurred region. A parallax image plane in which only the parallax pixels are simply interpolated becomes an image with a low spatial resolution. The left and right parallax images are used for displacing the non-parallax images with a high spatial resolution. In this way, the parallax image with a high resolution is generated by the parallax modulation. This principle is described in detail in Japanese Patent Application Publication No. 2013-229764 and Japanese Patent Application Publication No. 2012-100476 from the same inventor as the present application. Assuming the half aperture as a premise, the following describes three of the operation expressions described in those applications. An expression for the left parallax image is shown as below.

$$Lt' = N + \frac{Lt - Rt}{2} \quad \text{(expression 8)}$$

$$Lt' = N \cdot \sqrt{\frac{Lt}{Rt}} \quad \text{(expression 9)}$$

$$Lt' = N \cdot \frac{Lt}{\frac{Lt + Rt}{2}} \quad \text{(expression 10)}$$

A calculation of the expression 9 performed with a logarithmic space becomes the same as the expression 8. The expression 8 is usually used with a gamma-converted gradation space. The expressions 9 or 10 are used with a linear gradation space. When the non-parallax pixel is full-aperture, that is, the N pixel, the expression 10 is used, and when the non-parallax pixel has an aperture with an area with the same shape as the parallax pixel, that is, the C pixel, the expression 9 is used.

A case is described below, where the calculations described above are performed for the imaging signal captured by the greater-than-half-aperture parallax pixel, not the imaging signal captured by the half-aperture parallax pixel. For describing simply, a case where a difference calculation of the expression 8 is considered. As described above, the signal difference of the greater-than-half-aperture parallax pixels between the left and right is less than the signal difference of the half-aperture parallax pixels between the left and right. As shown in FIGS. 11A to 11F, this is because that the overlapped part of the imaging signals is large in the left and right greater-than-half-aperture parallax pixels, and therefore the signal to be output as a difference signal becomes small.

However, it is considered that as long as the aperture of the parallax pixel is with a width close to half aperture, for example, in a range from the ½ aperture to the ⅔ aperture, the effect of modulating the N image according to the calculation of the expression 8 is maintained as it is. When the aperture of the parallax pixel is further larger, the intensity amplitude of the difference signal becomes too small, and therefore the parallax modulation effect is weakened. In this case, a parallax amplification modulation as the below expression is performed. Since the imaging parallax itself has parallax information corresponding to a shading section of the parallax pixel, even when the amplification is performed, information relating the viewpoint position of the parallax information can be taken out.

$$Lt' = N + k \cdot \frac{Lt - Rt}{2}$$

-continued $$Lt' = N \cdot \left(\sqrt{\frac{Lt}{Rt}}\right)^k$$

$$Lt' = N \cdot \left(\frac{Lt}{\frac{Lt+Rt}{2}}\right)^k$$

It should be noted that when k is set as k>1, k represents an amplification gain. As a reference of a value of k, calculation examples where the aperture width of the parallax pixel is set as ⅔ and ¾ are described as below. Based on that k=1 when the aperture width is half-aperture (½), the ratios are calculated as below.

When the aperture width is ⅔, k=[(½)/(⅔)]$^{-1}$=4/3=1.33. When the aperture width is ¾, k=[(½)/(¾)]$^{-1}$=3/2=1.5. Composing the N image by multiplying a gain with respect to the signal difference, the noise characteristic of the modulated image after composition becomes bad. This is a phenomenon represented as a competition relationship with respect to the effect of the improvement of the above-described shading characteristic or the improvement of the asymmetry of the blur when widening the aperture width of the parallax pixel. However, when the aperture is widened, since the light amount itself is increased rather than a case with the half aperture, it is considered that a shot noise is decreased in the Lt image and the Rt image, and the amplification effect occurs in a region with a large aperture such as a ¾ aperture and more. Therefore, in the region with the aperture width of the parallax pixel greater than ½ aperture and equal to or less than ⅔ aperture, the effect of the improvement of the shading characteristics and of the asymmetry of the blur can be obtained while keeping the appropriate parallax modulation effect and the S/N ratio.

The following describes a blur width to be transmitted by the parallax modulation. With regard to a case where the non-parallax pixel is configured from a full aperture (the N pixel) and the parallax modulation is performed by calculating the expression 10, a case where the parallax pixel is half-aperture and a case where the parallax pixel is ⅔-aperture are compared. When applying a relational expression of the blur width only to the relational expression of the expression 10, what is output on the left side is the transmitted blur width.

In a case where the parallax pixel is ½-aperture:

(½-aperture blur width)=(full-aperture blur width)× (½-aperture blur width)/(full-aperture blur width)

In a case where the parallax pixel is ⅔-aperture:

(⅔-aperture blur width)=(full-aperture blur width)× (⅔-aperture blur width)/(full-aperture blur width)

Therefore, the blur width of the imaging signal of the parallax pixel is transmitted almost as it is to the high-resolution parallax image after the parallax modulation. This matches the above-described (3) "asymmetry of blur".

When displaying the left parallax image and the right parallax image overlapping, since it is preferable to have a similar signal distribution to the non-parallax image captured by the full aperture as a whole while the blur of the same subject has an overlap appropriately such that the region of the left parallax image and the region of the right parallax image are not switched abruptly, it is considered that the aperture width that should be adopted for the parallax pixel is about from ½ to ⅔, for example, ⅗-aperture, 4/7-aperture or ⅝-aperture and the like, as one best mode.

Further, even when widening the aperture of each parallax pixel in the image sensor where only the left and right parallax pixels are arranged, since a process (of having a positive signal value) more than the imaging signal cannot be performed, it is not able to convert to small-aperture parallax information. In other words, new parallax information is not generated from two parallaxes. In the present embodiment, the image sensor where the non-parallax pixel is arranged in addition to the left and right parallax pixels, and new parallax information can be produced from three parallaxes.

Embodiment 1

Figure 15:
FIG. 15 shows an exemplary arrangement of the pixel arrangement in real space and k space.
Figure 15:
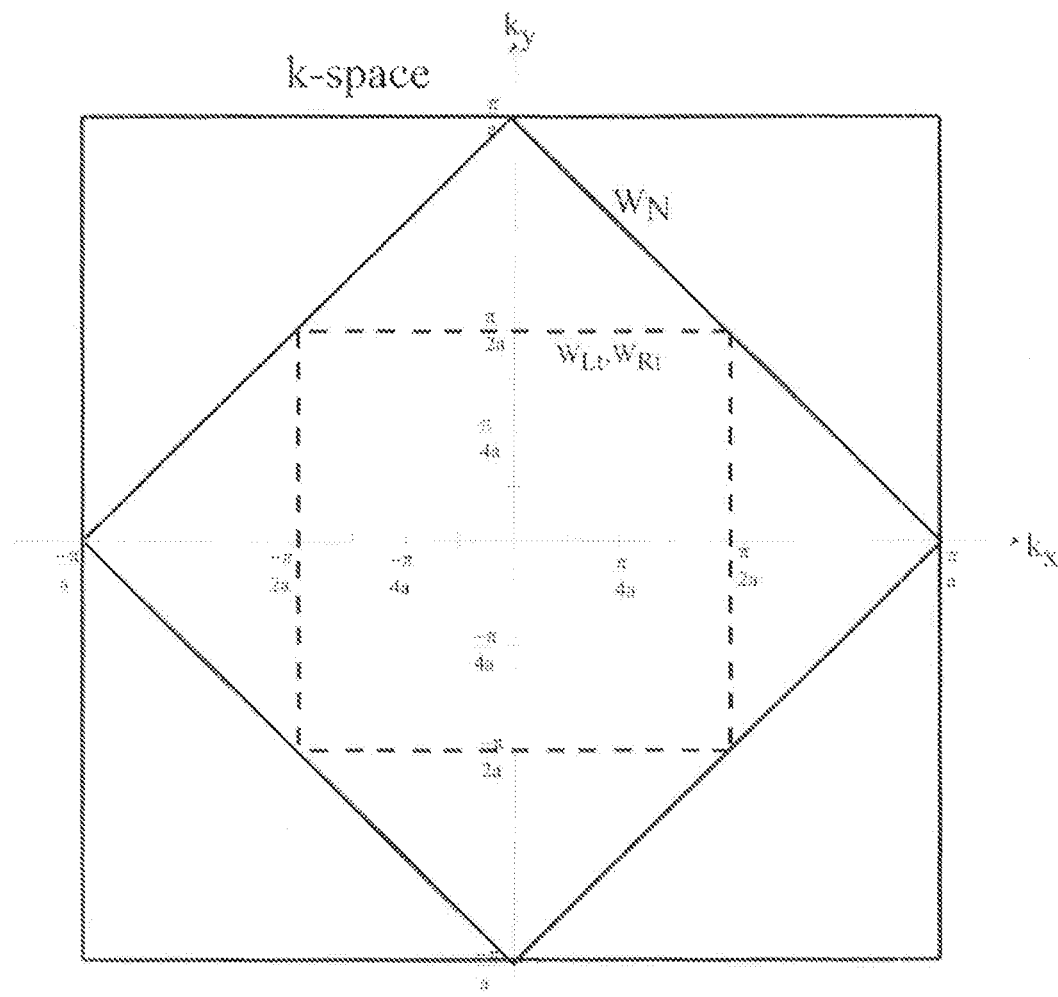

The following describes an exemplary monochromatic and sparse parallax pixel arrangement. FIG. 15 shows an exemplary arrangement of the pixel arrangement in real space and k space. An example using image sensors arranged periodically is shown, and the arrangement graph in the upper part of FIG. 15 is a primitive lattice. A frequency resolution region of the reciprocal lattice space is also shown with regard to a combination of each color and each parallax. This arrangement has a characteristic where a parallax only occurs in a blurred subject region in a single-lens pupil-divided method, and the monochromatic image sensor is configured of arranging parallax pixels in a sparse density and of allocating non-parallax pixels as the rest of pixels as possible. The density ratio of the non-parallax pixels, the parallax Lt pixels and the parallax Rt pixels is N:Lt:Rt=2: 1:1. Also, in FIG. 15, the ⅔ aperture is shown as the aperture width of the parallax pixel. The steps of this process are as shown below.

1) Input of the parallax multiplexed mosaic image data
2) Global gain balance correction of parallax mosaic image
3) Generation of tentative parallax image
4) Generation of non-parallax reference image by left-right local luminance distribution correction (local gain balance correction)
5) Generation of actual parallax image
6) Conversion to output space The following describes these steps in detail.

1) Input of the Parallax Multiplexed Mosaic Image Data

A single-plate monochromatic mosaic image with a multiplexed parallax of FIG. 15 is represented as M(x, y). The gradation is a linear gradation output by the A/D conversion.

2) Global Gain Balance Correction of the Color and Parallax Mosaic Image.

The captured subject image is used as-is to calculate the average value $N_{mosaic}$ for the entire image of the non-parallax pixels, the average value $Lt_{mosaic}$ for the entire image of the pixel values of the left parallax pixels, and the average value $Rt_{mosaic}$ for the entire image of the pixel values of the right parallax pixel. In contrast to the first embodiment, there are three signal levels. First, the gain correction is performed to match the signal levels to the average values, with a reference point between the left and right. At this time, there are two methods for obtaining the reference point, which are a method using the arithmetic mean and a method using the geometric mean. After this, the geometric mean between the signal level averaged from the left and right and the signal level of the non-parallax pixels is calculated, and the gain correction is performed to match the signal levels to this average value.

For convenience, in the mosaic image M(x, y), the signal plane of the non-parallax pixel is represented as $N_{mosaic}(x, y)$, the signal plane of the left parallax pixel is represented as $Lt_{mosaic}(x,y)$ and the signal plane of the right parallax pixel is represented as $Rt_{mosaic}(x,y)$ a) When Using the Arithmetic Mean of the Left and Right Average values $$\overline{m} = \sqrt{\overline{N} \cdot \frac{\overline{Lt} + \overline{Rt}}{2}}$$

Gain values for the non-parallax pixels $$\overline{g}_N = \frac{\overline{m}}{\overline{N}} = \sqrt{\overline{N} \cdot \frac{\overline{Lt} + \overline{Rt}}{2\overline{N}}}$$

Gain values for the left parallax pixels $$\overline{g}_{Lt} = \frac{\overline{m}}{\overline{Lt}} = \sqrt{\frac{\overline{N}}{\overline{Lt}} \cdot \frac{\overline{Lt} + \overline{Rt}}{2\overline{Lt}}}$$

Gain values for the right parallax pixels $$\overline{g}_{Rt} = \frac{\overline{m}}{\overline{Rt}} = \sqrt{\frac{\overline{N}}{\overline{Rt}} \cdot \frac{\overline{Lt} + \overline{Rt}}{2\overline{Rt}}}$$

Global gain correction for the non-parallax pixels $$N'_{mosaic}(x, y) = N_{mosaic}(x, y) \cdot \overline{g}_N = N_{mosaic}(x, y) \cdot \sqrt{\frac{\overline{Lt} + \overline{Rt}}{2\overline{N}}}$$

Global gain correction for the left parallax pixels $$Lt'_{mosaic}(x, y) = Lt_{mosaic}(x, y) \cdot \overline{g}_{Lt} = Lt_{mosaic}(x, y) \cdot \sqrt{\frac{\overline{N}}{\overline{Lt}} \cdot \frac{\overline{Lt} + \overline{Rt}}{2\overline{Lt}}}$$

Global gain correction for the right parallax pixels $$Rt'_{mosaic}(x, y) = Rt_{mosaic}(x, y) \cdot \overline{g}_{Rt} = Rt_{mosaic}(x, y) \cdot \sqrt{\frac{\overline{N}}{\overline{Rt}} \cdot \frac{\overline{Lt} + \overline{Rt}}{2\overline{Rt}}}$$

b) When Using the Geometric Mean of the Left and Right Average values $$\overline{m} = \sqrt[4]{\overline{N} \cdot \sqrt{\overline{Lt} \cdot \overline{Rt}}}$$

Gain values for the non-parallax pixels $$\overline{g}_N = \frac{\overline{m}}{\overline{N}} = \sqrt{\frac{\sqrt{\overline{Lt} \cdot \overline{Rt}}}{\overline{N}}}$$

Gain values for the left parallax pixels $$\overline{g}_{Lt} = \frac{\overline{m}}{\overline{Lt}} = \sqrt{\frac{\overline{N}}{\overline{Lt}} \cdot \sqrt{\frac{\overline{Rt}}{\overline{Lt}}}}$$

Gain values for the right parallax pixels $$\overline{g}_{Rt} = \frac{\overline{m}}{\overline{Rt}} = \sqrt{\frac{\overline{N}}{\overline{Rt}} \cdot \sqrt{\frac{\overline{Lt}}{\overline{Rt}}}}$$

Global gain correction for the non-parallax pixels $$N'_{mosaic}(x, y) = N_{mosaic}(x, y) \cdot \overline{g}_N = N_{mosaic}(x, y) \cdot \sqrt{\frac{\sqrt{\overline{Lt} \cdot \overline{Rt}}}{\overline{N}}}$$

Global gain correction for the left parallax pixels $$Lt'_{mosaic}(x, y) = Lt_{mosaic}(x, y) \cdot \overline{g}_{Lt} = Lt_{mosaic}(x, y) \cdot \sqrt{\frac{\overline{N}}{\overline{Lt}} \cdot \sqrt{\frac{\overline{Rt}}{\overline{Lt}}}}$$

Global gain correction for the right parallax pixels $$Rt'_{mosaic}(x, y) = Rt_{mosaic}(x, y) \cdot \overline{g}_{Rt} = Rt_{mosaic}(x, y) \cdot \sqrt{\frac{\overline{N}}{\overline{Rt}} \cdot \sqrt{\frac{\overline{Lt}}{\overline{Rt}}}}$$

When all of the non-parallax pixels have full-aperture masks, the method using the arithmetic mean is adopted. When all of the non-parallax pixels have half-aperture masks, the method using the geometric mean is adopted. Therefore, the method using the arithmetic mean is adopted in the present embodiment. In this way, a mosaic image in which the non-parallax pixels are corrected using one gain coefficient, the left parallax pixels are corrected using one gain coefficient and the right parallax pixels are corrected by one gain coefficient is output as M'(x,y).

3) Generation of a Tentative Parallax Image

A tentative left parallax image and a tentative right parallax image with a low spatial frequency resolution are generated. Specifically, a simple average interpolation in the signal plane in which the left parallax pixels only are gathered is performed. A linear interpolation in accordance with a ratio of distance is performed by using pixel values present adjacently. In the same manner, a simple average interpolation in the signal plane in which the right parallax pixels only are gathered is performed. In the same manner, a simple average interpolation in the signal plane in which the non-parallax pixels are gathered is performed. In other words, Lt(x,y) is created from $Lt_{mosaic}(x,y)$, Rt(x,y) is created from $Rt_{mosaic}(x,y)$ and N(x,y) is created from $N_{mosaic}(x,y)$. The tentative non-parallax image is represented as N(x,y), the tentative left parallax image is represented as Lt(x,y) and the tentative right parallax image is represented as Rt(x,y). Further, when generating the tentative non-parallax image N(x,y), it may introduce a direction determination in the signal plane and perform with a high definition.

4) Generation of Non-Parallax Reference Image by Left and Right Luminance Distribution Correction (Local Gain Balance Correction)

Next, based on the same thinking as used for global gain correction performed in step 2, the luminance of the left parallax pixel in the screen and the luminance of the right parallax pixel in the screen are made to match at first by performing a local gain correction by pixel units. The parallax between the left and right is eliminated according to this manipulation. After this, the luminance is further made to match between the signal planes that have been averaged for the left and right and the imaging signal plane of the non-parallax image. Thereby, a new non-parallax reference image plane is created in which all of the pixels have matched gain. This is equivalent to a replacement with an average value and an intermediate image plane is produced in which the parallax is eliminated. This is represented as N(x,y).

a) When Using the Arithmetic Mean of the Left and Right Average values for each pixel $$m(x, y) = \sqrt{N(x, y) \cdot \frac{Lt(x, y) + Rt(x, y)}{2}}$$

Gain values for each non-parallax pixel $$g_N(x, y) = \frac{m(x, y)}{N(x, y)} = \sqrt{\frac{Lt(x, y) + Rt(x, y)}{2N(x, y)}}$$

Gain values for each left parallax pixel $$g_{Lt}(x, y) = \frac{m(x, y)}{Lt(x, y)} = \sqrt{\frac{N(x, y)}{Lt(x, y)} \cdot \frac{Lt(x, y) + Rt(x, y)}{2Lt(x, y)}}$$

Gain values for each right parallax pixel $$g_{Rt}(x, y) = \frac{m(x, y)}{Rt(x, y)} = \sqrt{\frac{N(x, y)}{Rt(x, y)} \cdot \frac{Lt(x, y) + Rt(x, y)}{2Rt(x, y)}}$$

Local gain correction for each non-parallax pixel $N(x,y) \cdot g_N(x,y) = m(x,y)$ Local gain correction for each left parallax pixel $Lt(x,y) \cdot g_{Lt}(x,y) = m(x,y)$ Local gain correction for each right parallax pixel $Rt(x,y) \cdot g_{Rt}(x,y) = m(x,y)$ b) When Using the Geometric Mean of the Left and Right Average values for each pixel $m(x,y) = \sqrt{N(x,y) \cdot \sqrt{Lt(x,y) \cdot Rt(x,y)}}$ Gain values for each non-parallax pixel $$g_N(x, y) = \frac{m(x, y)}{N(x, y)} = \sqrt{\frac{\sqrt{Lt(x, y) \cdot Rt(x, y)}}{N(x, y)}}$$

Gain values for each left parallax pixel $$g_{Lt}(x, y) = \frac{m(x, y)}{Lt(x, y)} = \sqrt{\frac{N(x, y)}{Lt(x, y)} \cdot \sqrt{\frac{Rt(x, y)}{Lt(x, y)}}}$$

Gain values for each right parallax pixel $$g_{Rt}(x, y) = \frac{m(x, y)}{Rt(x, y)} = \sqrt{\frac{N(x, y)}{Rt(x, y)} \cdot \sqrt{\frac{Lt(x, y)}{Rt(x, y)}}}$$

Local gain correction for each non-parallax pixel $N(x,y) \cdot g_N(x,y) = m(x,y)$ Local gain correction for each left parallax pixel $Lt(x,y) \cdot g_{Lt}(x,y) = m(x,y)$ Local gain correction for each right parallax pixel $Rt(x,y) \cdot g_{Rt}(x,y) = m(x,y)$ In this way, the data of monochromatic plane is overwritten with the pixel value obtained by further averaging the average value of the left viewpoint image and the right viewpoint image and the non-parallax image of the reference viewpoint, as a new non-parallax pixel value, and the image N(x,y) of the non-parallax monochromatic plane is output.

5) Generation of Actual Parallax Image

A high-resolution left parallax monochromatic image Lt'(x,y) output actually is generated by using the low-resolution tentative left parallax image Lt(x,y) generated in step 3 and the high-resolution non-parallax monochromatic image N(x,y) generated in step 4 as an intermediate process. Similarly, a high-resolution right parallax monochromatic image Rt'(x,y) to be output actually is generated by using the low-resolution tentative right parallax image Rt(x,y) generated in step 3 and the high-resolution non-parallax monochromatic image N(x,y) generated in step 4 as an intermediate process.

There are two methods considered as methods for the parallax modulation, which are a method using the arithmetic mean as the reference point and a method using the geometric mean as the reference point. Any one of the methods can obtain the parallax modulation effect, but the method using the arithmetic mean as the reference point is adopted when the aperture mask of the non-parallax pixel of the image sensor is full-aperture, and the method using the geometric mean as the reference point is adopted when the aperture mask of the non-parallax pixel is half-aperture in the same manner as the parallax pixel. Therefore, the method using the arithmetic mean as the reference point is adopted in the present embodiment.

a) Parallax modulation with the arithmetic mean as the reference point

Left parallax modulation $$Lt'(x, y) = N(x, y) \left( \frac{2Lt(x, y)}{Lt(x, y) + Rt(x, y)} \right)^k$$

Right parallax modulation $$Rt'(x, y) = N(x, y) \left( \frac{2Rt(x, y)}{Lt(x, y) + Rt(x, y)} \right)^k$$

b) Parallax Modulation with the Geometric Mean as the Reference Point

Left parallax modulation $$Lt'(x, y) = N(x, y)\left(\frac{Lt(x, y)}{\sqrt{Lt(x, y) \cdot Rt(x, y)}}\right)^k = N(x, y)\left(\sqrt{\frac{Lt(x, y)}{Rt(x, y)}}\right)^k$$

Right parallax modulation $$Rt'(x, y) = N(x, y)\left(\frac{Rt(x, y)}{\sqrt{Lt(x, y) \cdot Rt(x, y)}}\right)^k = N(x, y)\left(\sqrt{\frac{Rt(x, y)}{Lt(x, y)}}\right)^k$$

6) Conversion to Output Color Space

Each of the high-resolution non-parallax intermediate monochromatic image N(x,y), the high-resolution left parallax monochromatic image Lt'(x,y) and the high-resolution right parallax monochromatic image Rt'(x,y) obtained in this way are output by performing an appropriate gamma conversion as an image of the output space.

Further, the expression as below may be used as the parallax modulation in the embodiment 1.

Left parallax modulation $$Lt'(x, y) = N(x, y) + k \cdot \left(\frac{Lt(x, y) - Rt(x, y)}{2}\right)$$

Right parallax modulation $$Rt'(x, y) = N(x, y) + k \cdot \left(\frac{Rt(x, y) - Lt(x, y)}{2}\right)$$

Embodiment 2

Figure 16:
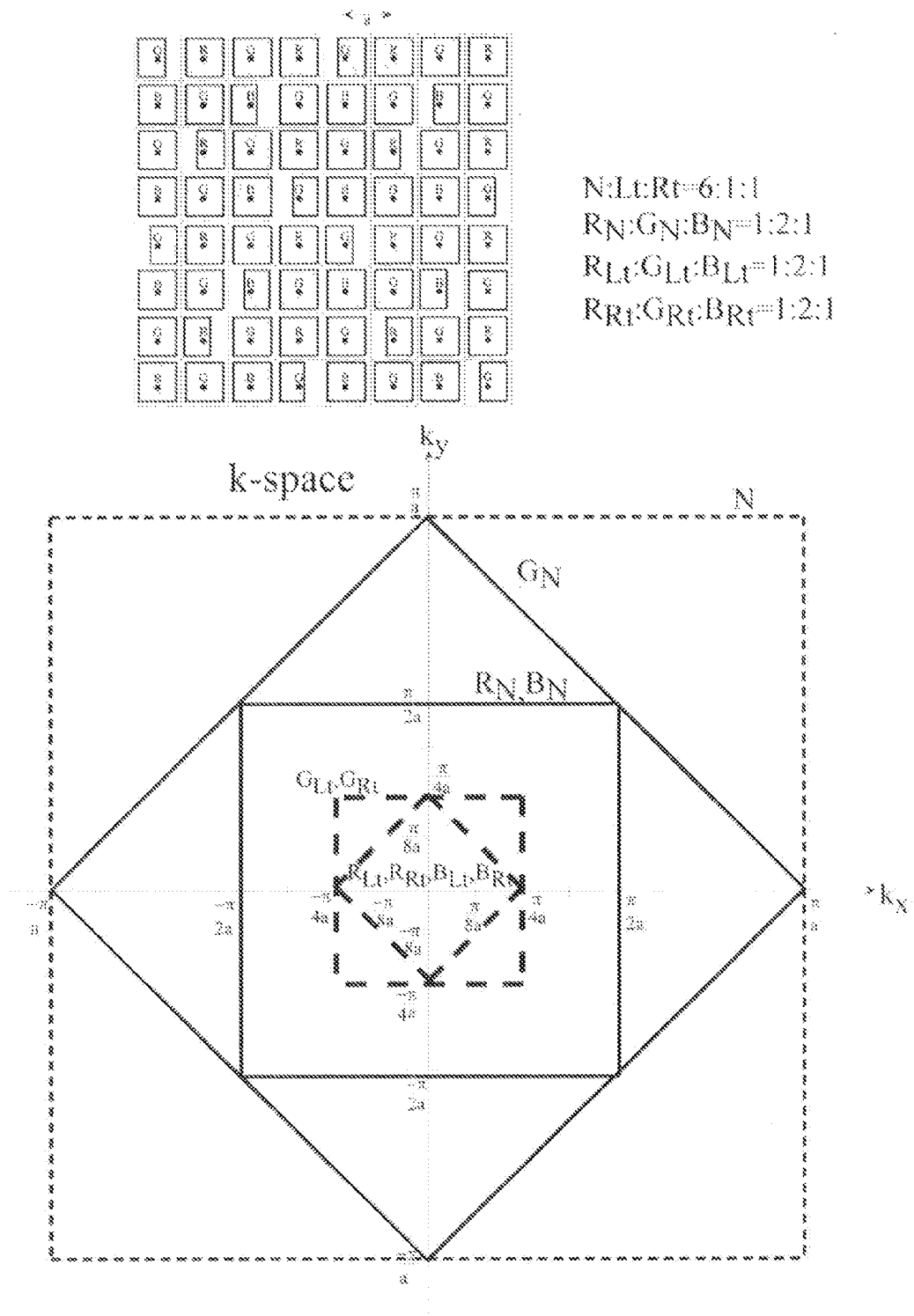
FIG. 16 shows an exemplary arrangement of a pixel arrangement in real space and k space.

A specific example is described using a parallax pixel arrangement that is a sparse Bayer RGB arrangement. FIG. 16 shows an exemplary arrangement of the pixel arrangement in real space and k-space. In this example, the arrangement in the upper portion of FIG. 16 is a primitive lattice in which image sensors are arranged periodically. The frequency resolution region in a reciprocal lattice space is also shown together with each color and each parallax. In this arrangement, each image sensor achieves a quality that a parallax only occurs in subject regions with blur of the single-lens pupil-divided method, and has a structure in which the parallax pixels are arranged with low density and as many of the remaining pixels as possible are allocated as non-parallax pixels. The non-parallax pixels and the parallax pixels both have a Bayer formation as their basic structure, and the color filters are arranged such that the right parallax pixels and the left parallax pixels both have an R:G:B ratio of 1:2:1. In other words, by placing importance on the resolution power of the intermediate non-parallax images captured with primary signals further than the embodiment 1 and performing parallax modulation on the high-frequency component thereof, it is possible to obtain a high-resolution stereoscopic image as a result of the superposition of the left parallax pixels and the right parallax pixels. A density ratio of the non-parallax pixels, the parallax Lt pixels and the parallax Rt pixels are N:Lt:Rt=6:1:1. Also, FIG. 16 shows ⅔-aperture as the aperture width of the parallax pixels. The steps of this process are as shown below in detail.

1) Input of the color and parallax multiplexed mosaic image data
2) Global gain balance correction of the color and parallax mosaic image
3) Generation of the tentative parallax images
4) Generation of the non-parallax color mosaic image resulting from the left and right localized luminance distribution correction (local gain balance correction)
5) Generation of the non-parallax reference image
6) Generation of the actual parallax images
7) Conversion to output color space The following describes these steps in detail.

1) Input of the Color and Parallax Multiplexed Mosaic Image Data

The single-plate mosaic image obtained by multiplexing the color and parallax of FIG. 16 is represented as M(x, y). The gradation is the linear gradation output as a result of an A/D conversion.

2) Global Gain Balance Correction of the Color and Parallax Mosaic Image.

The captured subject image is used as-is to calculate the average value $N_{mosaic}$ for the entire image of the pixel values of the non-parallax pixels, the average value $Lt_{mosaic}$ for the entire image of the pixel values of the left parallax pixels, and the average value $Rt_{mosaic}$ for the entire image of the pixel values of the right parallax pixel. In contrast to the embodiment 1, there are three signal levels. First, the gain correction is performed to match the signal levels to the average values; with a reference point between the left and right. At this time, there are two methods for obtaining the reference point, which are a method using the arithmetic mean and a method using the geometric mean. After this, the geometric mean between the signal level averaged from the left and right and the signal level of the non-parallax pixels is calculated, and the gain correction is performed to match the signal levels to this average value. Next, this process is performed for each of the RGB color components.

The corresponding average values are as shown below.

$\overline{R}_N, \overline{R}_{Lt}, \overline{R}_{Rt},$
$\overline{G}_N, \overline{G}_{Lt}, \overline{G}_{Rt},$
$\overline{B}_N, \overline{B}_{Lt}, \overline{B}_{Rt},$ For convenience, in the mosaic image M(x,y), a signal plane of the non-parallax pixel having the R component is represented as $R_{N\_mosaic}(x,y)$, the signal plane of the left parallax pixel having the R component is represented as $R_{N\_mosaic}(x,y)$, the signal plane of the right parallax pixel having the R component is represented as $R_{Rt\_mosaic}(x,y)$, the signal plane of the non-parallax pixel having the G component is represented as $G_{N\_mosaic}(x,y)$, the signal plane of the left parallax pixel having the G component is represented $G_{Lt\_mosaic}(x,y)$, the signal plane of the right parallax pixel having the G component is represented as $G_{Rt\_mosaic}(x,y)$, the signal plane of the non-parallax pixel having the B component is represented as $B_{N\_mosaic}(x,y)$, the signal plane of the left parallax pixel having the B component is represented as $B_{Lt\_mosaic}(x,y)$ and the signal plane of the right parallax pixel having the B component is represented as $B_{Rt\_mosaic}(x,y)$.

a) When Using the Arithmetic Mean of the Left and Right Average values $$\overline{m}_R = \sqrt{\overline{R}_N \cdot \frac{\overline{R}_{Lt} + \overline{R}_{Rt}}{2}}$$

-continued $$\overline{m}_G = \sqrt{\overline{G}_N \cdot \frac{\overline{G}_{Lt} + \overline{G}_{Rt}}{2}}$$

$$\overline{m}_B = \sqrt{\overline{B}_N \cdot \frac{\overline{B}_{Lt} + \overline{B}_{Rt}}{2}}$$

Gain values for the non-parallax pixels $$\overline{g}_{R_N} = \frac{\overline{m}_R}{\overline{R}_N} = \sqrt{\frac{\overline{R}_{Lt} + \overline{R}_{Rt}}{2\overline{R}_N}}$$

$$\overline{g}_{G_N} = \frac{\overline{m}_G}{\overline{G}_N} = \sqrt{\frac{\overline{G}_{Lt} + \overline{G}_{Rt}}{2\overline{G}_N}}$$

$$\overline{g}_{B_N} = \frac{\overline{m}_B}{\overline{B}_N} = \sqrt{\frac{\overline{B}_{Lt} + \overline{B}_{Rt}}{2\overline{B}_N}}$$

Gain values for the left parallax pixels $$\overline{g}_{R_{Lt}} = \frac{\overline{m}_R}{\overline{R}_{Lt}} = \sqrt{\frac{\overline{R}_N}{\overline{R}_{Lt}} \cdot \frac{\overline{R}_{Lt} + \overline{R}_{Rt}}{2\overline{R}_{Lt}}}$$

$$\overline{g}_{G_{Lt}} = \frac{\overline{m}_G}{\overline{G}_{Lt}} = \sqrt{\frac{\overline{G}_N}{\overline{G}_{Lt}} \cdot \frac{\overline{G}_{Lt} + \overline{G}_{Rt}}{2\overline{G}_{Lt}}}$$

$$\overline{g}_{B_{Lt}} = \frac{\overline{m}_B}{\overline{B}_{Lt}} = \sqrt{\frac{\overline{B}_N}{\overline{B}_{Lt}} \cdot \frac{\overline{B}_{Lt} + \overline{B}_{Rt}}{2\overline{B}_{Lt}}}$$

Gain values for the right parallax pixels $$\overline{g}_{R_{Rt}} = \frac{\overline{m}_R}{\overline{R}_{Rt}} = \sqrt{\frac{\overline{R}_N}{\overline{R}_{Rt}} \cdot \frac{\overline{R}_{Lt} + \overline{R}_{Rt}}{2\overline{R}_{Rt}}}$$

$$\overline{g}_{G_{Rt}} = \frac{\overline{m}_G}{\overline{G}_{Rt}} = \sqrt{\frac{\overline{G}_N}{\overline{G}_{Rt}} \cdot \frac{\overline{G}_{Lt} + \overline{G}_{Rt}}{2\overline{G}_{Rt}}}$$

$$\overline{g}_{B_{Rt}} = \frac{\overline{m}_B}{\overline{B}_{Rt}} = \sqrt{\frac{\overline{B}_N}{\overline{B}_{Rt}} \cdot \frac{\overline{B}_{Lt} + \overline{B}_{Rt}}{2\overline{B}_{Rt}}}$$

Global gain correction for the non-parallax pixels $$R'_{N\_mosaic}(x,y) = R_{N\_mosaic}(x,y) \cdot \overline{g}_{R_N} = R_{N\_mosaic}(x,y) \cdot \sqrt{\frac{\overline{R}_{Lt} + \overline{R}_{Rt}}{2\overline{R}_N}}$$

$$G'_{N\_mosaic}(x,y) = G_{N\_mosaic}(x,y) \cdot \overline{g}_{G_N} = G_{N\_mosaic}(x,y) \cdot \sqrt{\frac{\overline{G}_{Lt} + \overline{G}_{Rt}}{2\overline{G}_N}}$$

$$B'_{N\_mosaic}(x,y) = B_{N\_mosaic}(x,y) \cdot \overline{g}_{B_N} = B_{N\_mosaic}(x,y) \cdot \sqrt{\frac{\overline{B}_{Lt} + \overline{B}_{Rt}}{2\overline{B}_N}}$$

Global gain correction for the left parallax pixels $$R'_{Lt\_mosaic}(x,y) = R_{Lt\_mosaic}(x,y) \cdot \overline{g}_{R_{Lt}} = R_{Lt\_mosaic}(x,y) \cdot \sqrt{\frac{\overline{R}_N}{\overline{R}_{Lt}} \cdot \frac{\overline{R}_{Lt} + \overline{R}_{Rt}}{2\overline{R}_{Lt}}}$$

$$G'_{Lt\_mosaic}(x,y) = G_{Lt\_mosaic}(x,y) \cdot \overline{g}_{G_{Lt}} = G_{Lt\_mosaic}(x,y) \cdot \sqrt{\frac{\overline{G}_N}{\overline{G}_{Lt}} \cdot \frac{\overline{G}_{Lt} + \overline{G}_{Rt}}{2\overline{G}_{Lt}}}$$

$$B'_{Lt\_mosaic}(x,y) = B_{Lt\_mosaic}(x,y) \cdot \overline{g}_{B_{Lt}} = B_{Lt\_mosaic}(x,y) \cdot \sqrt{\frac{\overline{B}_N}{\overline{B}_{Lt}} \cdot \frac{\overline{B}_{Lt} + \overline{B}_{Rt}}{2\overline{B}_{Lt}}}$$

Global gain correction for the right parallax pixels $$R'_{Rt\_mosaic}(x,y) = R_{Rt\_mosaic}(x,y) \cdot \overline{g}_{R_{Rt}} = R_{Rt\_mosaic}(x,y) \cdot \sqrt{\frac{\overline{R}_N}{\overline{R}_{Rt}} \cdot \frac{\overline{R}_{Lt} + \overline{R}_{Rt}}{2\overline{R}_{Rt}}}$$

$$G'_{Rt\_mosaic}(x,y) = G_{Rt\_mosaic}(x,y) \cdot \overline{g}_{G_{Rt}} = G_{Rt\_mosaic}(x,y) \cdot \sqrt{\frac{\overline{G}_N}{\overline{G}_{Rt}} \cdot \frac{\overline{G}_{Lt} + \overline{G}_{Rt}}{2\overline{G}_{Rt}}}$$

$$B'_{Rt\_mosaic}(x,y) = B_{Rt\_mosaic}(x,y) \cdot \overline{g}_{B_{Rt}} = B_{Rt\_mosaic}(x,y) \cdot \sqrt{\frac{\overline{B}_N}{\overline{B}_{Rt}} \cdot \frac{\overline{B}_{Lt} + \overline{B}_{Rt}}{2\overline{B}_{Rt}}}$$

b) When Using the Geometric Mean of the Left and Right Average values $$\overline{m}_R = \sqrt{\overline{R}_N} \cdot \sqrt{\overline{R}_{Lt} \cdot \overline{R}_{Rt}}$$

$$\overline{m}_G = \sqrt{\overline{G}_N} \cdot \sqrt{\overline{G}_{Lt} \cdot \overline{G}_{Rt}}$$

$$\overline{m}_B = \sqrt{\overline{B}_N} \cdot \sqrt{\overline{B}_{Lt} \cdot \overline{B}_{Rt}}$$

Gain values for the non-parallax pixels $$\overline{g}_{R_N} = \frac{\overline{m}_R}{\overline{R}_N} = \sqrt{\frac{\sqrt{\overline{R}_{Lt} \cdot \overline{R}_{Rt}}}{\overline{R}_N}}$$

$$\overline{g}_{G_N} = \frac{\overline{m}_G}{\overline{G}_N} = \sqrt{\frac{\sqrt{\overline{G}_{Lt} \cdot \overline{G}_{Rt}}}{\overline{G}_N}}$$

$$\overline{g}_{B_N} = \frac{\overline{m}_B}{\overline{B}_N} = \sqrt{\frac{\sqrt{\overline{B}_{Lt} \cdot \overline{B}_{Rt}}}{\overline{B}_N}}$$

Gain values for the left parallax pixels $$\overline{g}_{R_{Lt}} = \frac{\overline{m}_R}{\overline{R}_{Lt}} = \sqrt{\frac{\overline{R}_N}{\overline{R}_{Lt}} \cdot \sqrt{\frac{\overline{R}_{Rt}}{\overline{R}_{Lt}}}}$$

$$\overline{g}_{G_{Lt}} = \frac{\overline{m}_G}{\overline{G}_{Lt}} = \sqrt{\frac{\overline{G}_N}{\overline{G}_{Lt}} \cdot \sqrt{\frac{\overline{G}_{Rt}}{\overline{G}_{Lt}}}}$$

$$\overline{g}_{B_{Lt}} = \frac{\overline{m}_B}{\overline{B}_{Lt}} = \sqrt{\frac{\overline{B}_N}{\overline{B}_{Lt}} \cdot \sqrt{\frac{\overline{B}_{Rt}}{\overline{B}_{Lt}}}}$$

Gain values for the right parallax pixels $$\overline{g}_{R_{Rt}} = \frac{\overline{m}_R}{\overline{R}_{Rt}} = \sqrt{\frac{\overline{R}_N}{\overline{R}_{Rt}} \cdot \sqrt{\frac{\overline{R}_{Lt}}{\overline{R}_{Rt}}}}$$

$$\overline{g}_{G_{Rt}} = \frac{\overline{m}_G}{\overline{G}_{Rt}} = \sqrt{\frac{\overline{G}_N}{\overline{G}_{Rt}} \cdot \sqrt{\frac{\overline{G}_{Lt}}{\overline{G}_{Rt}}}}$$

$$\overline{g}_{B_{Rt}} = \frac{\overline{m}_B}{\overline{B}_{Rt}} = \sqrt{\frac{\overline{B}_N}{\overline{B}_{Rt}} \cdot \sqrt{\frac{\overline{B}_{Lt}}{\overline{B}_{Rt}}}}$$

Global gain correction for the non-parallax pixels $$R'_{N\_mosaic}(x, y) = R_{N\_mosaic}(x, y) \cdot \overline{g}_{R_N} = R_{N\_mosaic}(x, y) \cdot \sqrt{\frac{\sqrt{\overline{R}_{Lt} \cdot \overline{R}_{Rt}}}{\overline{R}_N}}$$

$$G'_{N\_mosaic}(x, y) = G_{N\_mosaic}(x, y) \cdot \overline{g}_{G_N} = G_{N\_mosaic}(x, y) \cdot \sqrt{\frac{\sqrt{\overline{G}_{Lt} \cdot \overline{G}_{Rt}}}{\overline{G}_N}}$$

$$B'_{N\_mosaic}(x, y) = B_{N\_mosaic}(x, y) \cdot \overline{g}_{B_N} = B_{N\_mosaic}(x, y) \cdot \sqrt{\frac{\sqrt{\overline{B}_{Lt} \cdot \overline{B}_{Rt}}}{\overline{B}_N}}$$

Global gain correction for the left parallax pixels $$R'_{Lt\_mosaic}(x, y) = R_{Lt\_mosaic}(x, y) \cdot \overline{g}_{R_{Lt}} = R_{Lt\_mosaic}(x, y) \cdot \sqrt{\frac{\overline{R}_N}{\overline{R}_{Lt}} \cdot \sqrt{\frac{\overline{R}_{Rt}}{\overline{R}_{Lt}}}}$$

$$G'_{Lt\_mosaic}(x, y) = G_{Lt\_mosaic}(x, y) \cdot \overline{g}_{G_{Lt}} = G_{Lt\_mosaic}(x, y) \cdot \sqrt{\frac{\overline{G}_N}{\overline{G}_{Lt}} \cdot \sqrt{\frac{\overline{G}_{Rt}}{\overline{G}_{Lt}}}}$$

$$B'_{Lt\_mosaic}(x, y) = B_{Lt\_mosaic}(x, y) \cdot \overline{g}_{B_{Lt}} = B_{Lt\_mosaic}(x, y) \cdot \sqrt{\frac{\overline{B}_N}{\overline{B}_{Lt}} \cdot \sqrt{\frac{\overline{B}_{Rt}}{\overline{B}_{Lt}}}}$$

Global gain correction for the right parallax pixels $$R'_{Rt\_mosaic}(x, y) = R_{Rt\_mosaic}(x, y) \cdot \overline{g}_{R_{Rt}} = R_{Rt\_mosaic}(x, y) \cdot \sqrt{\frac{\overline{R}_N}{\overline{R}_{Rt}} \cdot \sqrt{\frac{\overline{R}_{Lt}}{\overline{R}_{Rt}}}}$$

$$G'_{Rt\_mosaic}(x, y) = G_{Rt\_mosaic}(x, y) \cdot \overline{g}_{G_{Rt}} = G_{Rt\_mosaic}(x, y) \cdot \sqrt{\frac{\overline{G}_N}{\overline{G}_{Rt}} \cdot \sqrt{\frac{\overline{G}_{Lt}}{\overline{G}_{Rt}}}}$$

$$B'_{Rt\_mosaic}(x, y) = B_{Rt\_mosaic}(x, y) \cdot \overline{g}_{B_{Rt}} = B_{Rt\_mosaic}(x, y) \cdot \sqrt{\frac{\overline{B}_N}{\overline{B}_{Rt}} \cdot \sqrt{\frac{\overline{B}_{Lt}}{\overline{B}_{Rt}}}}$$

When a mask is used in which all of the non-parallax pixels are full-aperture, the method using the arithmetic average is adopted. When a mask is used in which all of the non-parallax pixels are half-aperture, the method using the geometric mean is adopted. Accordingly, the method using the arithmetic mean is adopted in the present embodiment. In this way, a mosaic image in which the non-parallax pixels are corrected using one gain coefficient, the left parallax pixels are corrected using one gain coefficient, and the right parallax pixels are corrected using one gain coefficient is output as M'(x,y).

3) Generation of the Tentative Parallax Images

A tentative left parallax image and a tentative right parallax image having low spatial frequency resolution are created. A simple average interpolation of the G color plane obtained by gathering only the left parallax pixels is performed. Using nearby pixel values, linear interpolation is performed according to the ratio of the distance. In the same manner, a simple average interpolation in the G color plane obtained by gathering only the right parallax pixels is performed. In the same manner, a simple average interpolation in the G color plane obtained by gathering only the non-parallax pixels is performed. The same process is performed for each of the colors R, G, and B. Specifically, $R_{Lt}(x,y)$ is created from $R_{Lt\_mosaic}(x,y)$, $R_{Rt}(x,y)$ is created from $R_{Rt\_mosaic}(x,y)$, $R_N(x,y)$ is created from $R_{N\_mosaic}(x,y)$, $G_{Lt}(x,y)$ is created from $G_{Lt\_mosaic}(x,y)$, $G_{Rt}(x,y)$ is created from $G_{Rt\_mosaic}(x,y)$, $G_N(x,y)$ is created from $G_{N\_mosaic}(x,y)$, $B_{Lt}(x,y)$ is created from $B_{Lt\_mosaic}(x,y)$, $B_{Rt}(x,y)$ is created from $B_{Rt\_mosaic}(x,y)$, and $B_N(x,y)$ is created from $B_{N\_mosaic}(x,y)$.

Tentative non-parallax image having the R component is represented as $R_N(x, y)$. Tentative non-parallax image having the G component is represented as $G_N(x, y)$. Tentative non-parallax image having the B component is represented as $B_N(x, y)$. Tentative left parallax image having the R component is represented as $R_{Lt}(x, y)$. Tentative left parallax image having the G component is represented as $G_{Lt}(x, y)$. Tentative left parallax image having the B component is represented as $B_{Lt}(x, y)$. Tentative right parallax image having the R component is represented as $R_{Rt}(x, y)$. Tentative right parallax image having the G component is represented as $G_{Rt}(x, y)$. Tentative right parallax image having the B component is represented as $B_{Rt}(x, y)$. When creating the tentative non-parallax images $R_N(x, y)$, $G_N(x, y)$, and $B_N(x, y)$, a direction judgment in the signal plane may be introduced to realize higher accuracy.

4) Generation of the Non-Parallax Color Mosaic Image Resulting from the Left and Right Localized Luminance Distribution Correction (Local Gain Balance Correction)

Next, based on the same thinking as used for the global gain correction performed in step 2, the luminance of the left parallax pixels in the screen and the right parallax pixels in the screen are made to match, by performing a local gain correction in pixel units. As a result of this operation, the parallax between the left and right is eliminated. After this, the signal planes that have been averaged for the left and right and the imaging signal plane of the non-parallax pixels are also made to match. A new Bayer plane is thereby created in which all of the pixels have matching gain. This is equivalent to the replacement with an average value, and realizes a Bayer plane in which the parallax has been eliminated. This is written as $M_N(x, y)$.

In this case as well, there are two types of methods that can be used for the process of setting the target value to be taken as the reference point for each pixel and the process for eliminating the parallax between the left and right, which are a method selecting the arithmetic mean and a method selecting the geometric mean. When there is a mask area in which all of the non-parallax pixels are full-aperture, it is necessary to select the method using the arithmetic mean in order for the blur width of the subject image for which the parallax between the left and right has been eliminated to match the full-aperture blur width. On the other hand, if there is a mask area in which all of the non-parallax pixels are half-aperture, it is necessary to select the method using the geometric mean, in order for the blur width of the subject image in which the parallax between the left and right has been eliminated to match the half-aperture blur width.

Further more, the operation for obtaining the average between the signal plane in which the parallax between the left and right has been eliminated and the imaging signal plane of the non-parallax pixels must preserve the blur widths of these planes, since both already conform to the subject image having the same blur width. Accordingly, the geometric mean must be used for both planes at this time. The following provides detailed expressions for this operation.

a) When Using the Arithmetic Mean of the Left and Right Average values for each pixel $$m_R(x, y) = \sqrt{R_N(x, y) \cdot \frac{R_{Lt}(x, y) + R_{Rt}(x, y)}{2}}$$

$$m_G(x, y) = \sqrt{G_N(x, y) \cdot \frac{G_{Lt}(x, y) + G_{Rt}(x, y)}{2}}$$

$$m_B(x, y) = \sqrt{B_N(x, y) \cdot \frac{B_{Lt}(x, y) + B_{Rt}(x, y)}{2}}$$

Gain values for each non-parallax pixel $$g_{R_N}(x, y) = \frac{m_R(x, y)}{R_N(x, y)} = \sqrt{\frac{R_{Lt}(x, y) + R_{Rt}(x, y)}{2R_N(x, y)}}$$

$$g_{G_N}(x, y) = \frac{m_G(x, y)}{G_N(x, y)} = \sqrt{\frac{G_{Lt}(x, y) + G_{Rt}(x, y)}{2G_N(x, y)}}$$

$$g_{B_N}(x, y) = \frac{m_B(x, y)}{B_N(x, y)} = \sqrt{\frac{B_{Lt}(x, y) + B_{Rt}(x, y)}{2B_N(x, y)}}$$

Gain values for each left parallax pixel $$g_{R_{Lt}}(x, y) = \frac{m_R(x, y)}{R_{Lt}(x, y)} = \sqrt{\frac{R_N(x, y)}{R_{Lt}(x, y)} \cdot \frac{R_{Lt}(x, y) + R_{Rt}(x, y)}{2R_{Lt}(x, y)}}$$

$$g_{G_{Lt}}(x, y) = \frac{m_G(x, y)}{G_{Lt}(x, y)} = \sqrt{\frac{G_N(x, y)}{G_{Lt}(x, y)} \cdot \frac{G_{Lt}(x, y) + G_{Rt}(x, y)}{2G_{Lt}(x, y)}}$$

$$g_{B_{Lt}}(x, y) = \frac{m_B(x, y)}{B_{Lt}(x, y)} = \sqrt{\frac{B_N(x, y)}{B_{Lt}(x, y)} \cdot \frac{B_{Lt}(x, y) + B_{Rt}(x, y)}{2B_{Lt}(x, y)}}$$

Gain values for each right parallax pixel $$g_{R_{Rt}}(x, y) = \frac{m_R(x, y)}{R_{Rt}(x, y)} = \sqrt{\frac{R_N(x, y)}{R_{Rt}(x, y)} \cdot \frac{R_{Lt}(x, y) + R_{Rt}(x, y)}{2R_{Rt}(x, y)}}$$

$$g_{G_{Rt}}(x, y) = \frac{m_G(x, y)}{G_{Rt}(x, y)} = \sqrt{\frac{G_N(x, y)}{G_{Rt}(x, y)} \cdot \frac{G_{Lt}(x, y) + G_{Rt}(x, y)}{2G_{Rt}(x, y)}}$$

$$g_{B_{Rt}}(x, y) = \frac{m_B(x, y)}{B_{Rt}(x, y)} = \sqrt{\frac{B_N(x, y)}{B_{Rt}(x, y)} \cdot \frac{B_{Lt}(x, y) + B_{Rt}(x, y)}{2B_{Rt}(x, y)}}$$

Local gain correction for each non-parallax pixel $$R_N(x,y) \cdot g_{R_N}(x,y) = m_R(x,y)$$

$$G_N(x,y) \cdot g_{G_N}(x,y) = m_G(x,y)$$

$$B_N(x,y) \cdot g_{B_N}(x,y) = m_B(x,y)$$

Local gain correction for each left parallax pixel $$R_{Lt}(x,y) \cdot g_{R_{Lt}}(x,y) = m_R(x,y)$$

$$G_{Lt}(x,y) \cdot g_{G_{Lt}}(x,y) = m_G(x,y)$$

$$B_{Lt}(x,y) \cdot g_{B_{Lt}}(x,y) = m_B(x,y)$$

Local gain correction for each right parallax pixel $$R_{Rt}(x,y) \cdot g_{R_{Rt}}(x,y) = m_R(x,y)$$

$$G_{Rt}(x,y) \cdot g_{G_{Rt}}(x,y) = m_G(x,y)$$

$$B_{Rt}(x,y) \cdot g_{B_{Rt}}(x,y) = m_B(x,y)$$

b) When Using the Geometric Mean of the Left and Right Average values for each pixel $$m_R(x,y) = \sqrt{R_N(x,y)} \cdot \sqrt{R_{Lt}(x,y) \cdot R_{Rt}(x,y)}$$

$$m_G(x,y) = \sqrt{G_N(x,y)} \cdot \sqrt{G_{Lt}(x,y) \cdot G_{Rt}(x,y)}$$

$$m_B(x,y) = \sqrt{B_N(x,y)} \cdot \sqrt{B_{Lt}(x,y) \cdot B_{Rt}(x,y)}$$

Gain values for each non-parallax pixel $$g_{R_N}(x, y) = \frac{m_R(x, y)}{R_N(x, y)} = \sqrt{\frac{\sqrt{R_{Lt}(x, y) \cdot R_{Rt}(x, y)}}{R_N(x, y)}}$$

$$g_{G_N}(x, y) = \frac{m_G(x, y)}{G_N(x, y)} = \sqrt{\frac{\sqrt{G_{Lt}(x, y) \cdot G_{Rt}(x, y)}}{G_N(x, y)}}$$

$$g_{B_N}(x, y) = \frac{m_B(x, y)}{B_N(x, y)} = \sqrt{\frac{\sqrt{B_{Lt}(x, y) \cdot B_{Rt}(x, y)}}{B_N(x, y)}}$$

Gain values for each left parallax pixel $$g_{R_{Lt}}(x, y) = \frac{m_R(x, y)}{R_{Lt}(x, y)} = \sqrt{\frac{R_N(x, y)}{R_{Lt}(x, y)} \cdot \sqrt{\frac{R_{Rt}(x, y)}{R_{Lt}(x, y)}}}$$

$$g_{G_{Lt}}(x, y) = \frac{m_G(x, y)}{G_{Lt}(x, y)} = \sqrt{\frac{G_N(x, y)}{G_{Lt}(x, y)} \cdot \sqrt{\frac{G_{Rt}(x, y)}{G_{Lt}(x, y)}}}$$

$$g_{B_{Lt}}(x, y) = \frac{m_B(x, y)}{B_{Lt}(x, y)} = \sqrt{\frac{B_N(x, y)}{B_{Lt}(x, y)} \cdot \sqrt{\frac{B_{Rt}(x, y)}{B_{Lt}(x, y)}}}$$

Gain values for each right parallax pixel $$g_{R_{Rt}}(x, y) = \frac{m_R(x, y)}{R_{Rt}(x, y)} = \sqrt{\frac{R_N(x, y)}{R_{Rt}(x, y)} \cdot \sqrt{\frac{R_{Lt}(x, y)}{R_{Rt}(x, y)}}}$$

$$g_{G_{Rt}}(x, y) = \frac{m_G(x, y)}{G_{Rt}(x, y)} = \sqrt{\frac{G_N(x, y)}{G_{Rt}(x, y)} \cdot \sqrt{\frac{G_{Lt}(x, y)}{G_{Rt}(x, y)}}}$$

$$g_{B_{Rt}}(x, y) = \frac{m_B(x, y)}{B_{Rt}(x, y)} = \sqrt{\frac{B_N(x, y)}{B_{Rt}(x, y)} \cdot \sqrt{\frac{B_{Lt}(x, y)}{B_{Rt}(x, y)}}}$$

Local gain correction for each non-parallax pixel $R_N(x,y) \cdot g_{R_N}(x,y) = m_R(x,y)$ $G_N(x,y) \cdot g_{G_N}(x,y) = m_G(x,y)$ $B_N(x,y) \cdot g_{B_N}(x,y) = m_B(x,y)$ Local gain correction for each left parallax pixel $R_{Lt}(x,y) \cdot g_{R_{Lt}}(x,y) = m_R(x,y)$ $G_{Lt}(x,y) \cdot g_{G_{Lt}}(x,y) = m_G(x,y)$ $B_{Lt}(x,y) \cdot g_{B_{Lt}}(x,y) = m_B(x,y)$ Local gain correction for each right parallax pixel $R_{Rt}(x,y) \cdot g_{R_{Rt}}(x,y) = m_R(x,y)$ $G_{Rt}(x,y) \cdot g_{G_{Rt}}(x,y) = m_G(x,y)$ $B_{Rt}(x,y) \cdot g_{B_{Rt}}(x,y) = m_B(x,y)$ In this way, the data of the Bayer plane is overwritten with the pixel value obtained by further averaging the average value of the left viewpoint image and the right viewpoint image and the non-parallax image of the reference viewpoint, as a new non-parallax pixel value, and the image $M_N(x,y)$ having a non-parallax Bayer plane is output.

5) Generation of the Non-Parallax Reference Image

A widely known Bayer interpolation technique is performed. For example, please see the interpolation algorithm shown in U.S. Pat. No. 7,957,588 (WO2006/006373) and U.S. Pat. No. 8,259,213 from the same inventor as the present application.

6) Generation of the Actual Parallax Images

Using the tentative left parallax color images $R_{Lt}(x,y)$, $G_N(x,y)$, and $B_{Lt}(x,y)$ with low resolution created in step 3 and the non-parallax color images $R_N(x,y)$, $G_N(x,y)$, and $B_N(x,y)$ with high resolution created as an intermediate process in step 5, left parallax color images color images $R'_{Lt}(x,y)$, $G'_{Lt}(x,y)$, and $B'_{Lt}(x,y)$ that have high resolution and are to actually be output are created. In the same manner, using the tentative right parallax color images $R_{Rt}(x,y)$, $G_{Rt}(x,y)$, and $B_{Rt}(x,y)$ with low resolution created in step 3 and the non-parallax color images $R_N(x,y)$, $G_N(x,y)$, and $B_N(x,y)$ with high resolution created as an intermediate process in step 5, right parallax color images color images $R'_{Rt}(x,y)$, $G'_{Rt}(x,y)$, and $B'_{Rt}(x,y)$ that have high resolution and are to actually be output are created.

There are two methods considered for the parallax modulation, which are a method using the arithmetic mean as a reference point and a method using the geometric mean as a reference point. Either method can be used to realize the parallax modulation effect, but the method using the arithmetic mean as the reference point is adopted when the aperture mask of the non-parallax pixels of the image sensor is full-aperture and the method using the geometric mean as the reference point is adopted when the aperture mask of the non-parallax pixels of the image sensor is half-aperture in the same manner as the parallax pixels. Accordingly, in the present embodiment, the method using the arithmetic mean as the reference point is used.

(a) Parallax Modulation with the Arithmetic Mean as the Reference Point

Left parallax modulation $$R'_{Lt}(x, y) = R_N(x, y) \left( \frac{2R_{Lt}(x, y)}{R_{Lt}(x, y) + R_{Rt}(x, y)} \frac{2G_{Lt}(x, y)}{G_{Lt}(x, y) + G_{Rt}(x, y)} \frac{2B_{Lt}(x, y)}{B_{Lt}(x, y) + B_{Rt}(x, y)} \right)^k$$

$$G'_{Lt}(x, y) = G_N(x, y) \left( \frac{2R_{Lt}(x, y)}{R_{Lt}(x, y) + R_{Rt}(x, y)} \frac{2G_{Lt}(x, y)}{G_{Lt}(x, y) + G_{Rt}(x, y)} \frac{2B_{Lt}(x, y)}{B_{Lt}(x, y) + B_{Rt}(x, y)} \right)^k$$

$$B'_{Lt}(x, y) = B_N(x, y) \left( \frac{2R_{Lt}(x, y)}{R_{Lt}(x, y) + R_{Rt}(x, y)} \frac{2G_{Lt}(x, y)}{G_{Lt}(x, y) + G_{Rt}(x, y)} \frac{2B_{Lt}(x, y)}{B_{Lt}(x, y) + B_{Rt}(x, y)} \right)^k$$

Right parallax modulation $$R'_{Rt}(x, y) = R_N(x, y) \left( \frac{2R_{Rt}(x, y)}{R_{Lt}(x, y) + R_{Rt}(x, y)} \frac{2G_{Rt}(x, y)}{G_{Lt}(x, y) + G_{Rt}(x, y)} \frac{2B_{Rt}(x, y)}{B_{Lt}(x, y) + B_{Rt}(x, y)} \right)^k$$

$$G'_{Rt}(x, y) = G_N(x, y) \left( \frac{2R_{Rt}(x, y)}{R_{Lt}(x, y) + R_{Rt}(x, y)} \frac{2G_{Rt}(x, y)}{G_{Lt}(x, y) + G_{Rt}(x, y)} \frac{2B_{Rt}(x, y)}{B_{Lt}(x, y) + B_{Rt}(x, y)} \right)^k$$

$$B'_{Rt}(x, y) = B_N(x, y) \left( \frac{2R_{Rt}(x, y)}{R_{Lt}(x, y) + R_{Rt}(x, y)} \frac{2G_{Rt}(x, y)}{G_{Lt}(x, y) + G_{Rt}(x, y)} \frac{2B_{Rt}(x, y)}{B_{Lt}(x, y) + B_{Rt}(x, y)} \right)^k$$

b) Parallax Modulation with the Geometric Mean as the Reference Point

Left parallax modulation $$R'_{Lt}(x, y) = R_N(x, y) \left( \frac{R_{Lt}(x, y)}{\sqrt{R_{Lt}(x, y) \cdot R_{Rt}(x, y)}} \frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}} \right)^k$$

$$G'_{Lt}(x, y) = G_N(x, y)$$
$$\left(\frac{R_{Lt}(x, y)}{\sqrt{R_{Lt}(x, y) \cdot R_{Rt}(x, y)}} \frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}}\right)^k$$

$$B'_{Lt}(x, y) = B_N(x, y)$$
$$\left(\frac{R_{Lt}(x, y)}{\sqrt{R_{Lt}(x, y) \cdot R_{Rt}(x, y)}} \frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}}\right)^k$$

Right parallax modulation $$R'_{Rt}(x, y) = R_N(x, y)$$
$$\left(\frac{R_{Rt}(x, y)}{\sqrt{R_{Lt}(x, y) \cdot R_{Rt}(x, y)}} \frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}\right)^k$$

$$G'_{Rt}(x, y) = G_N(x, y)$$
$$\left(\frac{R_{Rt}(x, y)}{\sqrt{R_{Lt}(x, y) \cdot R_{Rt}(x, y)}} \frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}\right)^k$$

$$B'_{Rt}(x, y) = B_N(x, y)$$
$$\left(\frac{R_{Rt}(x, y)}{\sqrt{R_{Lt}(x, y) \cdot R_{Rt}(x, y)}} \frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}\right)^k$$

When overwriting the above-described expressions

Left parallax modulation $$R'_{Lt}(x, y) = R_N(x, y)\left(\sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}}\right)^k$$

$$G'_{Lt}(x, y) = G_N(x, y)\left(\sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}}\right)^k$$

$$B'_{Lt}(x, y) = B_N(x, y)\left(\sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}}\right)^k$$

Right parallax modulation $$R'_{Rt}(x, y) = R_N(x, y)\left(\sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}\right)^k$$

$$G'_{Rt}(x, y) = G_N(x, y)\left(\sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}\right)^k$$

$$B'_{Rt}(x, y) = B_N(x, y)\left(\sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}\right)^k$$

7) Conversion to Output Color Space

It is in the same manner as the embodiment 1.

In the embodiment 2, the expressions as below may be used as the parallax modulation.

Left parallax modulation $$R'_{Lt}(x, y) = R_N(x, y) + k\left(\frac{R_{Lt}(x, y) - R_{Rt}(x, y)}{2} + \frac{G_{Lt}(x, y) - G_{Rt}(x, y)}{2} + \frac{B_{Lt}(x, y) - B_{Rt}(x, y)}{2}\right)$$

$$G'_{Lt}(x, y) = G_N(x, y) + k\left(\frac{R_{Lt}(x, y) - R_{Rt}(x, y)}{2} + \frac{G_{Lt}(x, y) - G_{Rt}(x, y)}{2} + \frac{B_{Lt}(x, y) - B_{Rt}(x, y)}{2}\right)$$

$$B'_{Lt}(x, y) = B_N(x, y) + k\left(\frac{R_{Lt}(x, y) - R_{Rt}(x, y)}{2} + \frac{G_{Lt}(x, y) - G_{Rt}(x, y)}{2} + \frac{B_{Lt}(x, y) - B_{Rt}(x, y)}{2}\right)$$

Right parallax modulation $$R'_{Rt}(x, y) = R_N(x, y) + k\left(\frac{R_{Rt}(x, y) - R_{Lt}(x, y)}{2} + \frac{G_{Rt}(x, y) - G_{Lt}(x, y)}{2} + \frac{B_{Rt}(x, y) - B_{Lt}(x, y)}{2}\right)$$

$$G'_{Rt}(x, y) = G_N(x, y) + k\left(\frac{R_{Rt}(x, y) - R_{Lt}(x, y)}{2} + \frac{G_{Rt}(x, y) - G_{Lt}(x, y)}{2} + \frac{B_{Rt}(x, y) - B_{Lt}(x, y)}{2}\right)$$

$$B'_{Rt}(x, y) = B_N(x, y) + k\left(\frac{R_{Rt}(x, y) - R_{Lt}(x, y)}{2} + \frac{G_{Rt}(x, y) - G_{Lt}(x, y)}{2} + \frac{B_{Rt}(x, y) - B_{Lt}(x, y)}{2}\right)$$

Further, in the image sensor of the above embodiment 2, the number of parallax pixels is less than the number of non-parallax pixels. Here, it is possible to apply a weighting with the reliability according to the resolution power according to the spatial sampling when each calculation described above is performed in consideration of the density ratio of the parallax pixels and the non-parallax pixels in the pixel arrangement on the image sensor. Specifically, the ratio between the non-parallax pixels (N), the left parallax pixels (Lt) and the right parallax pixels (Rt) used in the embodiment 2 are N:Lt:Rt=6:1:1, in other words N:(Lt+Rt)=3:1, and therefore the non-parallax pixels are raised to the power of ¾ and the parallax pixels are raised to the power of ¼, such that the distribution gives more importance to the non-parallax pixels that have high density. In this case, the following expressions may be used in the above 2), 4) and 6).

2) Global Gain Balance Correction of Color and Parallax Mosaic Image a) When Using the Arithmetic Mean of the Left and Right Average values $$\bar{m}_R = [\bar{R}_N]^{\frac{3}{4}} \cdot \left[\frac{\bar{R}_{Lt} + \bar{R}_{Rt}}{2}\right]^{\frac{1}{4}}$$

$$\bar{m}_G = [\bar{G}_N]^{\frac{3}{4}} \cdot \left[\frac{\bar{G}_{Lt} + \bar{G}_{Rt}}{2}\right]^{\frac{1}{4}}$$

$$\bar{m}_B = [\bar{B}_N]^{\frac{3}{4}} \cdot \left[\frac{\bar{B}_{Lt} + \bar{B}_{Rt}}{2}\right]^{\frac{1}{4}}$$

Gain values for the non-parallax pixels $$\bar{g}_{R_N} = \frac{\bar{m}_R}{\bar{R}_N} = \left[\frac{\bar{R}_{Lt} + \bar{R}_{Rt}}{2\bar{R}_N}\right]^{\frac{1}{4}}$$

$$\bar{g}_{G_N} = \frac{\bar{m}_G}{\bar{G}_N} = \left[\frac{\bar{G}_{Lt} + \bar{G}_{Rt}}{2\bar{G}_N}\right]^{\frac{1}{4}}$$

$$\bar{g}_{B_N} = \frac{\bar{m}_B}{\bar{B}_N} = \left[\frac{\bar{B}_{Lt} + \bar{B}_{Rt}}{2\bar{B}_N}\right]^{\frac{1}{4}}$$

Gain values for the left parallax pixels $$\bar{g}_{R_{Lt}} = \frac{\bar{m}_R}{\bar{m}_{Lt}} = \left[\frac{\bar{R}_N}{\bar{R}_{Lt}}\right]^{\frac{3}{4}} \left[\frac{\bar{R}_{Lt} + \bar{R}_{Rt}}{2\bar{R}_{Lt}}\right]^{\frac{1}{4}}$$

$$\bar{g}_{G_{Lt}} = \frac{\bar{m}_G}{\bar{G}_{Lt}} = \left[\frac{\bar{G}_N}{\bar{G}_{Lt}}\right]^{\frac{3}{4}} \left[\frac{\bar{G}_{Lt} + \bar{G}_{Rt}}{2\bar{G}_{Lt}}\right]^{\frac{1}{4}}$$

$$\bar{g}_{B_{Lt}} = \frac{\bar{m}_B}{\bar{B}_{Lt}} = \left[\frac{\bar{B}_N}{\bar{B}_{Lt}}\right]^{\frac{3}{4}} \left[\frac{\bar{B}_{Lt} + \bar{B}_{Rt}}{2\bar{B}_{Lt}}\right]^{\frac{1}{4}}$$

Gain values for the right parallax pixels $$\bar{g}_{R_{Rt}} = \frac{\bar{m}_R}{\bar{m}_{Rt}} = \left[\frac{\bar{R}_N}{\bar{R}_{Rt}}\right]^{\frac{3}{4}} \left[\frac{\bar{R}_{Lt} + \bar{R}_{Rt}}{2\bar{R}_{Rt}}\right]^{\frac{1}{4}}$$

$$\bar{g}_{G_{Rt}} = \frac{\bar{m}_G}{\bar{G}_{Rt}} = \left[\frac{\bar{G}_N}{\bar{G}_{Rt}}\right]^{\frac{3}{4}} \left[\frac{\bar{G}_{Lt} + \bar{G}_{Rt}}{2\bar{G}_{Rt}}\right]^{\frac{1}{4}}$$

$$\bar{g}_{B_{Rt}} = \frac{\bar{m}_B}{\bar{B}_{Rt}} = \left[\frac{\bar{B}_N}{\bar{B}_{Rt}}\right]^{\frac{3}{4}} \left[\frac{\bar{B}_{Lt} + \bar{B}_{Rt}}{2\bar{B}_{Rt}}\right]^{\frac{1}{4}}$$

Global gain correction for the non-parallax pixels $$R'_{N\_mosaic}(x,y) = R_{N\_mosaic}(x,y) \cdot \bar{g}_{R_N} = R_{N\_mosaic}(x,y) \cdot \left[\frac{\bar{R}_{Lt} + \bar{R}_{Rt}}{2\bar{R}_N}\right]^{\frac{1}{4}}$$

$$G'_{N\_mosaic}(x,y) = G_{N\_mosaic}(x,y) \cdot \bar{g}_{G_N} = G_{N\_mosaic}(x,y) \cdot \left[\frac{\bar{G}_{Lt} + \bar{G}_{Rt}}{2\bar{G}_N}\right]^{\frac{1}{4}}$$

$$B'_{N\_mosaic}(x,y) = B_{N\_mosaic}(x,y) \cdot \bar{g}_{B_N} = B_{N\_mosaic}(x,y) \cdot \left[\frac{\bar{B}_{Lt} + \bar{B}_{Rt}}{2\bar{B}_N}\right]^{\frac{1}{4}}$$

Global gain correction for the left parallax pixels $$R'_{Lt\_mosaic}(x,y) =$$

$$R_{Lt\_mosaic}(x,y) \cdot \bar{g}_{R_{Lt}} = R_{Lt\_mosaic}(x,y) \cdot \left[\frac{\bar{R}_N}{\bar{R}_{Lt}}\right]^{\frac{3}{4}} \left[\frac{\bar{R}_{Lt} + \bar{R}_{Rt}}{2\bar{R}_{Lt}}\right]^{\frac{1}{4}}$$

$$G'_{Lt\_mosaic}(x,y) = G_{Lt\_mosaic}(x,y) \cdot \bar{g}_{G_{Lt}} =$$

$$G_{Lt\_mosaic}(x,y) \cdot \left[\frac{\bar{G}_N}{\bar{G}_{Lt}}\right]^{\frac{3}{4}} \left[\frac{\bar{G}_{Lt} + \bar{G}_{Rt}}{2\bar{G}_{Lt}}\right]^{\frac{1}{4}}$$

$$B'_{Lt\_mosaic}(x,y) = B_{Lt\_mosaic}(x,y) \cdot \bar{g}_{B_{Lt}} =$$

$$B_{Lt\_mosaic}(x,y) \cdot \left[\frac{\bar{B}_N}{\bar{B}_{Lt}}\right]^{\frac{3}{4}} \left[\frac{\bar{B}_{Lt} + \bar{B}_{Rt}}{2\bar{B}_{Lt}}\right]^{\frac{1}{4}}$$

Global gain correction for the right parallax pixels $$R'_{Rt\_mosaic}(x,y) =$$

$$R_{Rt\_mosaic}(x,y) \cdot \bar{g}_{R_{Rt}} = R_{Rt\_mosaic}(x,y) \cdot \left[\frac{\bar{R}_N}{\bar{R}_{Rt}}\right]^{\frac{3}{4}} \left[\frac{\bar{R}_{Lt} + \bar{R}_{Rt}}{2\bar{R}_{Rt}}\right]^{\frac{1}{4}}$$

$$G'_{Rt\_mosaic}(x,y) = G_{Rt\_mosaic}(x,y) \cdot \bar{g}_{G_{Rt}} =$$

$$G_{Rt\_mosaic}(x,y) \cdot \left[\frac{\bar{G}_N}{\bar{G}_{Rt}}\right]^{\frac{3}{4}} \left[\frac{\bar{G}_{Lt} + \bar{G}_{Rt}}{2\bar{G}_{Rt}}\right]^{\frac{1}{4}}$$

$$B'_{Rt\_mosaic}(x,y) = B_{Rt\_mosaic}(x,y) \cdot \bar{g}_{B_{Rt}} =$$

$$B_{Rt\_mosaic}(x,y) \cdot \left[\frac{\bar{B}_N}{\bar{B}_{Rt}}\right]^{\frac{3}{4}} \left[\frac{\bar{B}_{Lt} + \bar{B}_{Rt}}{2\bar{B}_{Rt}}\right]^{\frac{1}{4}}$$

b) When Using the Geometric Mean of the Left and Right Average values $$\bar{m}_R = [\bar{R}_N]^{3/4} \cdot [\bar{R}_{Lt} \cdot \bar{R}_{Rt}]^{1/4}$$

$$\bar{m}_G = [\bar{G}_N]^{3/4} \cdot [\bar{G}_{Lt} \cdot \bar{G}_{Rt}]^{1/4}$$

$$\bar{m}_B = [\bar{B}_N]^{3/4} \cdot [\bar{B}_{Lt} \cdot \bar{B}_{Rt}]^{1/4}$$

Gain values for the non-parallax pixels $$\bar{g}_{R_N} = \frac{\bar{m}_R}{\bar{R}_N} = \sqrt[4]{\frac{\sqrt{\bar{R}_{Lt} \cdot \bar{R}_{Rt}}}{\bar{R}_N}}$$

$$\bar{g}_{G_N} = \frac{\bar{m}_G}{\bar{G}_N} = \sqrt[4]{\frac{\sqrt{\bar{G}_{Lt} \cdot \bar{G}_{Rt}}}{\bar{G}_N}}$$

$$\bar{g}_{B_N} = \frac{\bar{m}_B}{\bar{B}_N} = \sqrt[4]{\frac{\sqrt{\bar{B}_{Lt} \cdot \bar{B}_{Rt}}}{\bar{B}_N}}$$

Gain values for the left parallax pixels $$\bar{g}_{R_{Lt}} = \frac{\bar{m}_R}{\bar{m}_{Lt}} = \left[\frac{\bar{R}_N}{\bar{R}_{Lt}}\right]^{\frac{3}{4}} \cdot \left[\frac{\bar{R}_{Rt}}{\bar{R}_{Lt}}\right]^{\frac{1}{4}}$$

$$\bar{g}_{G_{Lt}} = \frac{\bar{m}_G}{\bar{G}_{Lt}} = \left[\frac{\bar{G}_N}{\bar{G}_{Lt}}\right]^{\frac{3}{4}} \cdot \left[\frac{\bar{G}_{Rt}}{\bar{G}_{Lt}}\right]^{\frac{1}{4}}$$

$$\bar{g}_{B_{Lt}} = \frac{\bar{m}_B}{\bar{B}_{Lt}} = \left[\frac{\bar{B}_N}{\bar{B}_{Lt}}\right]^{\frac{3}{4}} \cdot \left[\frac{\bar{B}_{Rt}}{\bar{B}_{Lt}}\right]^{\frac{1}{4}}$$

Gain values for the right parallax pixels $$\overline{g}_{R_{Rt}} = \frac{\overline{m}_R}{\overline{m}_{Rt}} = \left[\frac{\overline{R}_N}{\overline{R}_{Rt}}\right]^{\frac{3}{4}} \cdot \left[\frac{\overline{R}_{Lt}}{\overline{R}_{Rt}}\right]^{\frac{1}{4}}$$

$$\overline{g}_{G_{Rt}} = \frac{\overline{m}_G}{\overline{G}_{Rt}} = \left[\frac{\overline{G}_N}{\overline{G}_{Rt}}\right]^{\frac{3}{4}} \cdot \left[\frac{\overline{G}_{Lt}}{\overline{G}_{Rt}}\right]^{\frac{1}{4}}$$

$$\overline{g}_{B_{Rt}} = \frac{\overline{m}_B}{\overline{B}_{Rt}} = \left[\frac{\overline{B}_N}{\overline{B}_{Rt}}\right]^{\frac{3}{4}} \cdot \left[\frac{\overline{B}_{Lt}}{\overline{B}_{Rt}}\right]^{\frac{1}{4}}$$

Global gain correction for the non-parallax pixels $$R'_{N\_mosaic}(x,y) = R_{N\_mosaic}(x,y) \cdot \overline{g}_{R_N} = R_{N\_mosaic}(x,y) \cdot \sqrt[4]{\frac{\sqrt{\overline{R}_{Lt} \cdot \overline{R}_{Rt}}}{\overline{R}_N}}$$

$$G'_{N\_mosaic}(x,y) = G_{N\_mosaic}(x,y) \cdot \overline{g}_{G_N} = G_{N\_mosaic}(x,y) \cdot \sqrt[4]{\frac{\sqrt{\overline{G}_{Lt} \cdot \overline{G}_{Rt}}}{\overline{G}_N}}$$

$$B'_{N\_mosaic}(x,y) = B_{N\_mosaic}(x,y) \cdot \overline{g}_{B_N} = B_{N\_mosaic}(x,y) \cdot \sqrt[4]{\frac{\sqrt{\overline{B}_{Lt} \cdot \overline{B}_{Rt}}}{\overline{B}_N}}$$

Global gain correction for the left parallax pixels $$R'_{Lt\_mosaic}(x,y) = R_{Lt\_mosaic}(x,y) \cdot \overline{g}_{R_{Lt}} = R_{Lt\_mosaic}(x,y) \cdot \left[\frac{\overline{R}_N}{\overline{R}_{Lt}}\right]^{\frac{3}{4}} \left[\frac{\overline{R}_{Rt}}{\overline{R}_{Lt}}\right]^{\frac{1}{4}}$$

$$G'_{Lt\_mosaic}(x,y) = G_{Lt\_mosaic}(x,y) \cdot \overline{g}_{G_{Lt}} = G_{Lt\_mosaic}(x,y) \cdot \left[\frac{\overline{G}_N}{\overline{G}_{Lt}}\right]^{\frac{3}{4}} \left[\frac{\overline{G}_{Rt}}{\overline{G}_{Lt}}\right]^{\frac{1}{4}}$$

$$B'_{Lt\_mosaic}(x,y) = B_{Lt\_mosaic}(x,y) \cdot \overline{g}_{B_{Lt}} = B_{Lt\_mosaic}(x,y) \cdot \left[\frac{\overline{B}_N}{\overline{B}_{Lt}}\right]^{\frac{3}{4}} \left[\frac{\overline{B}_{Rt}}{\overline{B}_{Lt}}\right]^{\frac{1}{4}}$$

Global gain correction for the right parallax pixels $$R'_{Rt\_mosaic}(x,y) = R_{Rt\_mosaic}(x,y) \cdot \overline{g}_{R_{Rt}} = R_{Rt\_mosaic}(x,y) \cdot \left[\frac{\overline{R}_N}{\overline{R}_{Rt}}\right]^{\frac{3}{4}} \left[\frac{\overline{R}_{Lt}}{\overline{R}_{Rt}}\right]^{\frac{1}{4}}$$

$$G'_{Rt\_mosaic}(x,y) = G_{Rt\_mosaic}(x,y) \cdot \overline{g}_{G_{Rt}} = G_{Rt\_mosaic}(x,y) \cdot \left[\frac{\overline{G}_N}{\overline{G}_{Rt}}\right]^{\frac{3}{4}} \left[\frac{\overline{G}_{Lt}}{\overline{G}_{Rt}}\right]^{\frac{1}{4}}$$

$$B'_{Rt\_mosaic}(x,y) = B_{Rt\_mosaic}(x,y) \cdot \overline{g}_{B_{Rt}} = B_{Rt\_mosaic}(x,y) \cdot \left[\frac{\overline{B}_N}{\overline{B}_{Rt}}\right]^{\frac{3}{4}} \left[\frac{\overline{B}_{Lt}}{\overline{B}_{Rt}}\right]^{\frac{1}{4}}$$

4) Generation of the Non-Parallax Color Mosaic Image Resulting from the Left and Right Localized Luminance Distribution Correction
a) When Using the Arithmetic Mean of the Left and Right Average values for each pixel $$m_R(x,y) = [R_N(x,y)]^{\frac{3}{4}} \cdot \left[\frac{R_{Lt}(x,y) + R_{Rt}(x,y)}{2}\right]^{\frac{1}{4}}$$

$$m_G(x,y) = [G_N(x,y)]^{\frac{3}{4}} \cdot \left[\frac{G_{Lt}(x,y) + G_{Rt}(x,y)}{2}\right]^{\frac{1}{4}}$$

$$m_B(x,y) = [B_N(x,y)]^{\frac{3}{4}} \cdot \left[\frac{B_{Lt}(x,y) + B_{Rt}(x,y)}{2}\right]^{\frac{1}{4}}$$

Gain values for each non-parallax pixel $$g_{R_N}(x,y) = \frac{m_R(x,y)}{R_N(x,y)}$$
$$= \left[\frac{R_{Lt}(x,y) + R_{Rt}(x,y)}{2R_N(x,y)}\right]^{\frac{1}{4}}$$

$$g_{G_N}(x,y) = \frac{m_G(x,y)}{G_N(x,y)}$$
$$= \left[\frac{G_{Lt}(x,y) + G_{Rt}(x,y)}{2G_N(x,y)}\right]^{\frac{1}{4}}$$

$$g_{B_N}(x,y) = \frac{m_B(x,y)}{B_N(x,y)}$$
$$= \left[\frac{B_{Lt}(x,y) + B_{Rt}(x,y)}{2B_N(x,y)}\right]^{\frac{1}{4}}$$

Gain values for each left parallax pixel $$g_{R_{Lt}}(x,y) = \frac{m_R(x,y)}{R_{Lt}(x,y)}$$
$$= \left[\frac{R_N(x,y)}{R_{Lt}(x,y)}\right]^{\frac{3}{4}} \cdot \left[\frac{R_{Lt}(x,y) + R_{Rt}(x,y)}{2R_{Lt}(x,y)}\right]^{\frac{1}{4}}$$

$$g_{G_{Lt}}(x,y) = \frac{m_G(x,y)}{G_{Lt}(x,y)}$$
$$= \left[\frac{G_N(x,y)}{G_{Lt}(x,y)}\right]^{\frac{3}{4}} \cdot \left[\frac{G_{Lt}(x,y) + G_{Rt}(x,y)}{2G_{Lt}(x,y)}\right]^{\frac{1}{4}}$$

$$g_{B_{Lt}}(x,y) = \frac{m_G(x,y)}{B_{Lt}(x,y)}$$
$$= \left[\frac{B_N(x,y)}{B_{Lt}(x,y)}\right]^{\frac{3}{4}} \cdot \left[\frac{B_{Lt}(x,y) + B_{Rt}(x,y)}{2B_{Lt}(x,y)}\right]^{\frac{1}{4}}$$

Gain values for each right parallax pixel $$g_{R_{Rt}}(x,y) = \frac{m_R(x,y)}{R_{Rt}(x,y)}$$
$$= \left[\frac{R_N(x,y)}{R_{Rt}(x,y)}\right]^{\frac{3}{4}} \cdot \left[\frac{R_{Lt}(x,y) + R_{Rt}(x,y)}{2R_{Rt}(x,y)}\right]^{\frac{1}{4}}$$

$$g_{G_{Rt}}(x,y) = \frac{m_R(x,y)}{G_{Rt}(x,y)}$$
$$= \left[\frac{G_N(x,y)}{G_{Rt}(x,y)}\right]^{\frac{3}{4}} \cdot \left[\frac{G_{Lt}(x,y) + G_{Rt}(x,y)}{2G_{Rt}(x,y)}\right]^{\frac{1}{4}}$$

$$g_{B_{Rt}}(x,y) = \frac{m_R(x,y)}{B_{Rt}(x,y)}$$
$$= \left[\frac{B_N(x,y)}{B_{Rt}(x,y)}\right]^{\frac{3}{4}} \cdot \left[\frac{B_{Lt}(x,y) + B_{Rt}(x,y)}{2B_{Rt}(x,y)}\right]^{\frac{1}{4}}$$

b) When Using the Geometric Mean of the Left and Right Average values for each pixel $$m_R(x,y) = [R_N(x,y)]^{3/4} \cdot [R_{Lt}(x,y) \cdot R_{Rt}(x,y)]^{1/4}$$

$$m_G(x,y) = [G_N(x,y)]^{3/4} \cdot [G_{Lt}(x,y) \cdot G_{Rt}(x,y)]^{1/4}$$

$$m_B(x,y) = [B_N(x,y)]^{3/4} \cdot [B_{Lt}(x,y) \cdot B_{Rt}(x,y)]^{1/4}$$

Gain values for each non-parallax pixel $$g_{R_N}(x, y) = \frac{m_R(x, y)}{R_N(x, y)} = \sqrt[4]{\frac{\sqrt{R_{Lt}(x, y) \cdot R_{Rt}(x, y)}}{R_N(x, y)}}$$

$$g_{G_N}(x, y) = \frac{m_R(x, y)}{G_N(x, y)} = \sqrt[4]{\frac{\sqrt{G_{Lt}(x, y) \cdot G_{Rt}(x, y)}}{G_N(x, y)}}$$

$$g_{B_N}(x, y) = \frac{m_R(x, y)}{B_N(x, y)} = \sqrt[4]{\frac{\sqrt{B_{Lt}(x, y) \cdot B_{Rt}(x, y)}}{B_N(x, y)}}$$

Gain values for each left parallax pixel $$g_{R_{Lt}}(x, y) = \frac{m_R(x, y)}{R_{Lt}(x, y)} = \left[\frac{R_N(x, y)}{R_{Lt}(x, y)}\right]^{\frac{3}{4}} \cdot \left[\frac{R_{Rt}(x, y)}{R_{Lt}(x, y)}\right]^{\frac{1}{4}}$$

$$g_{G_{Lt}}(x, y) = \frac{m_R(x, y)}{G_{Lt}(x, y)} = \left[\frac{G_N(x, y)}{G_{Lt}(x, y)}\right]^{\frac{3}{4}} \cdot \left[\frac{G_{Rt}(x, y)}{G_{Lt}(x, y)}\right]^{\frac{1}{4}}$$

$$g_{B_{Lt}}(x, y) = \frac{m_R(x, y)}{B_{Lt}(x, y)} = \left[\frac{B_N(x, y)}{B_{Lt}(x, y)}\right]^{\frac{3}{4}} \cdot \left[\frac{B_{Rt}(x, y)}{B_{Lt}(x, y)}\right]^{\frac{1}{4}}$$

Gain values for each right parallax pixel $$g_{R_{Rt}}(x, y) = \frac{m_R(x, y)}{R_{Rt}(x, y)} = \left[\frac{R_N(x, y)}{R_{Rt}(x, y)}\right]^{\frac{3}{4}} \cdot \left[\frac{R_{Lt}(x, y)}{R_{Rt}(x, y)}\right]^{\frac{1}{4}}$$

$$g_{G_{Rt}}(x, y) = \frac{m_R(x, y)}{G_{Rt}(x, y)} = \left[\frac{G_N(x, y)}{G_{Rt}(x, y)}\right]^{\frac{3}{4}} \cdot \left[\frac{G_{Lt}(x, y)}{G_{Rt}(x, y)}\right]^{\frac{1}{4}}$$

$$g_{B_{Rt}}(x, y) = \frac{m_R(x, y)}{B_{Rt}(x, y)} = \left[\frac{B_N(x, y)}{B_{Rt}(x, y)}\right]^{\frac{3}{4}} \cdot \left[\frac{B_{Lt}(x, y)}{B_{Rt}(x, y)}\right]^{\frac{1}{4}}$$

6) Generation of Actual Parallax Image a) Parallax Modulation with the Arithmetic Mean as the Reference Point Left parallax modulation $$R'_{Lt}(x, y) = R_N(x, y) \left( \sqrt[4]{\frac{2R_{Lt}(x, y)}{R_{Lt}(x, y) + R_{Rt}(x, y)}} \sqrt[4]{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}} \right)^K$$

$$G'_{Lt}(x, y) = G_N(x, y) \left( \sqrt[4]{\frac{2R_{Lt}(x, y)}{R_{Lt}(x, y) + R_{Rt}(x, y)}} \sqrt[4]{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}} \right)^K$$

$$B'_{Lt}(x, y) = B_N(x, y) \left( \sqrt[4]{\frac{2R_{Lt}(x, y)}{R_{Lt}(x, y) + R_{Rt}(x, y)}} \sqrt[4]{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}} \right)^K$$

Right parallax modulation $$R'_{Rt}(x, y) = R_N(x, y) \left( \sqrt[4]{\frac{2R_{Rt}(x, y)}{R_{Lt}(x, y) + R_{Rt}(x, y)}} \sqrt[4]{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}} \right)^K$$

$$G'_{Rt}(x, y) = G_N(x, y) \left( \sqrt[4]{\frac{2R_{Rt}(x, y)}{R_{Lt}(x, y) + R_{Rt}(x, y)}} \sqrt[4]{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}} \right)^K$$

$$B'_{Rt}(x, y) = B_N(x, y) \left( \sqrt[4]{\frac{2R_{Rt}(x, y)}{R_{Lt}(x, y) + R_{Rt}(x, y)}} \sqrt[4]{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}} \right)^K$$

b) Parallax Modulation with the Geometric Mean as the Reference Point

Left parallax modulation $$R'_{Lt}(x,y) = R_N(x,y) \left( \sqrt[4]{\frac{R_{Lt}(x,y)}{R_{Lt}(x,y)+R_{Rt}(x,y)}} \sqrt{\frac{G_{Lt}(x,y)}{G_{Lt}(x,y)+G_{Rt}(x,y)}} \sqrt[4]{\frac{B_{Lt}(x,y)}{B_{Lt}(x,y)+B_{Rt}(x,y)}} \right)^K$$

$$G'_{Lt}(x,y) = G_N(x,y) \left( \sqrt[4]{\frac{R_{Lt}(x,y)}{R_{Lt}(x,y)+R_{Rt}(x,y)}} \sqrt{\frac{G_{Lt}(x,y)}{G_{Lt}(x,y)+G_{Rt}(x,y)}} \sqrt[4]{\frac{B_{Lt}(x,y)}{B_{Lt}(x,y)+B_{Rt}(x,y)}} \right)^K$$

$$B'_{Lt}(x,y) = B_N(x,y) \left( \sqrt[4]{\frac{R_{Lt}(x,y)}{R_{Lt}(x,y)+R_{Rt}(x,y)}} \sqrt{\frac{G_{Lt}(x,y)}{G_{Lt}(x,y)+G_{Rt}(x,y)}} \sqrt[4]{\frac{B_{Lt}(x,y)}{B_{Lt}(x,y)+B_{Rt}(x,y)}} \right)^K$$

Right parallax modulation $$R'_{Rt}(x,y) = R_N(x,y) \left( \sqrt[4]{\frac{R_{Rt}(x,y)}{R_{Lt}(x,y)+R_{Rt}(x,y)}} \sqrt{\frac{G_{Rt}(x,y)}{G_{Lt}(x,y)+G_{Rt}(x,y)}} \sqrt[4]{\frac{B_{Rt}(x,y)}{B_{Lt}(x,y)+B_{Rt}(x,y)}} \right)^K$$

$$G'_{Rt}(x,y) = G_N(x,y) \left( \sqrt[4]{\frac{R_{Rt}(x,y)}{R_{Lt}(x,y)+R_{Rt}(x,y)}} \sqrt{\frac{G_{Rt}(x,y)}{G_{Lt}(x,y)+G_{Rt}(x,y)}} \sqrt[4]{\frac{B_{Rt}(x,y)}{B_{Lt}(x,y)+B_{Rt}(x,y)}} \right)^K$$

$$B'_{Rt}(x,y) = B_N(x,y) \left( \sqrt[4]{\frac{R_{Rt}(x,y)}{R_{Lt}(x,y)+R_{Rt}(x,y)}} \sqrt{\frac{G_{Rt}(x,y)}{G_{Lt}(x,y)+G_{Rt}(x,y)}} \sqrt[4]{\frac{B_{Rt}(x,y)}{B_{Lt}(x,y)+B_{Rt}(x,y)}} \right)^K$$

When overwriting the above expressions

Left parallax modulation $$R'_{Lt}(x,y) = R_N(x,y) \left( \sqrt[4]{\frac{R_{Lt}(x,y)}{R_{Rt}(x,y)}} \sqrt{\frac{G_{Lt}(x,y)}{G_{Rt}(x,y)}} \sqrt[4]{\frac{B_{Lt}(x,y)}{B_{Rt}(x,y)}} \right)^K$$

$$G'_{Lt}(x,y) = G_N(x,y) \left( \sqrt[4]{\frac{R_{Lt}(x,y)}{R_{Rt}(x,y)}} \sqrt{\frac{G_{Lt}(x,y)}{G_{Rt}(x,y)}} \sqrt[4]{\frac{B_{Lt}(x,y)}{B_{Rt}(x,y)}} \right)^K$$

$$B'_{Lt}(x,y) = B_N(x,y) \left( \sqrt[4]{\frac{R_{Lt}(x,y)}{R_{Rt}(x,y)}} \sqrt{\frac{G_{Lt}(x,y)}{G_{Rt}(x,y)}} \sqrt[4]{\frac{B_{Lt}(x,y)}{B_{Rt}(x,y)}} \right)^K$$

Right parallax modulation $$R'_{Rt}(x,y) = R_N(x,y) \left( \sqrt[4]{\frac{R_{Rt}(x,y)}{R_{Lt}(x,y)}} \sqrt{\frac{G_{Rt}(x,y)}{G_{Lt}(x,y)}} \sqrt[4]{\frac{B_{Rt}(x,y)}{B_{Lt}(x,y)}} \right)^K$$

$$G'_{Rt}(x,y) = G_N(x,y) \left( \sqrt[4]{\frac{R_{Rt}(x,y)}{R_{Lt}(x,y)}} \sqrt{\frac{G_{Rt}(x,y)}{G_{Lt}(x,y)}} \sqrt[4]{\frac{B_{Rt}(x,y)}{B_{Lt}(x,y)}} \right)^K$$

$$B'_{Rt}(x,y) = B_N(x,y) \left( \sqrt[4]{\frac{R_{Rt}(x,y)}{R_{Lt}(x,y)}} \sqrt{\frac{G_{Rt}(x,y)}{G_{Lt}(x,y)}} \sqrt[4]{\frac{B_{Rt}(x,y)}{B_{Lt}(x,y)}} \right)^K$$

Further, the expressions below may be used as the parallax modulation

Left parallax modulation $$R'_{Lt}(x,y) = R_N(x,y) + k \left( \frac{1}{4} \cdot \frac{R_{Lt}(x,y)-R_{Rt}(x,y)}{2} + \frac{1}{2} \cdot \frac{G_{Lt}(x,y)-G_{Rt}(x,y)}{2} + \frac{1}{4} \cdot \frac{B_{Lt}(x,y)-B_{Rt}(x,y)}{2} \right)$$

$$G'_{Lt}(x,y) = G_N(x,y) + k \left( \frac{1}{4} \cdot \frac{R_{Lt}(x,y)-R_{Rt}(x,y)}{2} + \frac{1}{2} \cdot \frac{G_{Lt}(x,y)-G_{Rt}(x,y)}{2} + \frac{1}{4} \cdot \frac{B_{Lt}(x,y)-B_{Rt}(x,y)}{2} \right)$$

$$B'_{Lt}(x,y) = B_N(x,y) + k \left( \frac{1}{4} \cdot \frac{R_{Lt}(x,y)-R_{Rt}(x,y)}{2} + \frac{1}{2} \cdot \frac{G_{Lt}(x,y)-G_{Rt}(x,y)}{2} + \frac{1}{4} \cdot \frac{B_{Lt}(x,y)-B_{Rt}(x,y)}{2} \right)$$

Right parallax modulation $$R'_{Rt}(x,y) = R_N(x,y) + k \left( \frac{1}{4} \cdot \frac{R_{Rt}(x,y)-R_{Lt}(x,y)}{2} + \frac{1}{2} \cdot \frac{G_{Rt}(x,y)-G_{Lt}(x,y)}{2} + \frac{1}{4} \cdot \frac{B_{Rt}(x,y)-B_{Lt}(x,y)}{2} \right)$$

$$G'_{Rt}(x,y) = G_N(x,y) + k \begin{pmatrix} \frac{1}{4} \cdot \frac{R_{Rt}(x,y) - R_{Lt}(x,y)}{2} + \\ \frac{1}{2} \cdot \frac{G_{Rt}(x,y) - G_{Lt}(x,y)}{2} + \\ \frac{1}{4} \cdot \frac{B_{Rt}(x,y) - B_{Lt}(x,y)}{2} \end{pmatrix}$$

$$B'_{Rt}(x,y) = B_N(x,y) + k \begin{pmatrix} \frac{1}{4} \cdot \frac{R_{Rt}(x,y) - R_{Lt}(x,y)}{2} + \\ \frac{1}{2} \cdot \frac{G_{Rt}(x,y) - G_{Lt}(x,y)}{2} + \\ \frac{1}{4} \cdot \frac{B_{Rt}(x,y) - B_{Lt}(x,y)}{2} \end{pmatrix}$$

Further, a combination and the like is also considered, such as that half of the parallax pixels raised in the embodiment 2 are ⅔-aperture and the rest of the parallax pixels are ¾-aperture. When this kind of combination is performed, the smallest unit of an equivalent aperture according to the calculations of shading aperture performed in the descriptions of FIG. 10A to FIG. 10F becomes 1/12-aperture, and information amount relating viewpoints and blur widths and degree of freedom are increased.

Also, the parallax pixel with large aperture described above is considered suitable for usage of a magnifying optical system such as a microscope as well. The reason is that the magnifying optical system is equivalent to an optical system with an extremely large diaphragm value, and when the parallax pixel is half-aperture, a significant shading problem that the imaging signal cannot be obtained occurs. On the other hand, it is possible to at least keep an imaging sensitivity and it is possible to extract the parallax information from information being able to pick up.

Furthermore, a device, such as a personal computer, can be also made to function as the image processing device that fulfills the functions of the image processing section 205. In this case, the image processing device may acquire an output of the image sensor from another apparatus, such as a camera and the like. The image processing device is not limited to a personal computer, and can be realized in various forms. For example, a TV, mobile telephone, a game device and the like can be the image processing device. The images in the above description can refer to image data or to an actual subject image that is visible as a result of being expanded according to a certain format.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS

10: digital camera, 20: imaging lens, 21: optical axis, 100: image sensor, 101: microlens, 102: color filter, 103: aperture mask, 104: aperture section, 105: wiring layer, 106: wiring, 107: aperture, 108: photoelectric converting element, 109: substrate, 201: control section, 202: A/D conversion circuit, 203: memory, 204: driving section, 205: image processing section, 207: memory card IF, 208: manipulating section, 209: display section, 210: LCD drive circuit, 220: memory card, 322: center line, 1801: distribution curve, 1802: distribution curve, 1803: distribution curve, 1804: distribution curve, 1805: distribution curve, 1806: combined distribution curve, 1807: distribution curve, 1808: distribution curve, 1809: combined distribution curve

What is claimed is:

1. An image sensor comprising:
a plurality of non-parallax pixels, each of which includes a non-parallax aperture mask arranged to pass a full or partial luminous flux of a subject image through an optical system so as to produce a viewpoint in a reference direction;
a plurality of first parallax pixels, each of which includes a first aperture mask arranged to pass a partial luminous flux of the subject image through the optical system so as to produce a viewpoint in a first direction different from the reference direction, an aperture area of the first aperture mask having a greater-than-half-aperture width in the direction of change from the reference direction to the first direction; and
a plurality of second parallax pixels, each of which includes a second aperture mask arranged to pass a partial luminous flux of the subject image through the optical system so as to produce a viewpoint in a second direction different from the reference direction and different from the first direction, an aperture area of the second aperture mask having a greater-than-half-aperture width in the direction of change from the reference direction to the second direction, wherein
a ratio of pixel density between the non-parallax pixels, the first parallax pixels and the second parallax pixels is 6:1:1,
each of the non-parallax pixels includes a color filter with a ratio of R:G:B=1:2:1 among the color filters of the plurality of non-parallax pixels,
each of the first parallax pixels includes a color filter with a ratio of R:G:B=1:2:1 among the color filters of the plurality of first parallax pixels, and
each of the second parallax pixels includes a color filter with a ratio of R:G:B=1:2:1 among the color filters of the plurality of second parallax pixels.

2. The image sensor according to claim 1, wherein the non-parallax aperture mask is full-aperture or has the same aperture area as the first aperture mask and the second aperture mask.

3. The image sensor according to claim 1, wherein
the aperture area of the first aperture mask has a width greater than half-aperture and equal to or less than ⅔-aperture in the direction of change from the reference direction to the first direction, and
the aperture area of the second aperture mask has a width greater than half-aperture and equal to or less than ⅔-aperture in the direction of change from the reference direction to the second direction.

4. An image processing device that receives pixel information from an image sensor including i) a plurality of non-parallax pixels, each of which includes a non-parallax aperture mask arranged to pass a full or partial luminous flux of a subject image through an optical system so as to produce a viewpoint in a reference direction, ii) a plurality of first parallax pixels, each of which includes a first aperture mask arranged to pass a partial luminous flux of the subject image through the optical system so as to produce a viewpoint in a first direction different from the reference direction, an aperture area of the first aperture mask having a greater-than-half-aperture width in the direction of change from the reference direction to the first direction, and iii) a plurality of second parallax pixels, each of which includes a second aperture mask arranged to pass a partial luminous flux of the subject image through the optical system so as to produce a viewpoint in a second direction different from the reference direction and different from the first direction, an aperture area of the second aperture mask having a greater-than-half-aperture width in the direction of change from the reference direction to the second direction, the image processing device programmed to perform operations comprising:

generating a reference viewpoint image in each pixel based on pixel information of the non-parallax pixels;
generating a tentative first viewpoint image in each pixel based on pixel information of the first parallax pixels;
generating a tentative second viewpoint image in each pixel based on pixel information of the second parallax pixels; and,
with respect to the reference viewpoint image, changing a viewpoint position by using the tentative first viewpoint image and the tentative second viewpoint image and generating a new first viewpoint image and a new second viewpoint image.

5. The image processing device according to claim 4, programmed to perform operations further comprising:

performing amplification by multiplying a greater-than-one exponential coefficient to a ratio when changing a viewpoint position of a reference viewpoint image by using the ratio which is defined between the tentative first viewpoint image and the tentative second viewpoint image; and
performing amplification by multiplying a greater-than-one constant multiplication to a difference when changing a viewpoint position of a reference viewpoint image by using the difference between the tentative first viewpoint image and the tentative second viewpoint image.

6. An image sensor, comprising:

a shift pixel, in which a first light receiving region that receives a subject luminous flux includes a center of the whole light receiving region and is shifted relative to the center of the whole light receiving region; and
a non-shift pixel, in which a second light receiving region that receives the subject luminous flux is not shifted relative to the center of the whole light receiving region, wherein
the shift pixels include first shift pixels which cause a parallax in a first direction and second shift pixels which cause a parallax in a second direction opposite to the first direction,
a ratio between the non-shift pixels, the first shift pixels and the second shift pixels is 6:1:1,
each of the non-shift pixels includes a color filter with a ratio of R:G:B=1:2:1 among the color filters of the non-shift pixels,
each of the first shift pixels includes a color filter with a ratio of R:G:B=1:2:1 among the color filters of the first shift pixels, and
each of the second shift pixels includes a color filter with a ratio of R:G:B=1:2:1 among the color filters of the second shift pixels.

7. The image sensor according to claim 6, wherein
a width of the first light receiving region in a shift direction by which the first light receiving region is shifted is greater than half of a width of the whole light receiving region in the shift direction.

8. The image sensor according to claim 7, wherein
the width of the first light receiving region in the shift direction is equal to or less than ⅔ times the width of the whole light receiving region in the shift direction.

9. The image sensor according to claim 6, wherein
the second light receiving region and the first light receiving region have the same shape.

10. The image sensor according to claim 6, wherein
the shift pixel and the non-shift pixel have aperture masks that define the first light receiving region and the second light receiving region.

11. An imaging apparatus, comprising:
the image sensor according to claim 6;
an obtaining section which obtains an output of the image sensor; and
an image generating section which generates first parallax image data and second parallax image data from the output of the non-shift pixels based on an output of the first shift pixels and an output of the second shift pixels, wherein
the first parallax image data causes a parallax in the first direction and the second parallax image data causes a parallax in the second direction.

12. The imaging apparatus according to claim 11, wherein
the image generating section generates a reference viewpoint image from the output of the non-shift pixels, generates a tentative first viewpoint image from the output of the first shift pixels, generates a tentative second viewpoint image from the output of the second shift pixels, and changes a position of the reference viewpoint image by raising a ratio of the tentative first viewpoint image to the tentative second viewpoint image to the power of a coefficient greater than one.

13. The imaging apparatus according to claim 11, wherein
the image generating section generates a reference viewpoint image from the output of the non-shift pixels, generates a tentative first viewpoint image from the output of the first shift pixels, generates a tentative second viewpoint image from the output of the second shift pixels, and changes a position of the reference viewpoint image by multiplying a coefficient greater than one by a difference defined between the tentative first viewpoint image and the tentative second viewpoint image.

* * * * *